US012563739B2

(12) United States Patent
Wu et al.

(10) Patent No.: US 12,563,739 B2
(45) Date of Patent: Feb. 24, 2026

(54) VERTICAL FIELD EFFECT TRANSISTORS AND METHODS FOR FORMING THE SAME

(71) Applicant: Taiwan Semiconductor Manufacturing Company Limited, Hsinchu (TW)

(72) Inventors: Gao-Ming Wu, Taipei County (TW); Li-Shyue Lai, Jhube (TW); Katherine H. Chiang, New Taipei (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 806 days.

(21) Appl. No.: 17/668,804

(22) Filed: Feb. 10, 2022

(65) Prior Publication Data

US 2023/0138939 A1 May 4, 2023

Related U.S. Application Data

(60) Provisional application No. 63/272,710, filed on Oct. 28, 2021.

(51) Int. Cl.
H10B 51/40 (2023.01)
H10B 51/10 (2023.01)
(Continued)

(52) U.S. Cl.
CPC ........... H10B 51/40 (2023.02); H10D 30/031 (2025.01); H10D 64/017 (2025.01);
(Continued)

(58) Field of Classification Search
CPC ........ H10B 51/40; H10B 51/10; H10B 53/40; H01L 27/1225; H01L 29/66545;
(Continued)

(56) References Cited

U.S. PATENT DOCUMENTS

| | | | |
|---|---|---|---|
| 9,876,018 B2 * | 1/2018 | Chavan | ............... H10D 64/668 |
| 10,234,739 B2 * | 3/2019 | Jeon | ....................... G02F 1/1368 |

(Continued)

FOREIGN PATENT DOCUMENTS

| | | |
|---|---|---|
| JP | 2017017208 A | 1/2017 |
| JP | 2017168761 A | 9/2017 |

(Continued)

OTHER PUBLICATIONS

Taiwan Patent and Trademark Office; Jianq Chyun Intellectual Property Office; TW Application No. 111115405, Office Action dated Nov. 29, 2023; 8 pages.

(Continued)

*Primary Examiner* — Jeff W Natalini
*Assistant Examiner* — Andrew John Zabel
(74) *Attorney, Agent, or Firm* — The Marbury Law Group, PLLC

(57) ABSTRACT

A plurality of vertical stacks may be formed over a substrate. Each of the vertical stacks includes, from bottom to top, a bottom electrode, a dielectric pillar, and a top electrode. A continuous active layer and a gate dielectric layer may be formed over the plurality of vertical stacks. Sacrificial spacers are formed around the plurality of vertical stacks. At least one dielectric wall structure may be formed around the sacrificial spacers by filling gaps between neighboring pairs of the sacrificial spacers with a dielectric fill material. The sacrificial spacers are replaced with gate electrodes. Each of the gate electrodes may laterally surround a respective row of vertical stacks that are arranged along a first horizontal direction.

20 Claims, 46 Drawing Sheets

(51) Int. Cl.

| | |
|---|---|
| *H10D 30/01* | (2025.01) |
| *H10D 64/01* | (2025.01) |
| *H10D 86/40* | (2025.01) |
| *H10D 86/60* | (2025.01) |

(52) U.S. Cl.
CPC ........... *H10D 86/423* (2025.01); *H10D 86/60* (2025.01); *H10B 51/10* (2023.02)

(58) Field of Classification Search
CPC ......... H01L 29/66742; H01L 29/78642; H01L 21/823481; H01L 21/823487; H01L 27/088; H01L 2021/775; H01L 27/1214; H01L 27/1229; H01L 27/1233; H01L 27/1237; H01L 27/1251; H01L 29/4908; H01L 29/786–78696; H01L 29/04–045; H01L 29/16–1608; H01L 29/18–185; H01L 29/22–2206; H01L 29/36–365; H01L 29/7869–78693; H01L 29/42384–42392; H01L 29/78645–78648; H01L 29/8126; H01L 29/78666; H01L 29/78675; H01L 29/66757; H01L 29/78669; H01L 29/78678; H01L 29/66765; H01L 29/78648

See application file for complete search history.

(56) References Cited

U.S. PATENT DOCUMENTS

| | | | | |
|---|---|---|---|---|
| 10,354,859 | B1 * | 7/2019 | Kamiya | ............... H10B 63/845 |
| 11,121,139 | B2 * | 9/2021 | Frank | ................ H01L 21/02282 |
| 11,804,532 | B2 * | 10/2023 | Liu | ................... H01L 29/66545 |
| 2015/0249112 | A1 * | 9/2015 | Takeguchi | ......... H10N 70/8845 |
| | | | | 257/314 |
| 2020/0111920 | A1 * | 4/2020 | Sills | ................. H01L 29/78642 |
| 2020/0388711 | A1 * | 12/2020 | Doyle | ................. H10D 30/701 |
| 2021/0408291 | A1 * | 12/2021 | Sharma | ................. H10B 61/22 |
| 2023/0111724 | A1 * | 4/2023 | Fujita | ................... H01L 27/088 |
| | | | | 257/369 |

FOREIGN PATENT DOCUMENTS

| | | |
|---|---|---|
| TW | 201933545 A | 8/2019 |
| TW | 202038383 A | 10/2020 |
| WO | 2018203181 A1 | 11/2018 |

OTHER PUBLICATIONS

Japanese Patent and Trademark Office; Jianq Chyun Intellectual Property Office; JP Application No. 2022-130833, Notice dated Oct. 31, 2023; 2 pages.

* cited by examiner

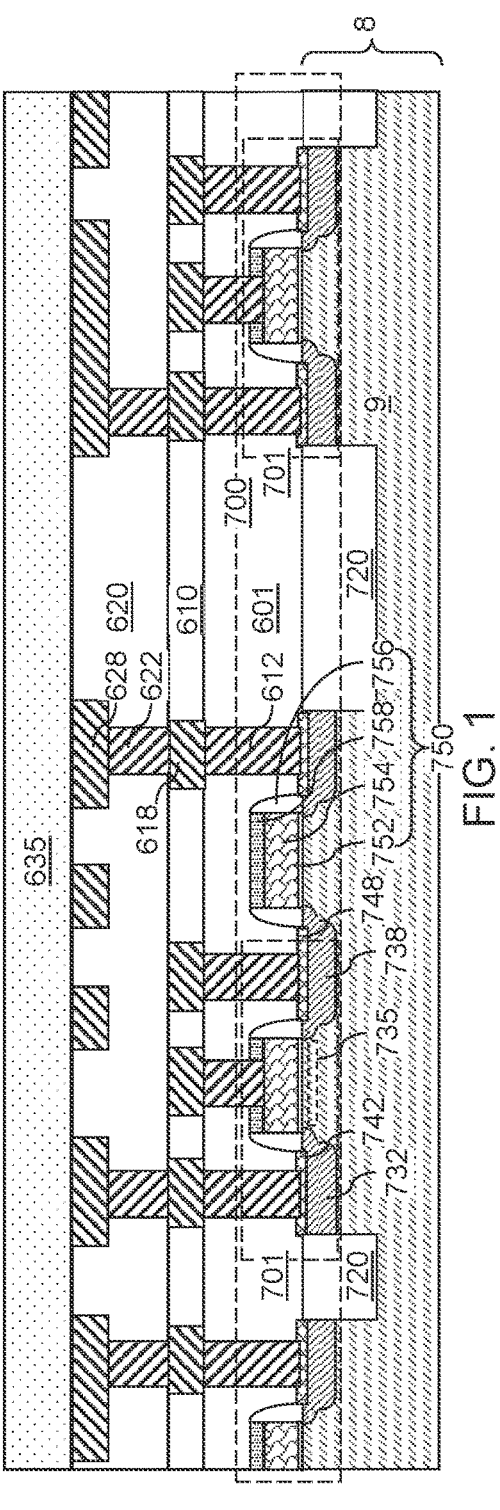
FIG. 1

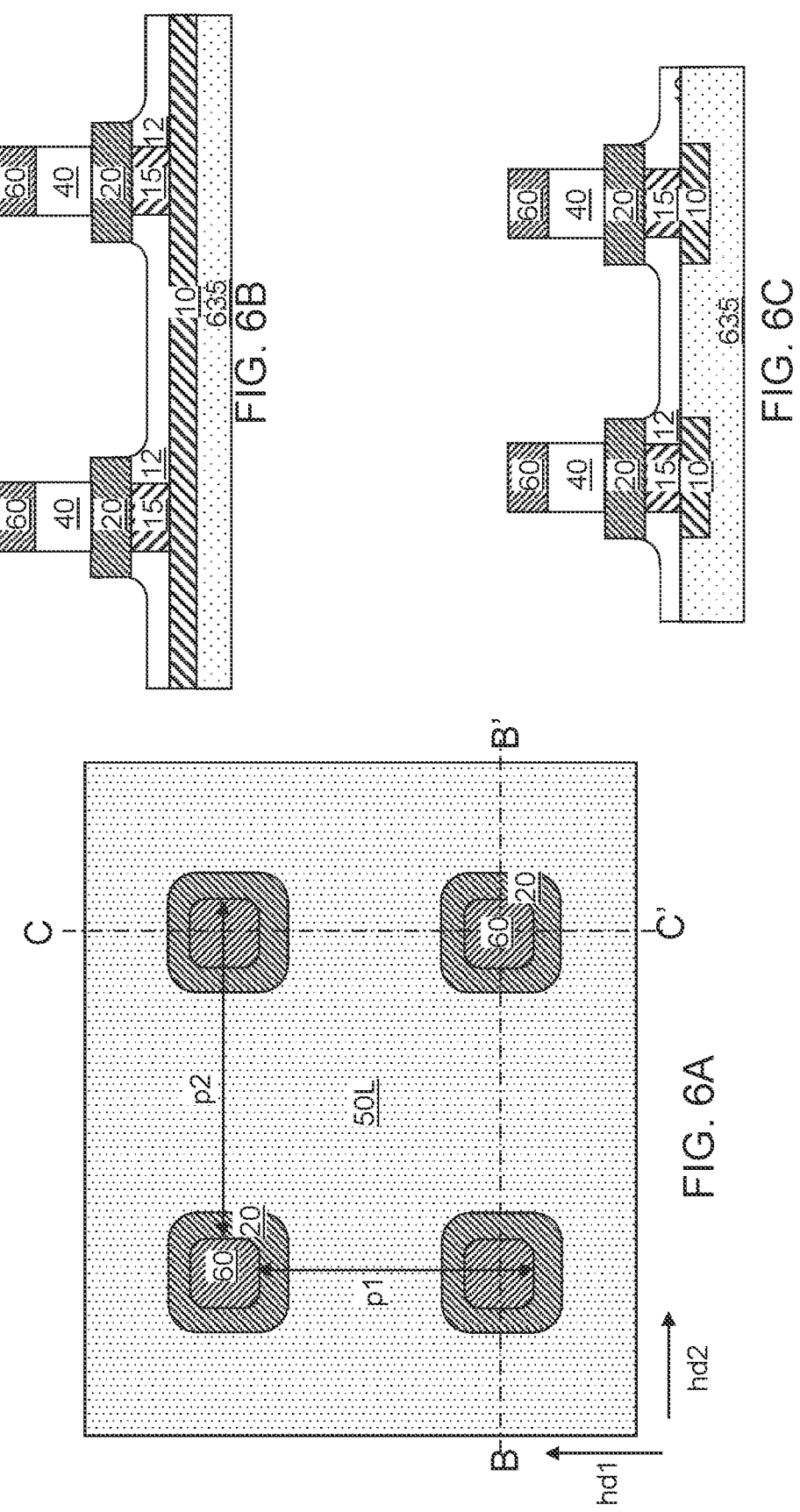

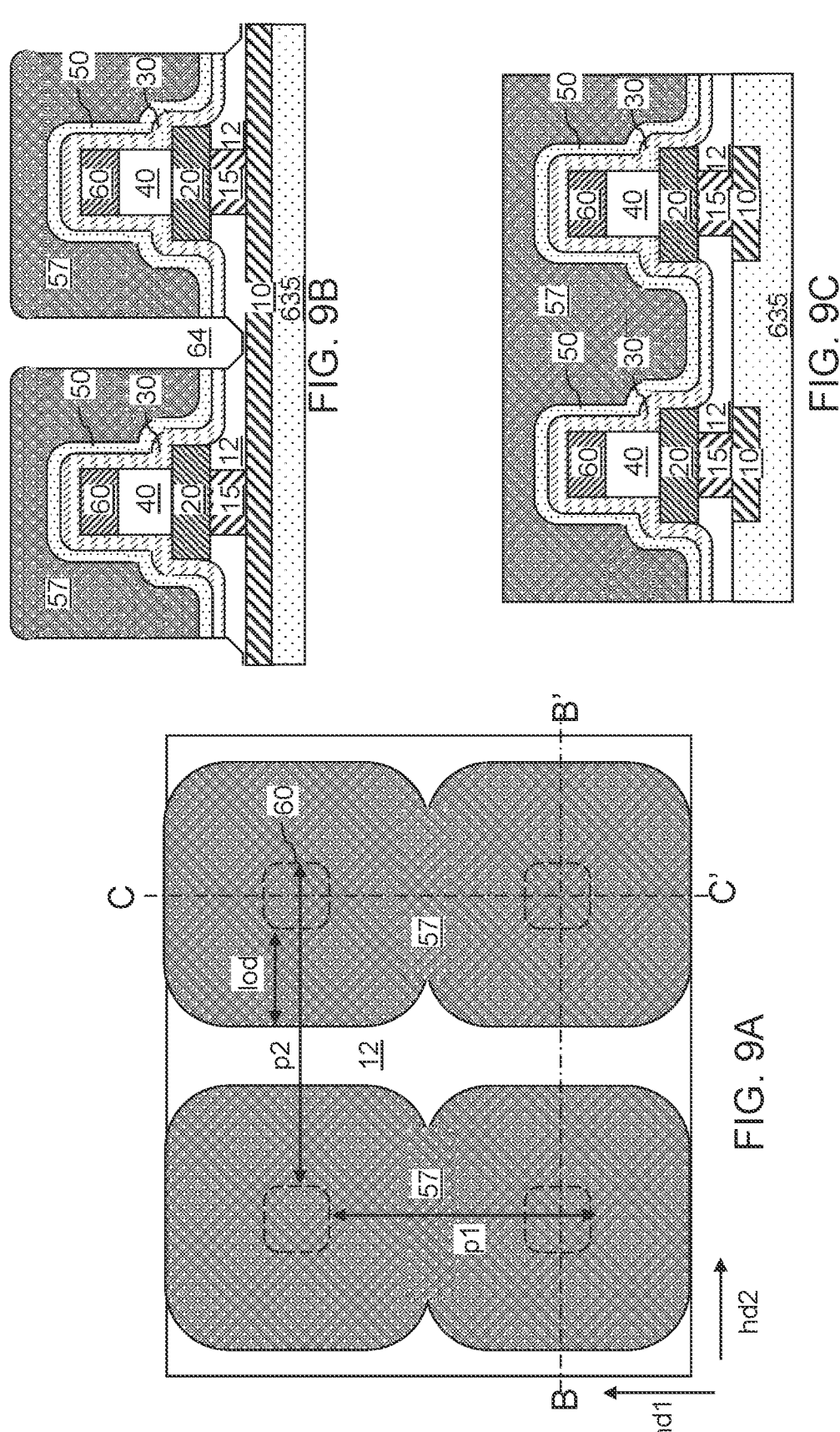

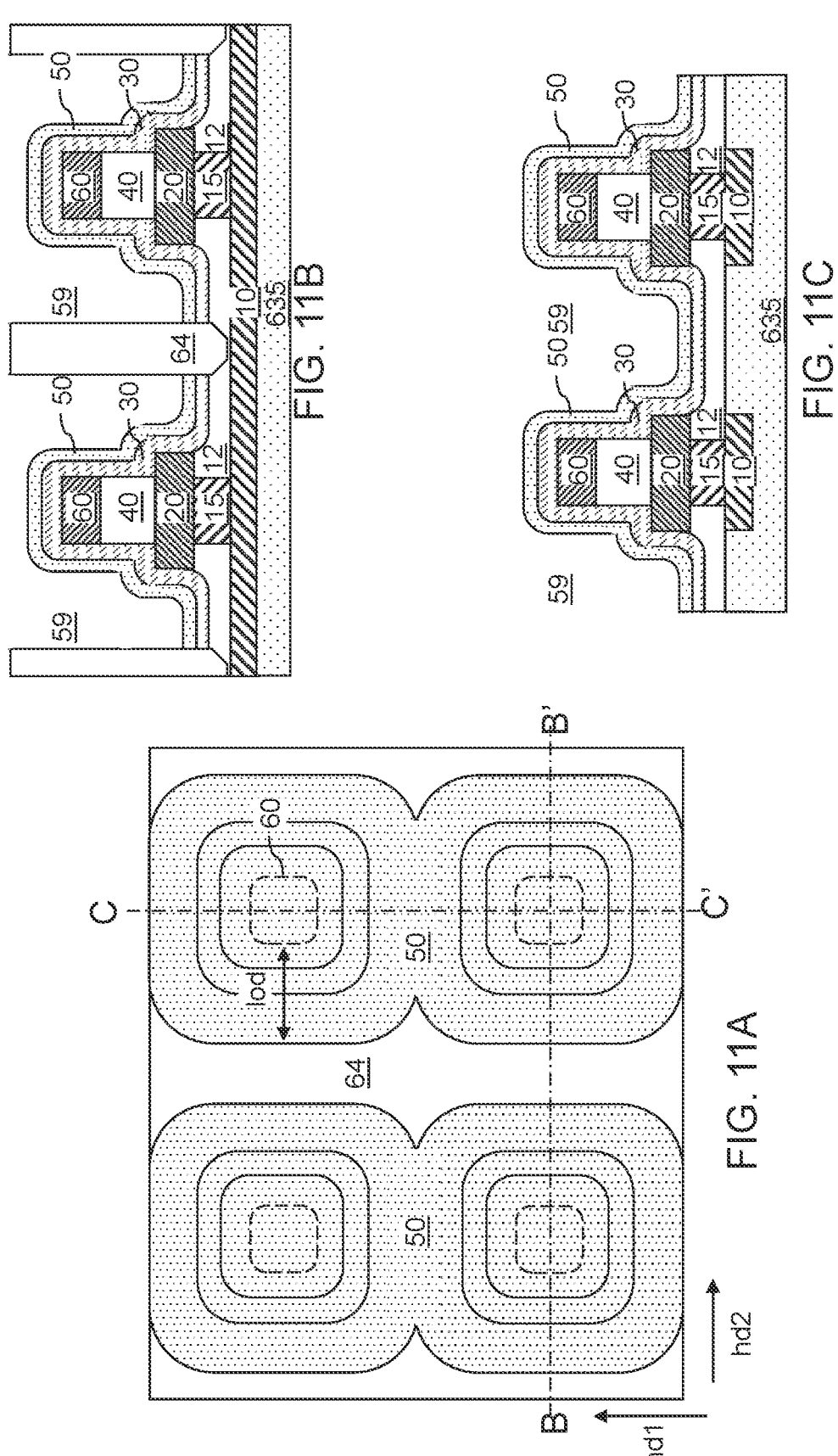

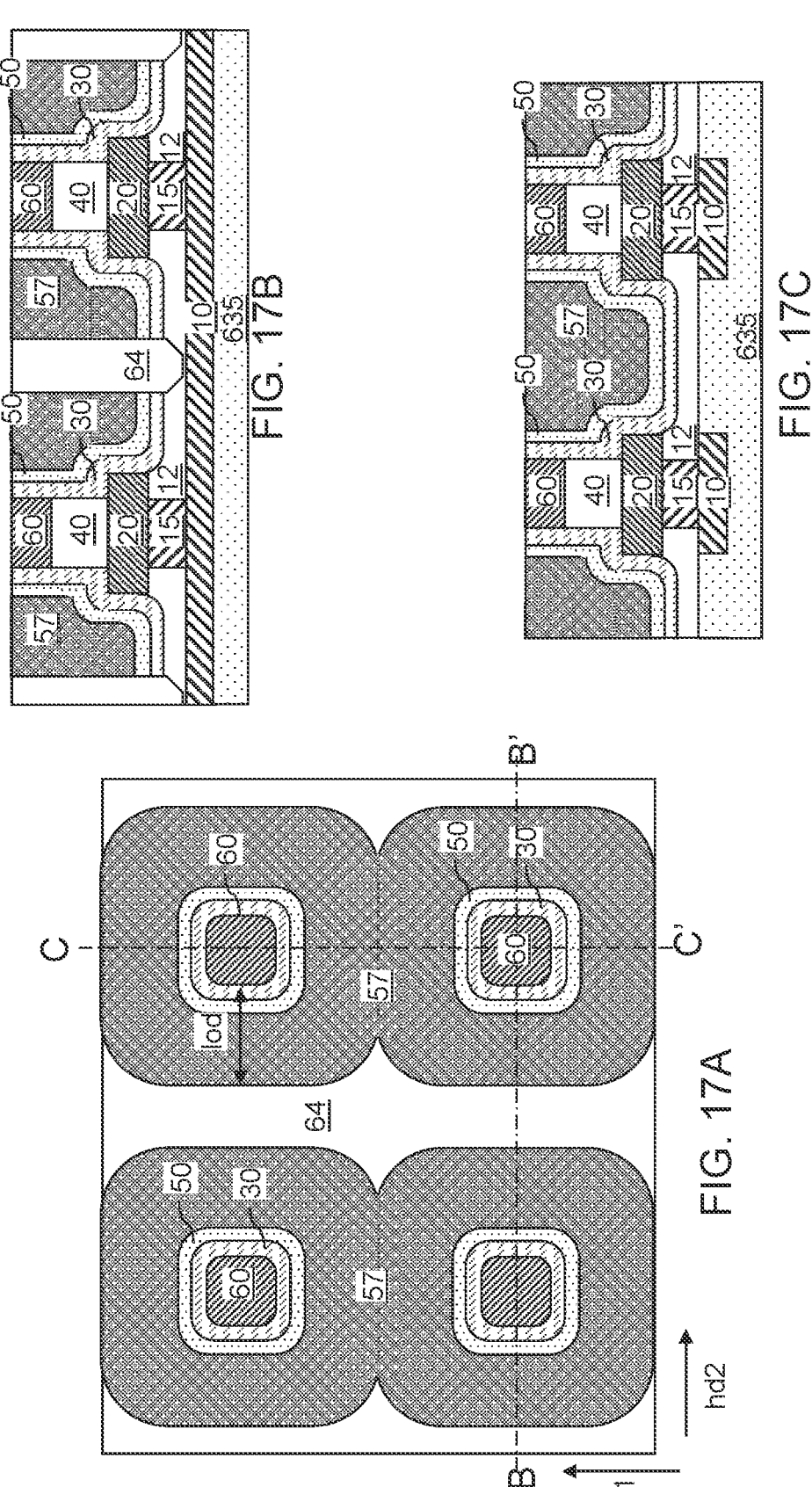

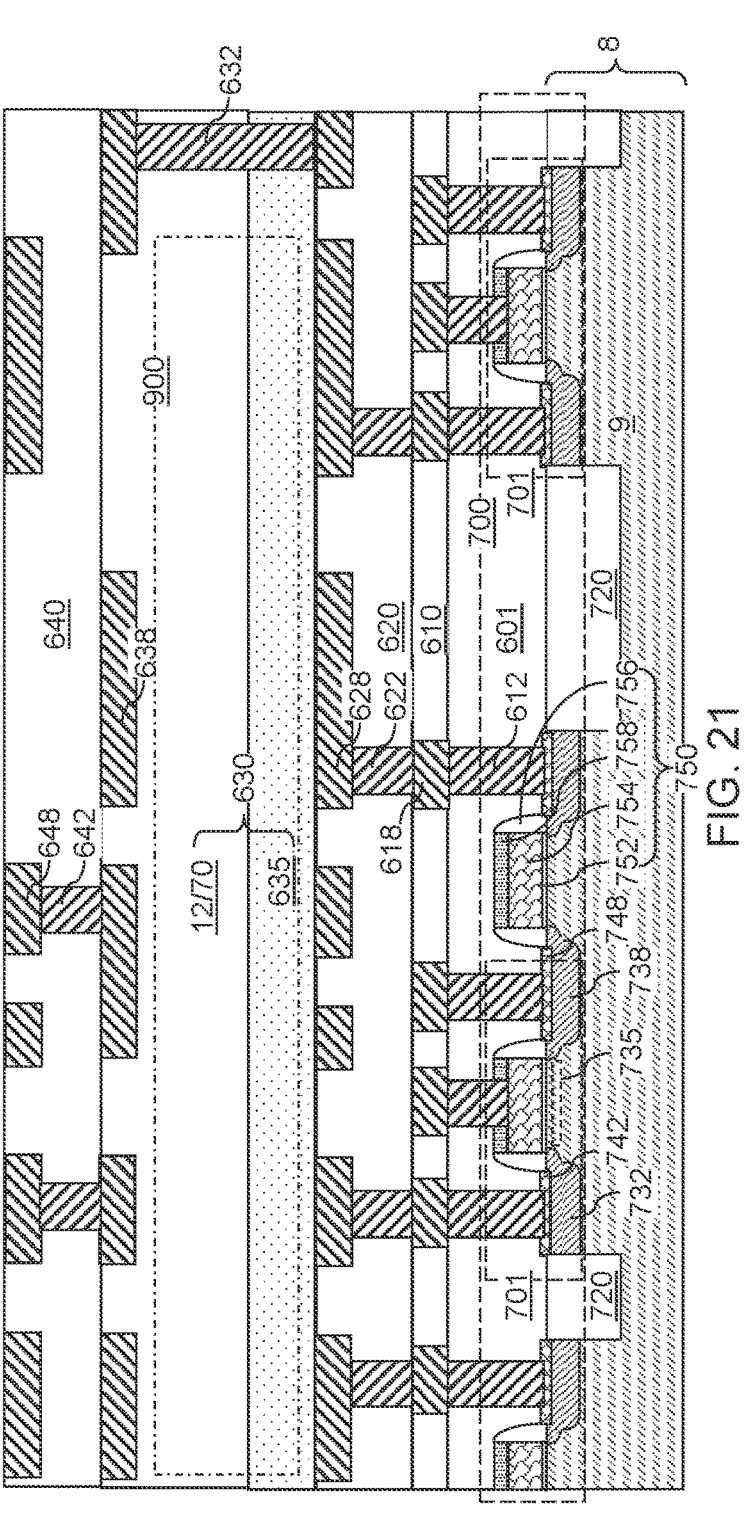
FIG. 21

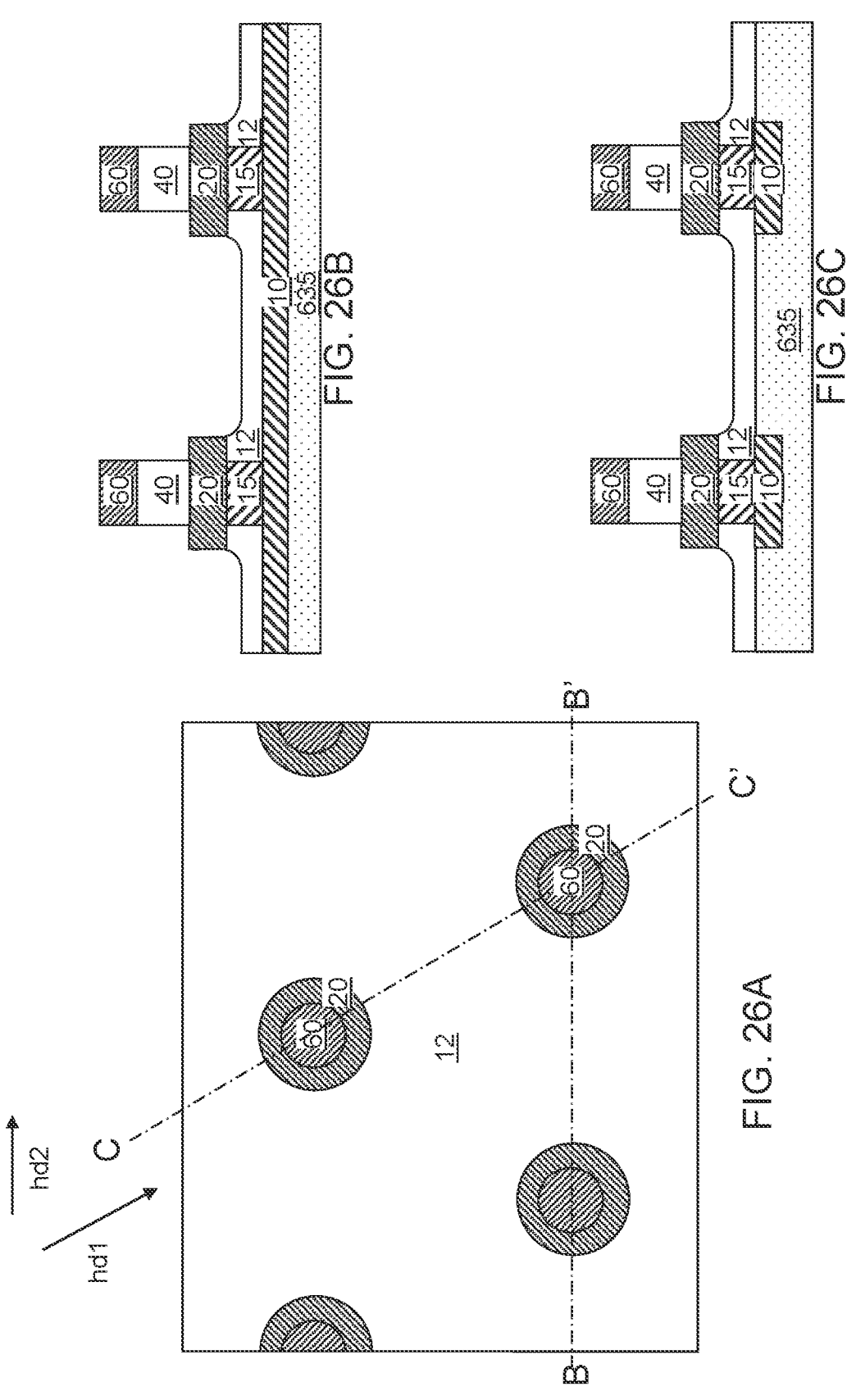

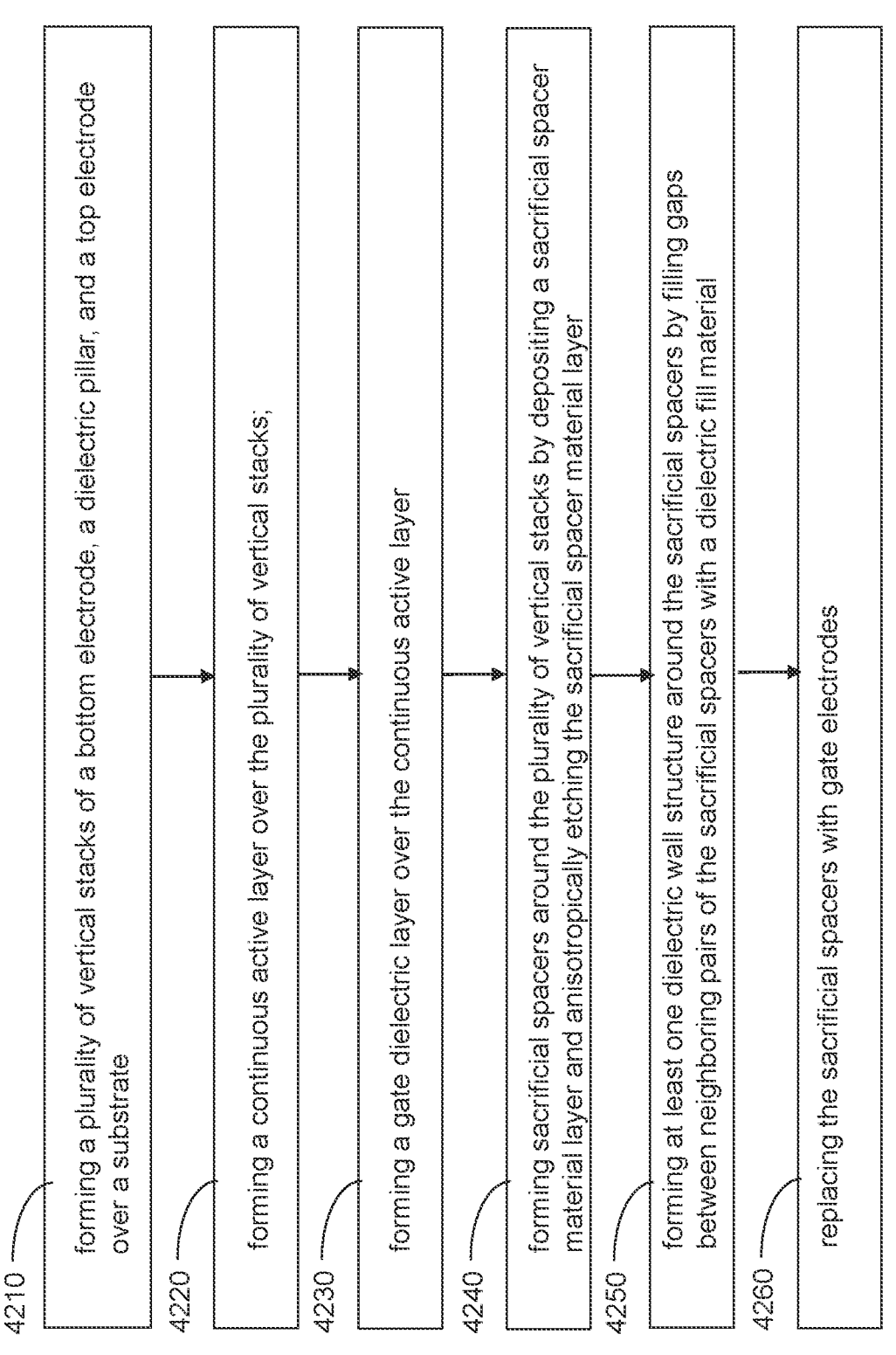

4210   forming a plurality of vertical stacks of a bottom electrode, a dielectric pillar, and a top electrode over a substrate 4220   forming a continuous active layer over the plurality of vertical stacks;

4230   forming a gate dielectric layer over the continuous active layer 4240   forming sacrificial spacers around the plurality of vertical stacks by depositing a sacrificial spacer material layer and anisotropically etching the sacrificial spacer material layer 4250   forming at least one dielectric wall structure around the sacrificial spacers by filling gaps between neighboring pairs of the sacrificial spacers with a dielectric fill material 4260   replacing the sacrificial spacers with gate electrodes

FIG. 42

VERTICAL FIELD EFFECT TRANSISTORS AND METHODS FOR FORMING THE SAME

RELATED APPLICATIONS

This application claims the benefit of priority from U.S. Provisional Application No. 63/272,710 titled "Semiconductor Structure and method for manufacturing the same" and filed on Oct. 28, 2021, the entire contents of which are incorporated herein by reference.

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Among figures labeled with a figure numeral and an alphabetical suffix, figures with the alphabetical suffix "A" are a top-down view; figures with the alphabetical suffix "B" are a vertical cross-sectional view along the vertical plane B-B' within the figure with the same figure numeral and the alphabetical suffix "A," figures with the alphabetical suffix "C" are a vertical cross-sectional view along the vertical plane C-C' within the figure with the same figure numeral and the alphabetical suffix "A," and figures with the alphabetical suffix "D," if present, are a horizontal cross-sectional view along the horizontal plane D-D' within the figures with the same figure numeral and the alphabetical suffix of "B" or "C." Figures with the same figure numeral and different alphabetical suffices correspond to a same processing step.

FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer according to an embodiment of the present disclosure.

FIGS. 6A-6C are various views of a portion of a memory array region of the first exemplary structure after formation of vertical stacks of a bottom electrode, a dielectric pillar, and a top electrode according to the first embodiment of the present disclosure.

FIGS. 9A-9C are various views of a portion of a memory array region of the first exemplary structure after formation of sacrificial spacers according to the first embodiment of the present disclosure.

FIGS. 11A-11C are various views of a portion of a memory array region of the first exemplary structure after removal of sacrificial spacers according to the first embodiment of the present disclosure.

FIGS. 17A-17C are various views of a portion of a memory array region of a second alternative configuration of the first exemplary structure after formation of dielectric wall structures according to the first embodiment of the present disclosure.

FIG. 21 is a vertical cross-sectional view of an exemplary structure after formation of upper dielectric material layers and upper metal interconnect structures.

FIGS. 26A-26C are various views of a portion of a memory array region of the second exemplary structure after formation of vertical stacks of a bottom electrode, a dielectric pillar, and a top electrode according to the second embodiment of the present disclosure.

FIG. 42 is a flowchart that illustrates the general processing steps for manufacturing the semiconductor device of the present disclosure.

DETAILED DESCRIPTION

Figures 2A, 2B, 2C:
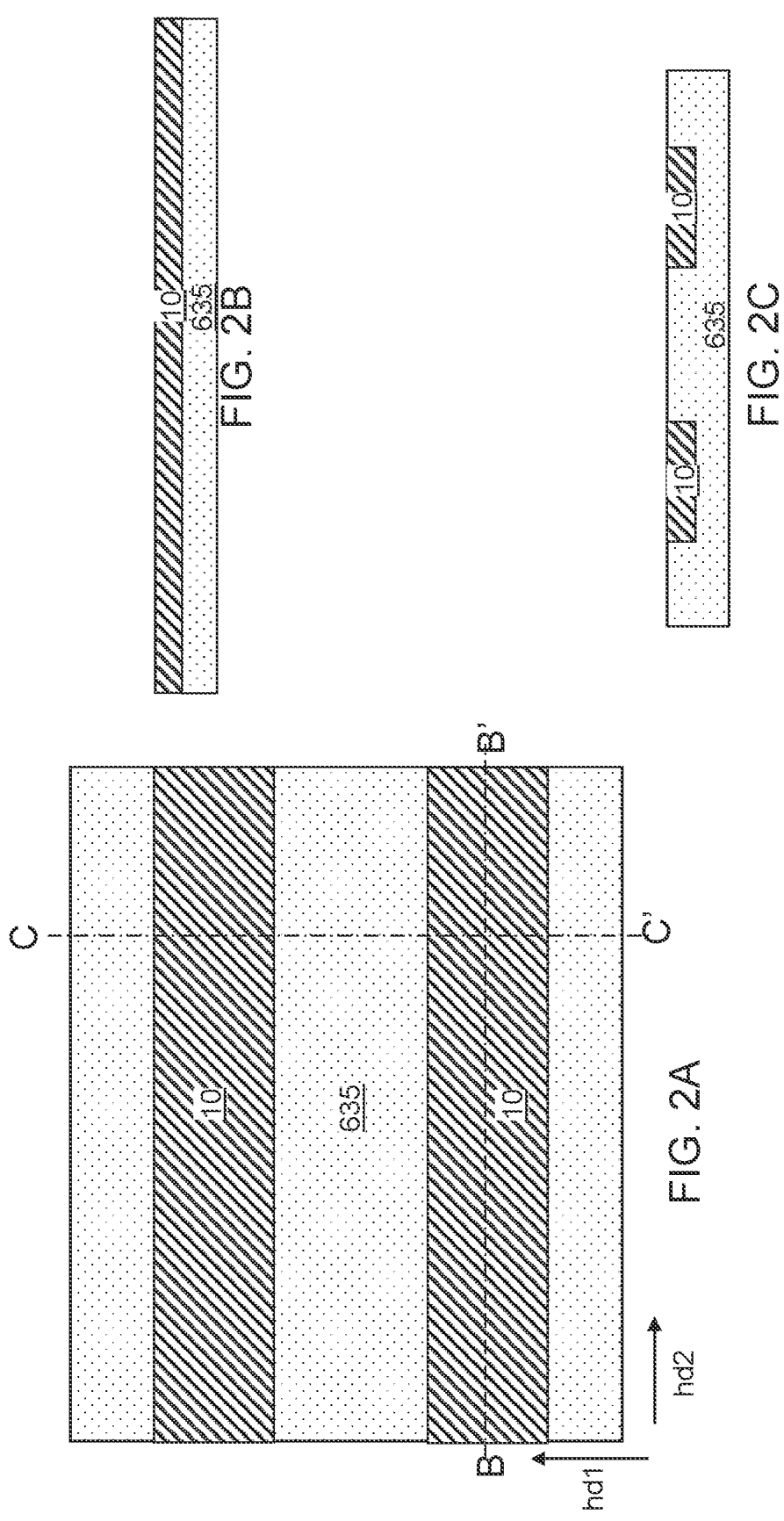
FIGS. 2A-2C are various views of a portion of a memory array region of a first exemplary structure after formation of bit lines in an insulating matrix layer according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including vertical field effect transistors, which may include a two-dimensional array of vertical transistors (e.g., vertical thin film transistors). The vertical transistors may include a respective cylindrical semiconducting metal oxide channel and a gate electrode that may be shared among a row of vertical filed effect transistors. A source electrode and a drain electrode of each vertical field effect transistor may be vertically spaced by a dielectric pillar. An active layer and a gate dielectric may be subsequently formed over each vertical stack of a bottom electrode, a dielectric pillar, and a top electrode. The vertical transistor of the present disclosure includes a self-aligned cylindrical vertical channel that laterally surrounds a stack of a bottom electrode, a dielectric pillar, and a top electrode. The gate electrode may be formed in a gate-all-around configuration to provide enhanced channel control.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of ferroelectric memory cells may be subsequently formed. The first exemplary structure may further include a peripheral region 200 in which metal wiring for the array of ferroelectric memory devices is provided. Generally, the field effect transistors 701 in the CMOS circuitry 700 may be electrically connected to an electrode of a respective ferroelectric memory cell by a respective set of metal interconnect structures.

Devices (such as field effect transistors 701) in the peripheral region 200 may provide functions that operate the array of ferroelectric memory cells to be subsequently formed.

Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

According to an aspect of the present disclosure, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second line-and-via-level dielectric material layer 620, embodiments are expressly contemplated herein in which the array of memory cells may be formed at a different metal interconnect level.

An array of thin film transistors and an array of ferroelectric memory cells may be subsequently deposited over the dielectric material layers (601, 610, 620) that have formed therein the metal interconnect structures (612, 618, 622, 628). The set of all dielectric material layer that are formed prior to formation of an array of thin film transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an insulating matrix layer 635. The insulating matrix layer 635 includes a dielectric material such as undoped silicate glass, a doped silicate glass, organosilicate glass, or a porous dielectric material, and may be deposited by chemical vapor deposition. The thickness of the insulating matrix layer 635 may be in a range from 20 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The insulating matrix layer 635 may be formed over the interconnect-level dielectric layers.

Referring to FIGS. 2A-2C, a portion of a memory array region 100 of the first exemplary structure is illustrated after formation of bit lines 10 in the insulating matrix layer 635 according to a first embodiment of the present disclosure. The illustrated portion of the memory array region 100 corresponds to an area for forming four vertical field effect transistors. While the present disclosure is described employing illustrations of an area for forming four vertical field effect transistors, the illustrated structure may be repeated along a first horizontal direction hd1 and along a second horizontal direction hd2 that is perpendicular to the first horizontal direction hd1 to provide a two-dimensional array of vertical field effect transistors containing more than four field effect transistors, such as millions of field effect transistors.

In one embodiment, line trenches may be formed in an upper portion of the insulating matrix layer 635, and may be filled with at least one metallic material to form bit lines 10. The line trenches may be laterally spaced apart from one another along the first horizontal direction hd1, and may laterally extend along the second horizontal direction hd2 (which is herein referred as a bit line direction). In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. Other suitable metallic liner materials are within the contemplated scope of disclosure. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. Other suitable metallic fill materials are within the contemplated scope of disclosure. A planarization process, such as a chemical mechanical polishing (CMP) process, may be performed to remove portions of the metallic liner layer and the metallic fill material layer that overlie the horizontal plane including the top surface of the insulating matrix layer 635. Each remaining portion of the at least one metallic material comprises a bit line 10, which may be subsequently used to electrically bias bottom electrodes of thin film transistors to be formed.

The vertical thickness of the bit lines 10 may be in a range from 10 nm to 300 nm, such as from 30 nm to 100 nm, although lesser and greater vertical thicknesses may also be used. The bit lines 10 may be formed with a periodicity along the first horizontal direction hd1. The periodicity of the bit lines 10 may be the pitch of the field effect transistors along the first horizontal direction hd1, and may be, for example, in a range from 5 nm to 1,000 nm, such as from 10 nm to 300 nm, although lesser and greater periodicities may also be used. The width of each bit line 10 along the first horizontal direction hd1 may be in a range from 20% to 80%, such as from 30% to 70%, of the periodicity of the bit lines 10 along the first horizontal direction hd1.

Figures 3A, 3B, 3C:
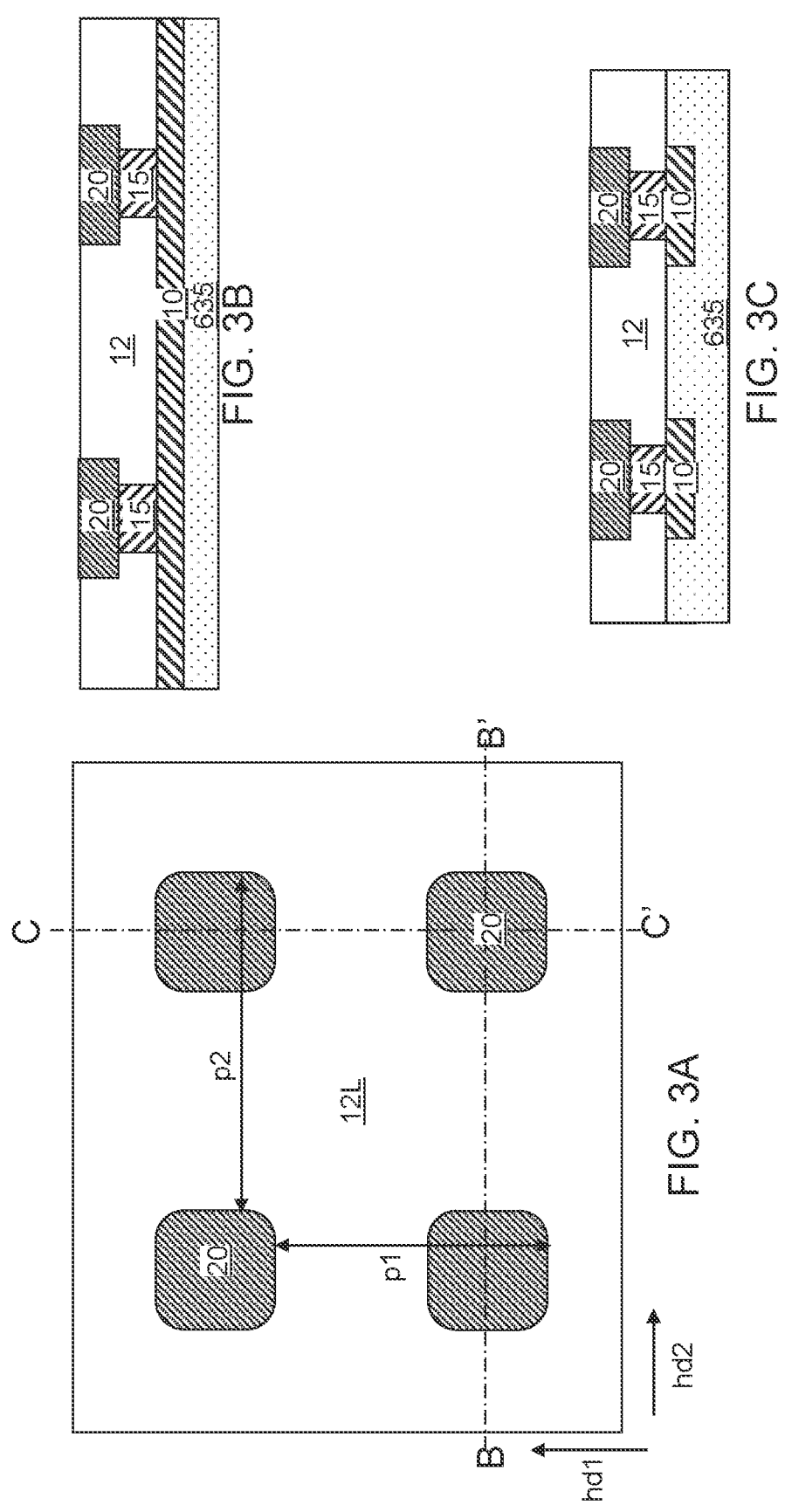
FIGS. 3A-3C are various views of a portion of a memory array region of the first exemplary structure after formation of bottom contact via structures and bottom electrodes according to the first embodiment of the present disclosure.

Referring to FIGS. 3A-3C, an insulating layer 12 may be formed above the insulating matrix layer 635 and the bit lines 10, and may be patterned to form at least one array of openings therein. For example, a trimmable photoresist layer (not shown) may be applied over the insulating layer 12, and may be lithographically patterned to form an array of openings in the first photoresist layer. The array of openings in the trimmable photoresist layer may be transferred at least into an upper portion of the insulating layer 12 to form an array of cavities in the insulating layer 12 by performing a first anisotropic etch process. The trimmable photoresist layer may be isotropically trimmed to increase the size of the openings therethrough, and a second anisotropic etch process may be performed to extend the depth of pre-existing array of cavities down to the top surfaces of the bit lines 10 and to etch additional volumes of the upper portion of the insulating layer 12 around the pre-existing array of cavities. A two-dimensional array of stepped cavities may be formed in the insulating layer 12. Each stepped cavity includes a lower cavity portion having a respective first horizontal cross-sectional shape and located in a lower portion of the insulating layer 12, and an upper cavity portion having a respective second horizontal cross-sectional shape and located in an upper portion of the insulating layer 12. Each second horizontal cross-sectional shape may be laterally offset from the first horizontal cross-sectional shape of a same stepped cavity by a uniform lateral offset distance, which is the lateral trimming distance of the trimmable photoresist layer. The uniform lateral offset distance may be in a range from 1% to 20% of the periodicity of the bit lines 10 along the first horizontal direction hd1, and may be in a range from 1 nm to 40 nm, such as from 2 nm to 20 nm, although lesser and greater uniform lateral offset distances may also be used.

The two-dimensional array of stepped cavities may be filled with at least one metallic fill material. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the insulating layer 12.

Each remaining portion of the at least one metallic material comprises a combination of a bottom contact via structure 15 and a bottom electrode 20. Specifically, each remaining portion of the at least one metallic material that fills a lower portion of a stepped cavity having a respective first horizontal cross-sectional shape constitutes a bottom contact via structure 15, and each remaining portion of the at least one metallic material that fills an upper portion of a stepped cavity having a respective second horizontal cross-sectional shape constitutes a bottom electrode 20. While the present disclosure is described using an embodiment in which the bottom contact via structures 15 and the bottom electrodes 20 are formed simultaneously, embodiments are expressly contemplated herein in which the bottom contact via structures 15 are formed first, and the bottom electrodes 20 are formed subsequently.

A two-dimensional array of bottom contact via structures 15 and a two-dimensional array of bottom electrodes 20 may be formed within the insulating layer 12. Each bottom contact via structure 15 contacts a bottom surface of a respective one of the bottom electrodes 20. The bit lines 10 contact a respective column of the bottom contact via structures 15 that are arranged along the second horizontal direction h2. Generally, the first horizontal cross-sectional shape of each bottom contact via structure 15 and the second horizontal cross-sectional shape of each bottom electrode 20 may be any two-dimensional shape having a closed periphery. For example, the horizontal cross-sectional shapes of the bottom contact via structures 15 and the bottom electrodes 20 may be shapes of a circle, ellipse, a rectangle, a rounded rectangle, or any two-dimensional curvilinear shape having a closed periphery. The top surfaces of the bottom electrodes 20 may be coplanar with the top surface of the insulating layer 12.

In one embodiment, the two-dimensional array of bottom electrodes 20 may be formed as a periodic rectangular two-dimensional array of bottom electrodes 20 having a first pitch p1 along the first horizontal direction hd1 and a second pitch p2 along the second horizontal direction hd2. According to an aspect of the present disclosure, the second pitch p2 may be greater than the first pitch p1. The first pitch p1 may be in a range from 10 nm to 1,000 nm, although lesser and greater first pitches may also be used. The second pitch p2 may be in a range from 12 nm to 1,300 nm, although lesser and greater second pitches may also be used. The difference between the second pitch p2 and the first pitch p1 may be in a range from 2 nm to 300 nm, such as from 10 nm to 150 nm, although lesser and greater differences may also be used.

Figures 4A, 4B, 4C:
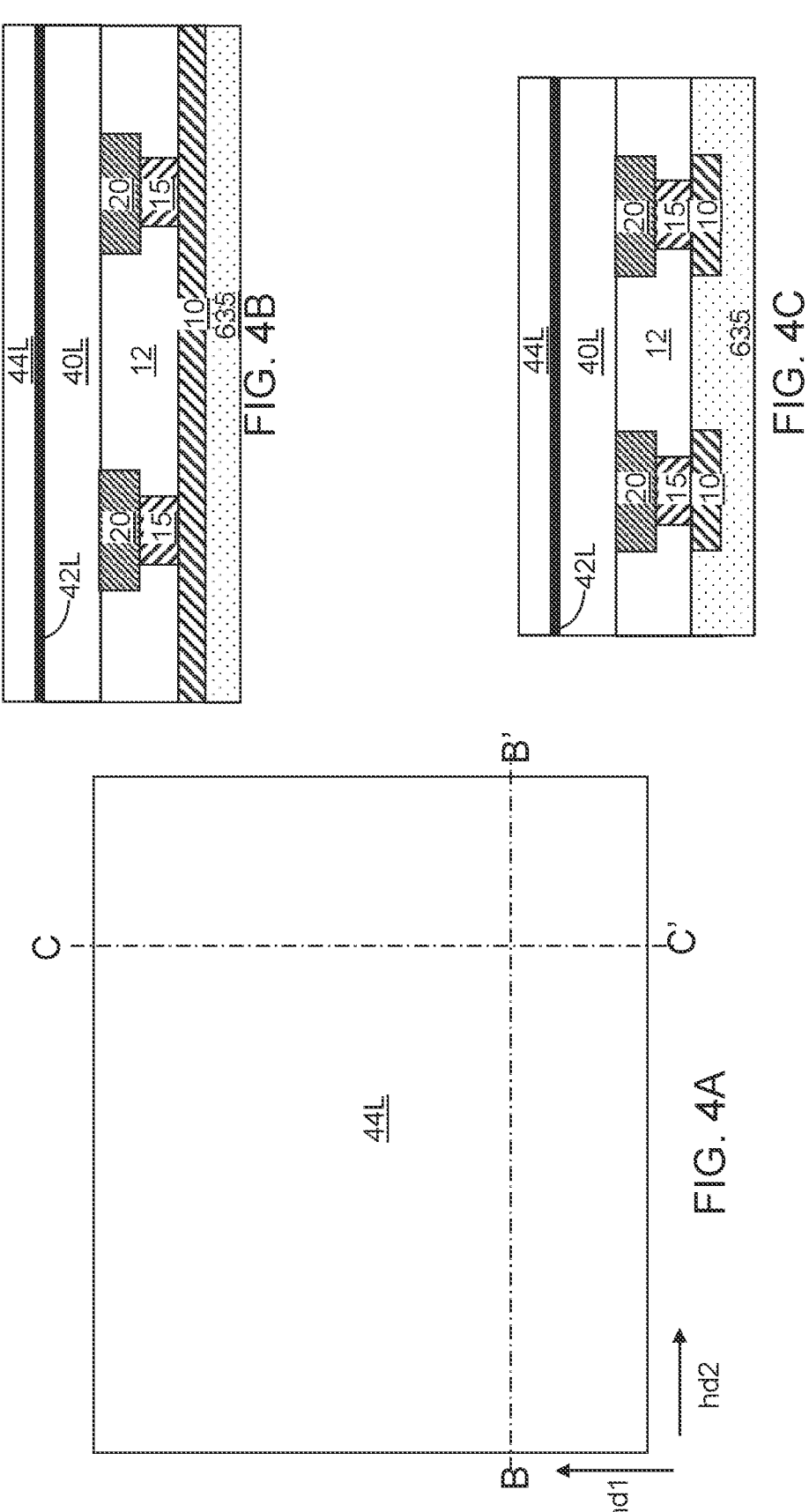
FIGS. 4A-4C are various views of a portion of a memory array region of the first exemplary structure after formation of a dielectric pillar material layer, a first etch stop layer, and an insulating matrix layer according to the first embodiment of the present disclosure.

Referring to FIGS. 4A-4C, a layer stack including a dielectric pillar material layer 40L, a first etch stop layer 42L, and an insulating matrix layer 44L may be formed above the two-dimensional array of bottom electrodes 20. Each of the dielectric pillar material layer 40L and the insulating matrix layer 44L comprises a dielectric material such as undoped silicate glass, a doped silicate glass, organosilicate glass, silicon nitride, silicon carbide nitride, silicon oxynitride, or a combination thereof. The materials of the dielectric pillar material layer 40L and the insulating matrix layer 44L may be the same, or may be different. The first etch stop layer 42L includes a dielectric etch stop material that may be different from the materials of the dielectric pillar material layer 40L and the insulating matrix layer 44L. For example, the first etch stop layer 42L may include a high-k dielectric metal oxide material (such as hafnium oxide, lanthanum oxide, yttrium oxide, titanium oxide, tantalum oxide, aluminum oxide, etc.), silicon nitride, or silicon carbide nitride. The dielectric pillar material layer 40L, the first etch stop layer 42L, and the insulating matrix layer 44L may be deposited by chemical vapor deposition processes. The thickness of the dielectric pillar material layer 40L may be in range from 1 nm to 200 nm, such as from 3 nm to 60 nm, and/or from 6 nm to 30 nm. The thickness of the first etch stop layer 42L may be in a range from 0.2 nm to 30 nm, such as from 1 nm to 5 nm, although lesser and greater thicknesses may also be used. The thickness of the insulating matrix layer 44L may be in range from 1 nm to 200 nm, such as from 3 nm to 60 nm, and/or from 6 nm to 30 nm.

Figures 5A, 5B, 5C:
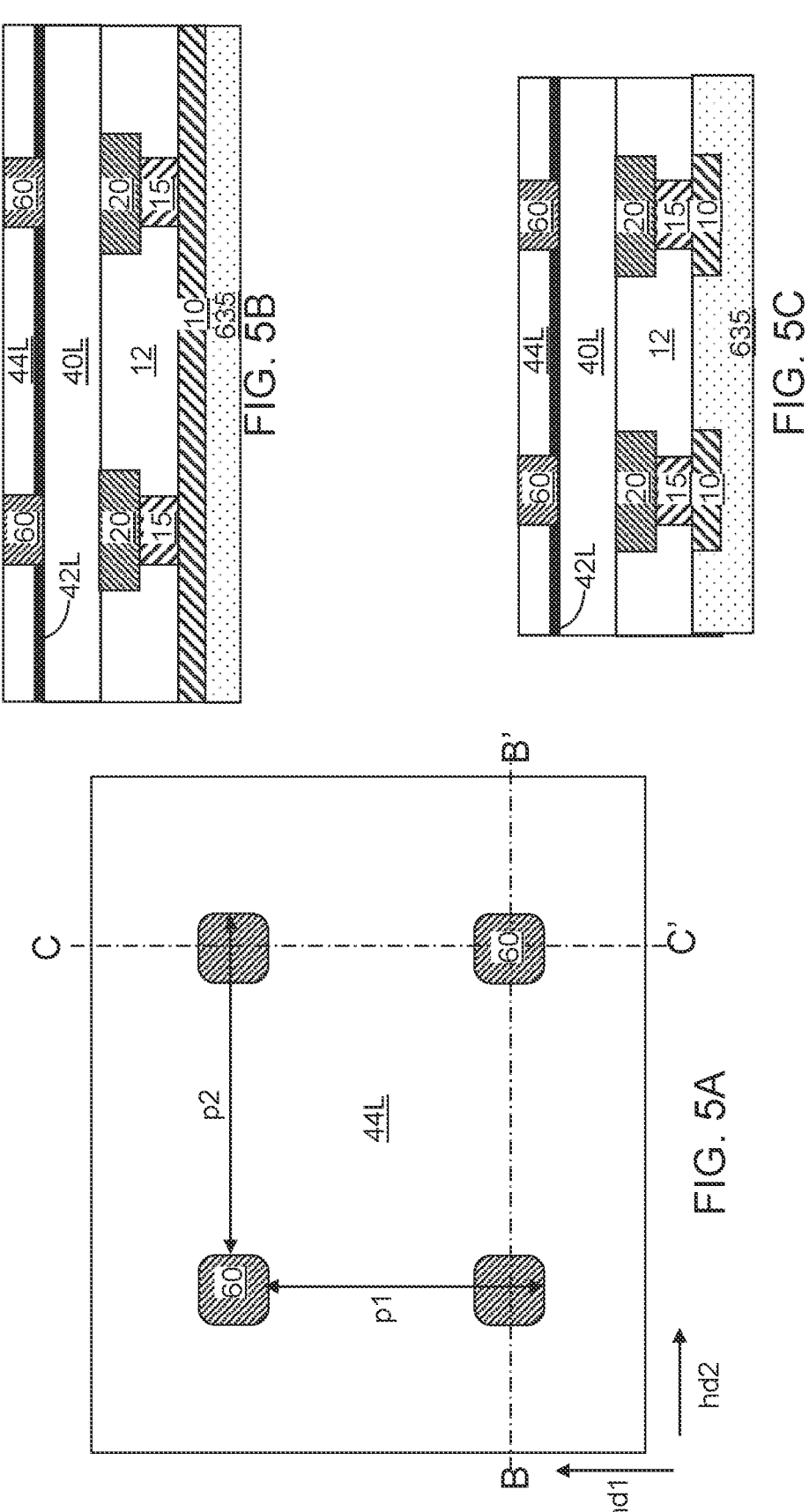
FIGS. 5A-5C are various views of a portion of a memory array region of the first exemplary structure after formation of top electrodes in the insulating matrix layer according to the first embodiment of the present disclosure.

Referring to FIGS. 5A-5C, a photoresist layer (not shown) may be applied over the top surface of the insulating matrix layer 44L, and may be lithographically patterned to form an array of openings having a same two-dimensional periodicity as the two-dimensional array of bottom electrodes 20. According to an aspect of the present disclosure, the areas of the openings in the photoresist layer may be located entirely within the areas of the two-dimensional array of bottom electrodes 20. In this embodiment, the periphery of each opening in the photoresist layer may be laterally offset inward from the periphery of a top surface of an underlying bottom electrode 20. In one embodiment, the lateral offset distance between the periphery of each opening in the photoresist layer and the periphery of the top surface of the underlying bottom electrode 20 in a plan view may be in a range from 1% to 30%, such as from 2% to 20% and/or from 3% to 10%, of the maximum lateral dimension of the underlying bottom electrode 20. For example, the lateral offset distance between the periphery of each opening in the photoresist layer and the periphery of the top surface of the underlying bottom electrode 20 in the plan view may be in a range from 0.5 nm to 100 nm, such as from 2 nm to 20 nm, although lesser and greater lateral offset distances may also be used.

An anisotropic etch process may be performed using the patterned photoresist layer as an etch mask layer. The first etch stop layer 42L may be used as an etch stop structure for the anisotropic etch process. A two-dimensional array of top electrode cavities may be formed in the insulating matrix layer 44L underneath the two-dimensional array of openings in the photoresist layer. Optionally, an additional etch process (which may be an isotropic etch process or an anisotropic etch process) may be performed to etch physically exposed portions of the first etch stop layer 42L from underneath the two-dimensional array of top electrode cavities. The photoresist layer may be subsequently removed, for example, by ashing.

The two-dimensional array of top electrode cavities may be filled with at least one metallic fill material. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the insulating matrix layer 44L. Remaining portions of the at least one metallic material comprise top electrodes 60. Top surfaces of the top electrodes 60 may be coplanar with the top surface of the insulating matrix layer 44L.

A two-dimensional array of top electrodes 60 may be formed in the insulating matrix layer 44L. Generally, a first subset of the top electrodes 60 may be formed in the insulating matrix layer 44L. In one embodiment, the first subset of the top electrodes 60 may be the entire set of the top electrodes 60. In one embodiment, the two-dimensional array of top electrodes 60 may be formed as a periodic rectangular two-dimensional array of top electrodes 60 having a first pitch p1 along the first horizontal direction hd1 and a second pitch p2 along the second horizontal direction hd2.

Referring to FIGS. 6A-6C, an anisotropic etch process may be performed to etch portions of the insulating matrix layer 44L, the first etch stop layer 42L, the dielectric pillar material layer 40L, and the insulating layer 12. The metallic materials of the top electrodes 60 and the bottom electrodes 20 may be used as an etch mask during the anisotropic etch process. As such, the anisotropic etch process is a self-aligned anisotropic etch process that uses pre-existing structural elements as an etch mask. In this embodiment, use of a lithographic mask (such as a patterned photoresist layer) is not necessary during the anisotropic etch process.

The anisotropic etch process may remove the entirety of remaining portions of the insulating matrix layer 44L and the first etch stop layer 42L, and removes portions of the dielectric pillar material layer 40L that are not masked by the top electrodes 60. Thus, portions of the dielectric pillar material layer 40L that do not have an areal overlap with the top electrodes 60 are removed by the anisotropic etch process. Further, the anisotropic etch process may be optionally continued after peripheral portions of the top surfaces of the bottom electrodes 20 are physically exposed. In this embodiment, the physically exposed portions of the top surfaces of the bottom electrodes 20 function as an additional etch mask structure during subsequently anisotropic etching of the insulating layer 12. In one embodiment, the anisotropic etch process may be terminated before the insulating layer 12 is etched through so that exposure of the bit lines 10 may be avoided.

Each remaining patterned portion of the dielectric pillar material layer 40L constitutes a dielectric pillar 40. Each dielectric pillar 40 may have a same horizontal cross-sectional shape as a respective overlying top electrode 60. Each dielectric pillar 40 may have a uniform horizontal cross-sectional shape that is invariant under translation along the vertical direction. Sidewalls of the dielectric pillars 40 may be vertically coincident with sidewalls of the top electrodes 60. As used herein, a first surface and a second surface are vertically coincident if the second surface overlies or underlies the first surface and if a vertical plane exists that includes the first surface and the second surface.

Generally, the insulating matrix layer 44L, the dielectric pillar material layer 40L, and optionally an upper portion of the insulating layer 12 may be anisotropic ally etched using the top electrodes 60 and the bottom electrodes 20 as an etch mask. Patterned remaining portions of the dielectric pillar material layer 40L comprise the dielectric pillars 40. A two-dimensional array of vertical stacks (20, 40, 60) may be formed over a substrate 8. Each of the vertical stacks (20, 40, 60) includes, from bottom to top, a bottom electrode 20, a dielectric pillar 40, and a top electrode 60. Within each of the vertical stacks (20, 40, 60), a top periphery of the dielectric pillar 40 coincides with a bottom periphery of the top electrode 60, and a top periphery of the bottom electrode 20 is laterally offset outward from a bottom periphery of the dielectric pillar 40.

Generally, a plurality of vertical stacks over a substrate 8. Each of the vertical stacks includes, from bottom to top, a bottom electrode 20, a dielectric pillar 40, and a top electrode 60. In one embodiment, the top electrodes 60 may be formed as a two-dimensional periodic structure having a first periodicity, i.e., the first pitch p1, along a first horizontal direction hd1 and having a second periodicity, i.e., the second pitch p2, along a second horizontal direction hd2. In one embodiment, the two-dimensional array of bottom electrodes 20 may be formed as a periodic rectangular two-dimensional array of bottom electrodes 20 having a first pitch p1 along the first horizontal direction hd1 and a second pitch p2 along the second horizontal direction hd2. According to an aspect of the present disclosure, the second pitch p2 may be greater than the first pitch p1. The difference between the second pitch p2 and the first pitch may be in a range from 2 nm to 300 nm, such as from 10 nm to 150 nm, although lesser and greater differences may also be used. Within each of the two-dimensional array of vertical stacks, a top periphery of the dielectric pillar 40 coincides with a bottom periphery of the top electrode 60, and a top periphery of the bottom electrode 20 is laterally offset outward from a bottom periphery of the dielectric pillar 40.

The recessed horizontal surface of the insulating layer 12 may be formed below the horizontal plane including bottom surfaces of the bottom electrodes 20 and above the horizontal plane including the bottom surfaces of the bottom contact via structures 15. In one embodiment, the vertical distance between the horizontal plane including bottom surfaces of the bottom electrodes 20 and the recessed horizontal surface of the insulating layer 12 may be in a range from 100 nm to 1,000 nm, such as from 300 nm to 600 nm, although lesser and greater vertical distances may also be used.

Figures 7A, 7B, 7C:
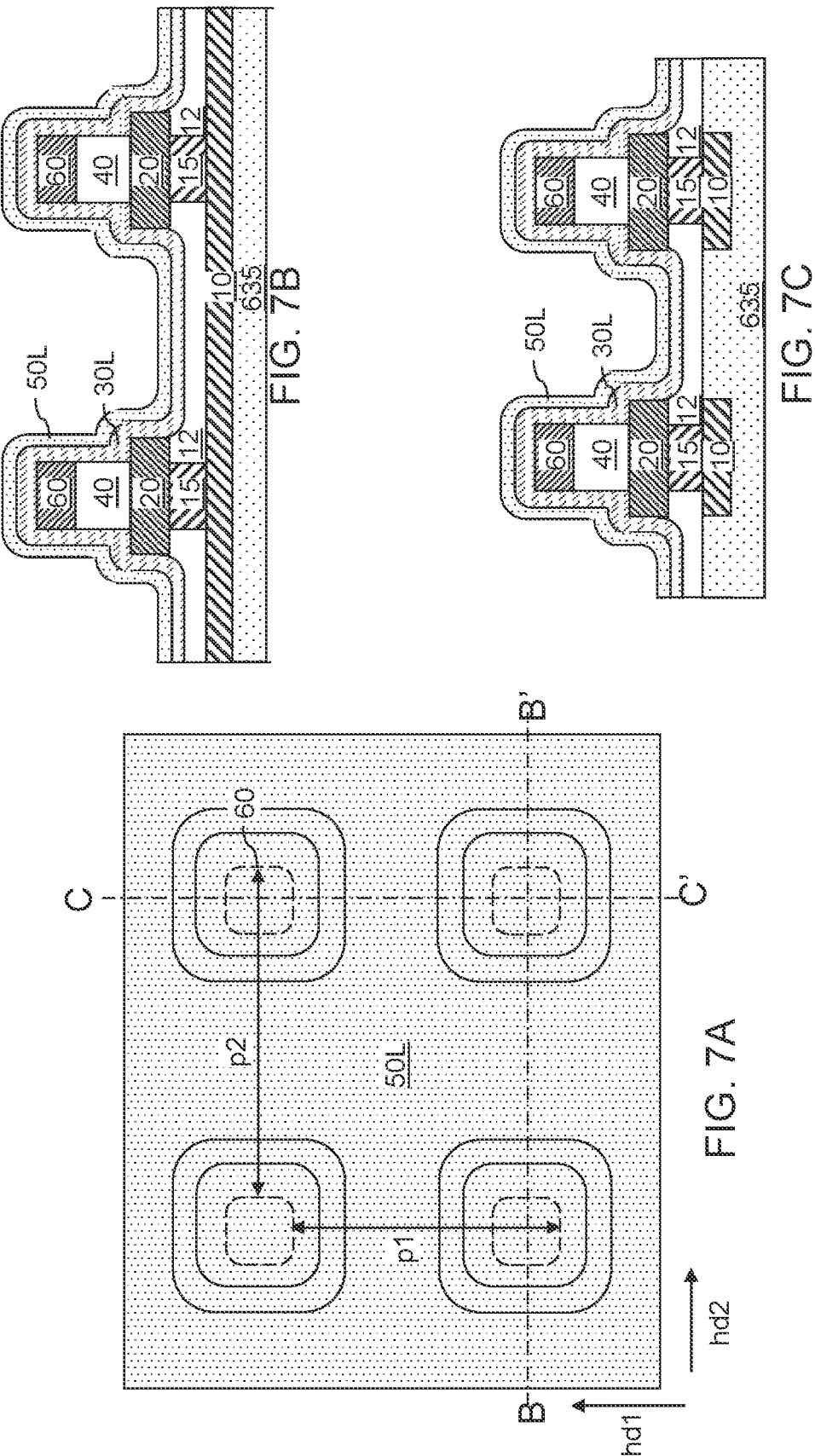
FIGS. 7A-7C are various views of a portion of a memory array region of the first exemplary structure after formation of a continuous active layer and a gate dielectric layer according to the first embodiment of the present disclosure.

Referring to FIGS. 7A-7C, a continuous active layer 30L and a gate dielectric layer 50L may be deposited over the two-dimensional array of vertical stacks (20, 40, 60). In one embodiment, the semiconducting material may include a material providing electrical conductivity in a range from 1.0 S/m to $1.0 \times 10^5$ S/m upon suitable doping with electrical dopants (which may be p-type dopants or n-type dopants). Exemplary semiconducting materials that may be used for the continuous active layer 30L include, but are not limited to, indium gallium zinc oxide (IGZO), indium tungsten oxide, indium zinc oxide, indium tin oxide, gallium oxide, indium oxide, doped zinc oxide, doped indium oxide (such as tungsten-doped indium oxide), doped cadmium oxide, and various other doped variants derived therefrom. Other suitable semiconducting materials are within the contemplated scope of disclosure. In one embodiment, the semiconducting material of the continuous active layer 30L may include indium gallium zinc oxide.

The continuous active layer 30L may include an amorphous semiconducting material or a polycrystalline semiconducting material. The continuous active layer 30L may be deposited by physical vapor deposition or atomic layer deposition although other suitable deposition processes may be used. The thickness of the continuous active layer 30L may be in a range from 2 nm to 500 nm, such as from 10 nm to 200 nm and/or from 30 nm to 100 nm, although lesser and greater thicknesses may also be used. The continuous active layer 30L comprises a horizontally-extending portion that laterally extends between neighboring pairs of the vertical stacks (20, 40, 60) over the entire area of the memory array region 100, a two-dimensional array of tubular portions laterally surrounding, and contacting, a respective vertical stack (20, 40, 60) within the two-dimensional array of vertical stacks (20, 40, 60), and a two-dimensional array of capping portions overlying a respective vertical stack (20, 40, 60) within the two-dimensional array of vertical stacks (20, 40, 60).

The gate dielectric layer 50L may be formed over the continuous active layer 30L by deposition of at least one gate dielectric material. The gate dielectric material may include, but is not limited to, silicon oxide, silicon oxynitride, a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. In one embodiment, the gate dielectric material of the gate dielectric layer 50L may comprise an oxide of at least one metal selected from In, Zn, Ga, Sn, Pb, Zr, Sr, Ru, Mn, Mg, Nb, Ta, Hf, Al, La, Sc, Ti, V, Cr, Mo, W, Fe, Co, Ni, Pd, Ir, Ag, and combinations thereof. The total atomic percentage of the at least one metal in the gate dielectric layer 50L may be in a range from 25% to 60%, such as from 33.3% to 50%. Some metals may be present at a dopant concentration, such as less than 1.0%. Other suitable dielectric materials are within the contemplated scope of disclosure. The gate dielectric material may be deposited by atomic layer deposition or chemical vapor deposition although other suitable deposition processes may be used. The thickness of the gate dielectric layer 50L may be in a range from 1 nm to 100 nm, such as from 3 nm to 50 nm and/or from 6 nm to 30 nm, although lesser and greater thicknesses may also be used.

Figures 8A, 8B, 8C:
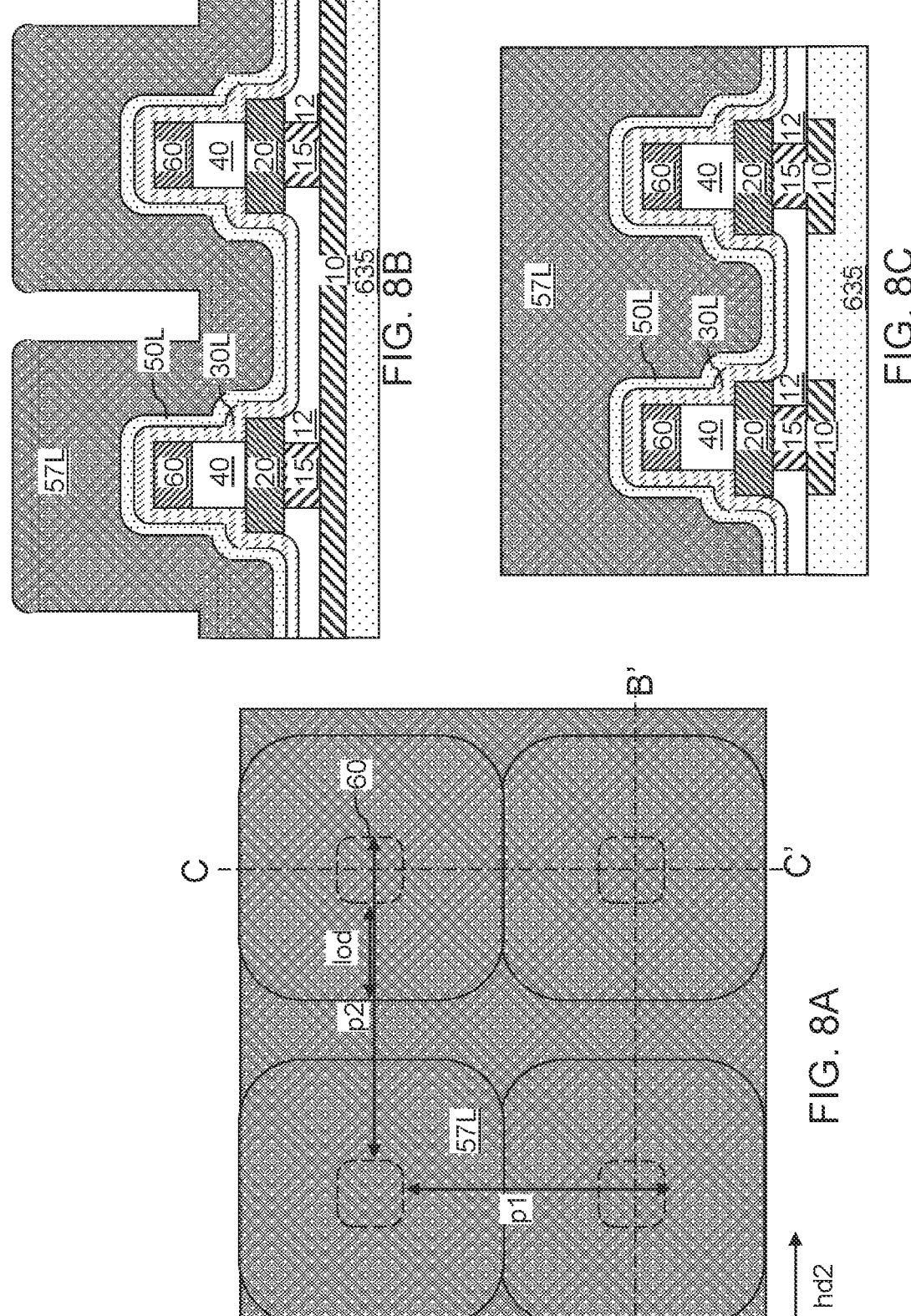
FIGS. 8A-8C are various views of a portion of a memory array region of the first exemplary structure after depositing a sacrificial spacer material layer according to the first embodiment of the present disclosure.

Referring to FIGS. 8A-8C, a sacrificial spacer material layer 57L may be deposited over the gate dielectric layer 50L. The sacrificial spacer material layer 57L includes a sacrificial material that may be subsequent removed selective to the material of the gate dielectric layer 50L. In one embodiment, the sacrificial spacer material layer 57L may comprise a doped silicate glass (such as borosilicate glass, phosphosilicate glass, borophosphosilicate glass, or fluorosilicate glass), porous or non-porous organosilicate glass, silicon nitride, a semiconductor material (such as amorphous silicon, polysilicon, or a silicon-germanium alloy), or a carbon-based material (such as amorphous carbon or diamond-like carbon) that may be subsequently removed by ashing.

In one embodiment, the sacrificial spacer material layer 57L may be deposited by an anisotropic deposition process that deposits a sacrificial spacer material with directionality. In one embodiment, the thickness of the portions of the sacrificial spacer material layer 57L overlying the vertical stacks (20, 40, 60) may be greater than the thickness of portions of the sacrificial spacer material layer 57L that is deposited over recessed portions of the insulating layer 12, and may be greater than the lateral thickness of vertically-extending portions of the sacrificial spacer material layer 57L that laterally surrounds a respective one of the vertical stacks (20, 40, 60).

The outer sidewalls of the vertically-extending portions of the sacrificial spacer material layer 57L are formed with the same lateral distance from a most proximal sidewall among the sidewalls of the stacks of top electrodes 60 and dielectric pillars 40. As discussed above, the second pitch p2 is greater than the first pitch p1. According to an aspect of the present disclosure, the duration of the deposition process that forms the sacrificial spacer material layer 57L is selected such that that the vertically-extending portions of the sacrificial spacer material layer 57L merge along the first horizontal direction hd1, and do not merge along the second horizontal direction hd2. Thus, vertically-extending sidewalls of the sacrificial spacer material layer 57L may laterally extend along the first horizontal direction hd1 between a respective pair of rows of vertical stacks (20, 40, 60). In one embodiment, each vertically-extending sidewall of the sacrificial spacer material layer 57L may laterally extend along the first horizontal direction hd1 over multiple times the first pitch p1.

Each vertically-extending sidewall of the sacrificial spacer material layer 57L may be equidistant from a most proximal sidewall among the sidewalls of the top electrodes 60. The lateral distance between each point in the vertically-extending sidewalls of the sacrificial spacer material layer 57L and a most proximal sidewall among sidewalls of the top electrodes 60 may be uniform, and is herein referred to as a lateral offset distance lod. The lateral offset distance lod is greater than the thickness of the continuous active layer 30L and the gate dielectric layer 50L. The difference between the lateral offset distance and the sum of the thicknesses of the continuous active layer 30L and the gate dielectric layer 50L may be in a range from 1 nm to 1,000 nm, such as from 10 nm to 300 nm, although lesser and greater differences may also be used. The difference between the lateral offset distance and the sum of the thicknesses of the continuous active layer 30L and the gate dielectric layer 50L is the lateral thickness of the vertically-extending portions of the sacrificial spacer material layer 57L.

Each vertically-extending sidewall of the sacrificial spacer material layer 57L may include a laterally alternating sequence of laterally-straight vertical segments and pairs of laterally-convex vertical segments that alternate along the first horizontal direction hd1. Gaps, i.e., cavities, are present between neighboring pairs of vertically-extending sidewalls of the sacrificial spacer material layer 57L. The lateral separation distance between facing pairs of laterally-straight vertical segments of two vertically-extending sidewalls of the sacrificial spacer material layer 57L around each gap may be in a range from 10 nm to 1,000 nm, such as from 30 nm to 300 nm, although lesser and greater lateral separation distances may also be used.

Referring to FIGS. 9A-9C, an anisotropic etch process may be performed to vertically recess horizontally-extending portions of the sacrificial spacer material layer 57L. Strip portions of the sacrificial spacer material layer 57L may be removed underneath each gap between facing pairs of vertically-extending sidewalls of the sacrificial spacer material layer 57L. The sacrificial spacer material layer 57L may be divided into a plurality of sacrificial spacers 57 that laterally extend along the first horizontal direction hd1 and laterally surrounds a respective row of vertical stacks (20, 40, 60). The sacrificial spacers 57 may be disjoined among one another, i.e., not in direct contact among one another. The sacrificial spacers 57 may be formed as a one-dimensional periodic array having the second periodicity along the second horizontal direction hd2.

In one embodiment, the thickness of horizontally-extending portions of the sacrificial spacer material layer 57L overlying the top electrodes 60 may be greater than the thickness of horizontally-extending portions of the sacrificial spacer material layer 57L overlying the recessed surface of the insulating layer 12. In this embodiment, each sacrificial spacer 57 may comprise a thin horizontally-extending portion that overlies a respective top electrode 60.

Additional anisotropic etch processes may be performed to etch unmasked portions of the gate dielectric layer 50L and the continuous active layer 30L, i.e., portions of the gate dielectric layer 50L and the continuous active layer 30L that are not masked by the sacrificial spacers 57. The gate dielectric layer 50L is divided into a one-dimensional periodic array of gate dielectrics 50. The continuous active layer 30L is divided into a one-dimensional periodic array of active layers 30.

In one embodiment, the one-dimensional array of gate dielectrics 50 may comprise a one-dimensional periodic array of gate dielectrics 50 having the second periodicity, i.e., the second pitch p2, along the second horizontal direction hd2. In one embodiment, the one-dimensional array of active layers 30 may comprise a one-dimensional periodic array of active layers 30 having the second periodicity, i.e., the second pitch p2, along the second horizontal direction hd2. In one embodiment, the periphery of each gate dielectric 50 may be located within a vertical plane that is laterally offset from a vertical plane including sidewalls of a most proximal one among the top electrodes 60 by a uniform lateral distance, which is the lateral offset distance lod. In one embodiment, the periphery of each active layer 30 may be located within a vertical plane that is laterally offset from a vertical plane including sidewalls of a most proximal one among the top electrodes 60 by a uniform lateral distance, which is the lateral offset distance lod.

Each of the sacrificial spacers 57 laterally extends along the first horizontal direction hd1, and laterally surrounds a respective row of vertical stacks (20, 40, 60) that are arranged along the first horizontal direction hd1. Thus, each of the sacrificial spacers 57 laterally surrounds a respective row of top electrodes 60 that are arranged along the first horizontal direction hd1. Each of the active layers 30 contacts top surfaces of a row of bottom electrodes 20 that are arranged along the first horizontal direction hd1. Each of the active layers 30 contacts peripheral portions of top surfaces of a row of top electrodes 60 that are arranged along the first horizontal direction hd1. Each of the active layers 30 comprises a horizontally-extending portion that laterally extends along the first horizontal direction hd1 and a plurality of tubular portions laterally surrounding, and contacting, a respective vertical stack (20, 40, 60) within a row of vertical stacks (20, 40, 60) that are arranged along the first horizontal direction hd1.

Figures 10A, 10B, 10C:
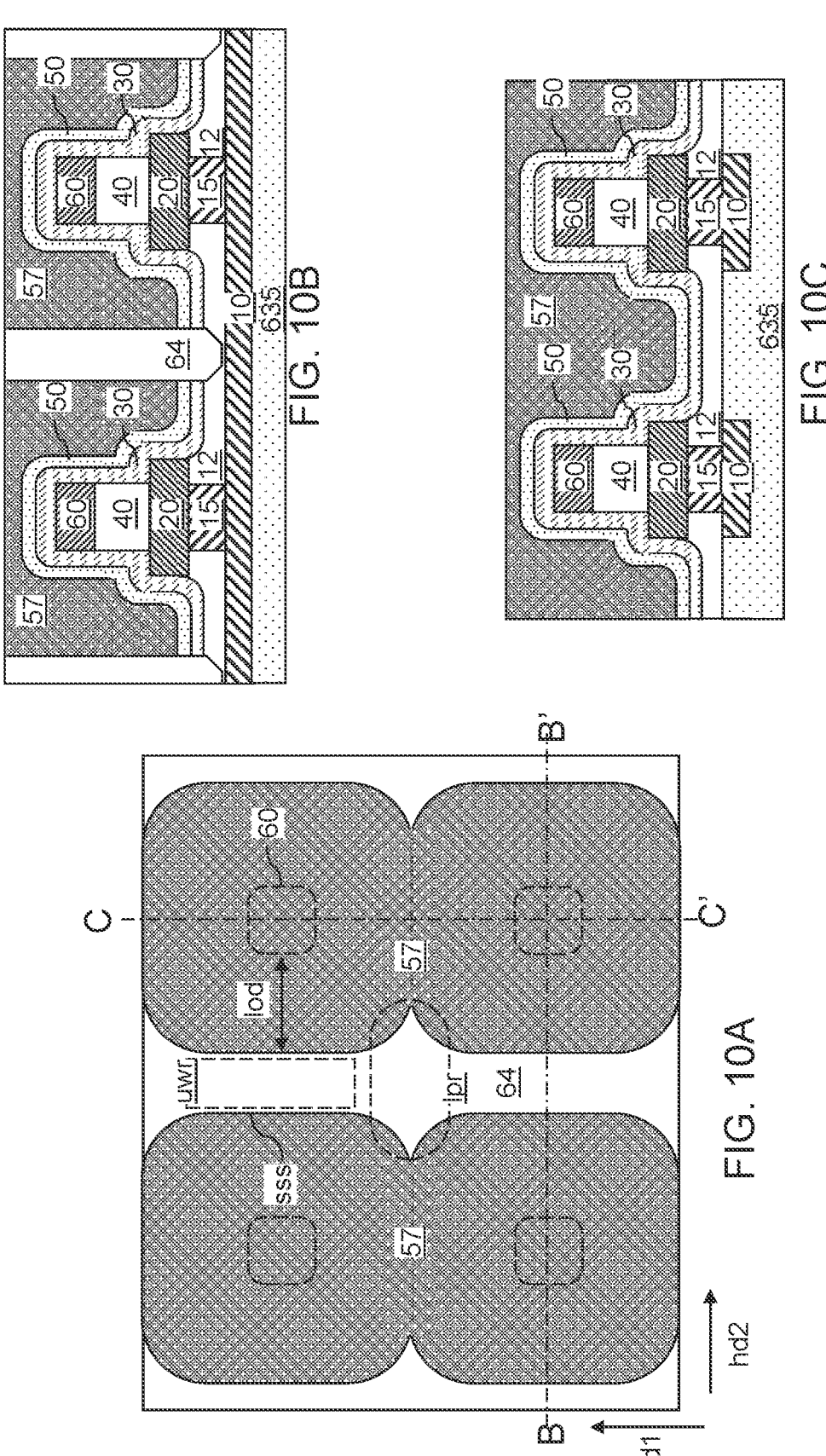
FIGS. 10A-10C are various views of a portion of a memory array region of the first exemplary structure after formation of dielectric wall structures according to the first embodiment of the present disclosure.

Referring to FIGS. 10A-10C, a dielectric fill material that is different from the material of the sacrificial spacers 57 may be deposited in the gaps between the sacrificial spacers 57. In one embodiment, the sacrificial spacers 57 comprise a doped silicate glass or organosilicate glass, and the dielectric fill material comprises undoped silicate glass or silicon nitride. In another embodiment, the sacrificial spacers 57 comprise silicon nitride, and the dielectric fill material comprises undoped silicate glass or a doped silicate glass. Optionally, a reflow process may be performed to facilitate filling of the volumes of the gaps with the dielectric fill material.

Excess portions of the dielectric fill material may be removed from above the horizontal plane including the top surface of the sacrificial spacers 57 by a planarization process such as a chemical mechanical polishing (CMP) process and/or a recess etch process. Remaining portions of the dielectric fill material that fill the gaps constitute dielectric wall structures 64. In one embodiment, top surfaces of the dielectric wall structures 64 may be coplanar with the top surfaces of the sacrificial spacers 57. The dielectric wall structures 64 laterally extend from a first horizontal plane including top surfaces of the sacrificial spacers 57 at least to a second horizontal plane including bottom surfaces of the bottom electrodes 20.

Generally, dielectric wall structures 64 may be formed around the sacrificial spacers 57 by filling gaps between neighboring pairs of the sacrificial spacers 57 with a dielectric fill material. The dielectric wall structures 64 are not in direct contact among one another. In one embodiment, each neighboring pair of dielectric wall structures 64 is laterally spaced from each other at least by a maximum lateral dimension of the top electrodes 60 along the second horizontal direction hd2.

In one embodiment, each of the dielectric wall structures 64 comprises uniform width regions uwr having a uniform width between a respective pair of straight sidewall segments sss that laterally extend along the first horizontal direction hd1 and laterally protruding regions 1pr that laterally protrude outward from vertical planes including the straight sidewall segments sss of the uniform width regions uwr. In one embodiment, the difference between the second pitch p2 and the first pitch p1 is greater than the uniform width of the uniform width regions uwr.

Referring to FIGS. 11A-11C, a selective removal process that removes the material of the sacrificial spacers 57 selective to the materials of the gate dielectrics 50 and the dielectric wall structures 64 may be performed. The selective removal process may comprise an etch process such as an isotropic etch process. For example, in embodiments in which the sacrificial spacers 57 include silicon nitride, a wet etch process using hot phosphoric acid may be performed to remove the sacrificial spacers 57. In embodiments in which the sacrificial spacers 57 include a doped silicon oxide material (such as borosilicate glass) having a higher etch rate than undoped silicate glass, a wet etch process using dilute hydrofluoric acid may be used to remove the sacrificial spacers 57. Gate cavities 59 are formed in volumes from which the sacrificial spacers 57 are removed. Each gate cavity 59 laterally extends along the first horizontal direction hd1, and laterally surrounds a respective row of vertical stacks (20, 40, 60).

Figures 12A, 12B, 12C:
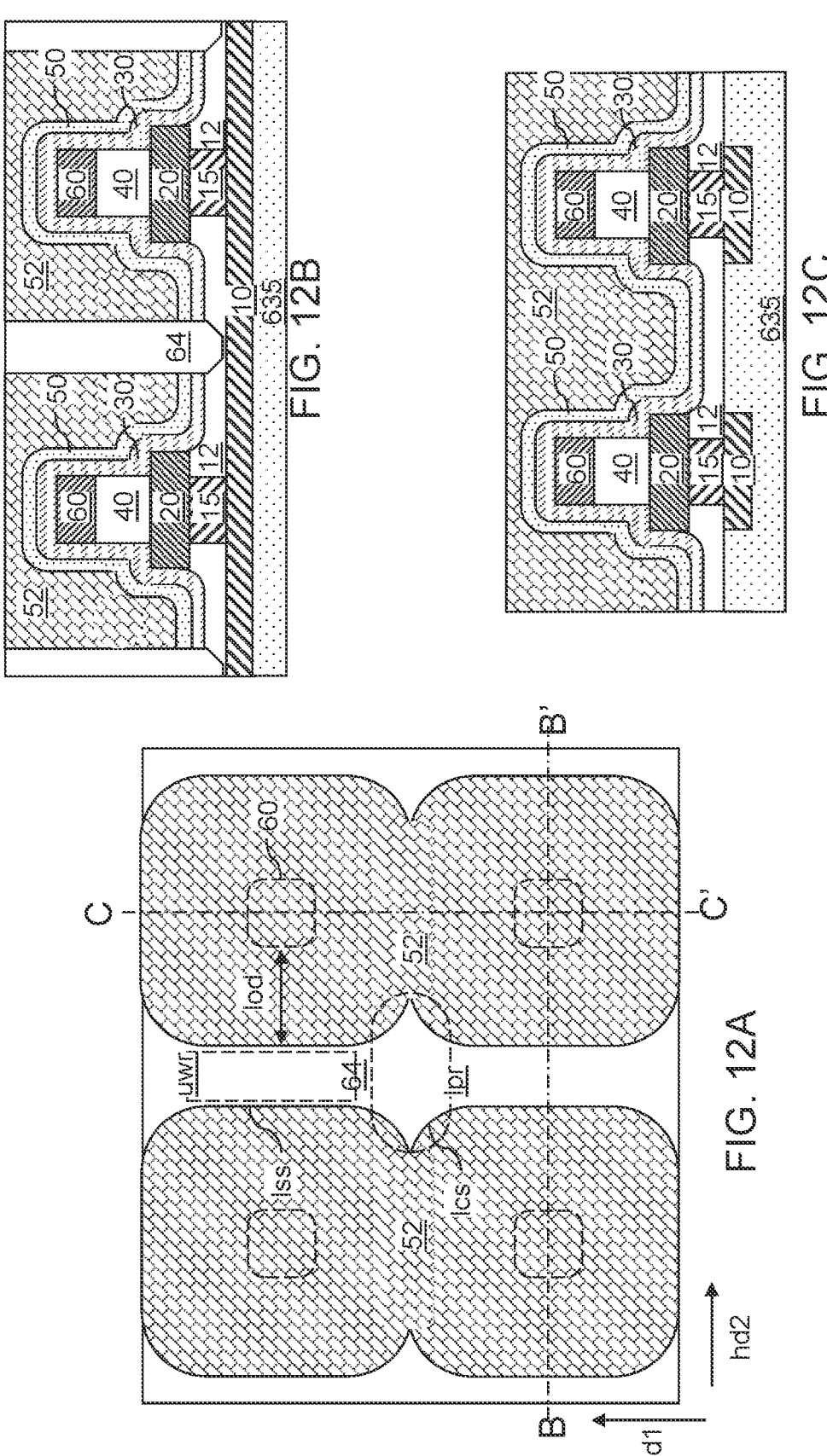
FIGS. 12A-12C are various views of a portion of a memory array region of the first exemplary structure after formation of gate electrodes according to the first embodiment of the present disclosure.

Referring to FIGS. 12A-12C, at least one metallic fill material may be deposited in the gate cavities 59. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. Other suitable metallic barrier and metallic fill materials are within the contemplated scope of disclosure. A planarization process, such as a chemical mechanical polishing (CMP) process, may be performed to remove portions of the metallic liner layer and the metallic fill material layer that overlie the horizontal plane including the top surface of the dielectric wall structures 64. Each remaining portion of the at least one metallic material comprises a gate electrode 52. In one embodiment, top surfaces of the gate electrodes 52 may be coplanar with the top surfaces of the dielectric wall structure 64. The gate electrodes 52 are formed over the plurality of gate dielectrics 50. Thus, the plurality of sacrificial spacers 57 may be replaced with the gate electrodes 52.

Generally, the sacrificial spacers 57 are replaced with gate electrodes 52. Each of the gate electrodes 52 laterally extends along a first horizontal direction hd1 and laterally surrounds a respective row of vertical stacks (20, 40, 60) that are arranged along the first horizontal direction hd1.

The gate electrodes 52 laterally surround, and overlie, a respective one of the gate dielectrics 50. The gate electrodes 52 laterally extend along the first horizontal direction hd1, and are laterally spaced apart long the second horizontal direction hd2. Each gate electrode 52 laterally surrounds a respective row of vertical stacks (20, 40, 60) of a bottom electrode 20, a dielectric pillar 40, and a top electrode 60. Each vertically-extending portion of an active layer 30 comprises a channel region of a thin film transistor, and is laterally surrounded by a respective gate electrode 52. Thus, in an embodiment, the gate electrodes 52 of the present disclosure may provide a gate-all-around configuration for each vertical thin film transistor.

The first exemplary structure includes a two-dimensional array of vertical stacks (20, 40, 60) located over a substrate 8. Each of the two-dimensional array of vertical stacks (20, 40, 60) includes, from bottom to top, a bottom electrode 20, a dielectric pillar 40, and a top electrode 60. The first exemplary structure includes active layers 30 comprising a semiconducting metal oxide material, extending over sidewalls of a respective row of vertical stacks (20, 40, 60) that are arranged along a first horizontal direction hd1, and laterally spaced apart along a second horizontal direction hd2. Gate stacks (50, 52) overlie a respective one of the active layers 30. Each of the gate stacks (50, 52) comprises a gate dielectric 50 and a gate electrode 52. Dielectric wall structures 64 may be interlaced with the gate stacks (50, 52) along the second horizontal direction hd2. Each sidewall of the dielectric wall structures 64 comprises a continuously extending vertical segment that laterally extends along the first horizontal direction hd1 and equidistant from a most proximal sidewall among sidewalls of a respective row of top electrodes 60 that are arranged along the first horizontal direction hd1.

In one embodiment, the dielectric wall structures 64 vertically extend from a first horizontal plane including top surfaces of the gate electrodes 52 at least to a second horizontal plane including bottom surfaces of the bottom electrodes 20. In one embodiment, each continuously extending vertical segment of the sidewalls of the dielectric wall structures 64 comprise laterally straight segments lss that are parallel to the first horizontal direction hd1, and pairs of laterally concave segments lcs that are adjoined to each other and located between a respective neighboring pair of laterally straight segments lss.

In one embodiment, the pairs of laterally concave segments lcs are laterally offset from sidewalls of a respective most proximal pair of the top electrodes 60 by a uniform lateral offset distance lod. In one embodiment, the laterally straight segments lss are laterally offset from a sidewall of a respective most proximal one of the top electrodes by the uniform lateral offset distance lod.

Figures 13A, 13B, 13C:
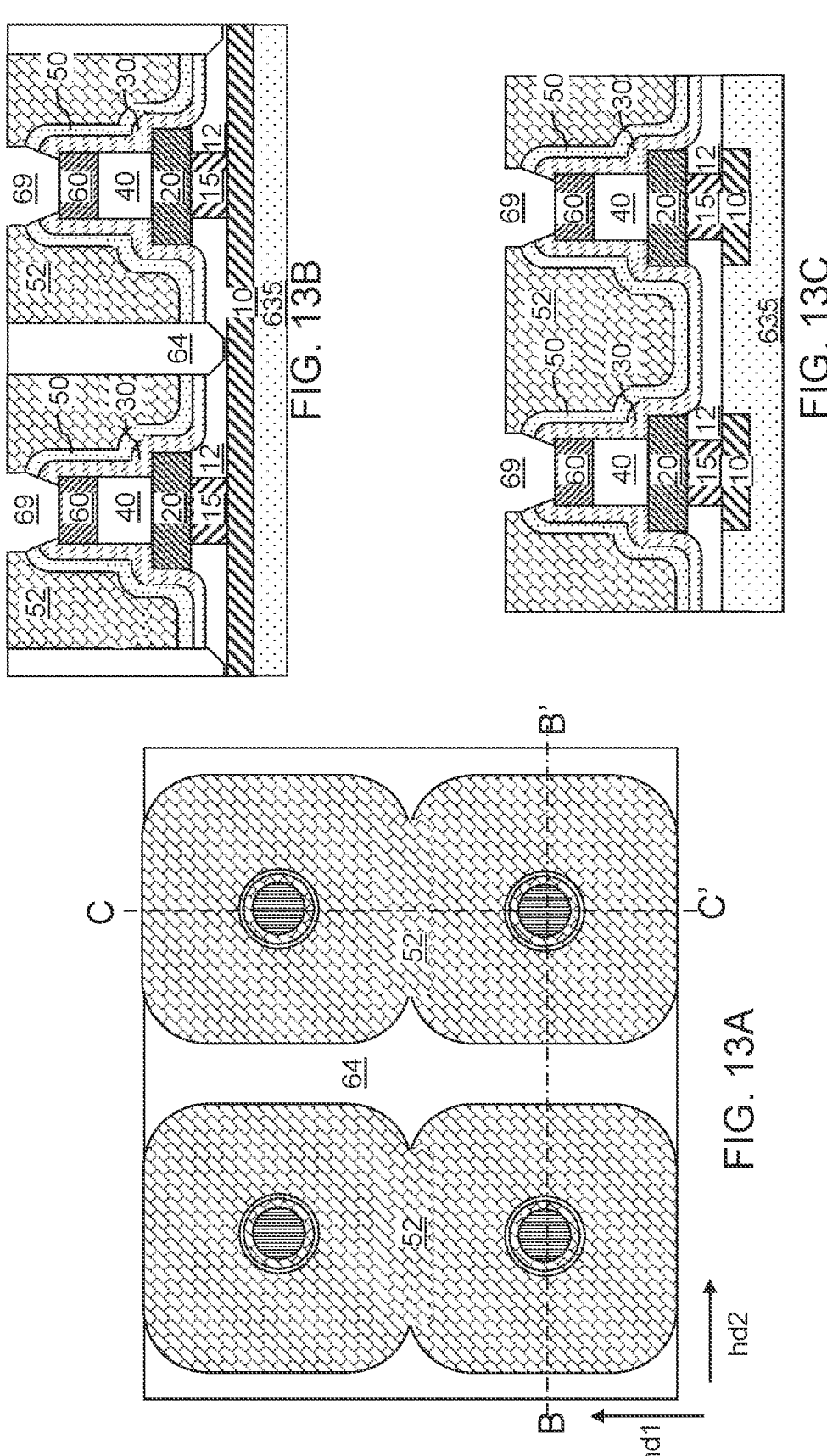
FIGS. 13A-13C are various views of a portion of a memory array region of the first exemplary structure after formation of contact recesses according to the first embodiment of the present disclosure.

Referring to FIGS. 13A-13C, a photoresist layer (not shown) may be applied over the gate electrodes 52 and the dielectric wall structures 64, and may be lithographically patterned to form a two-dimensional array of openings. Each of the openings in the photoresist layer may be located within the area of a respective underlying top electrode 60. An anisotropic etch process may be performed to etch unmasked portions of the gate electrodes 52, the gate dielectrics 50, and the active layers 30. Contact recesses 69 may be formed within volumes from which the materials of the gate electrodes 52, the gate dielectrics 50, and the active layers 30 are removed. A top surface of a top electrode 60 is physically exposed at the bottom of each contact recess 69. Each of the top electrodes 60 comprises a peripheral portion, such as an annular peripheral portion, that is contacted by a respective one of the active layers 30. In one embodiment, sidewalls of the contact recesses 69 may be vertical, or may be tapered, or may comprise vertical segments and tapered segments.

Figures 14A, 14B, 14C:
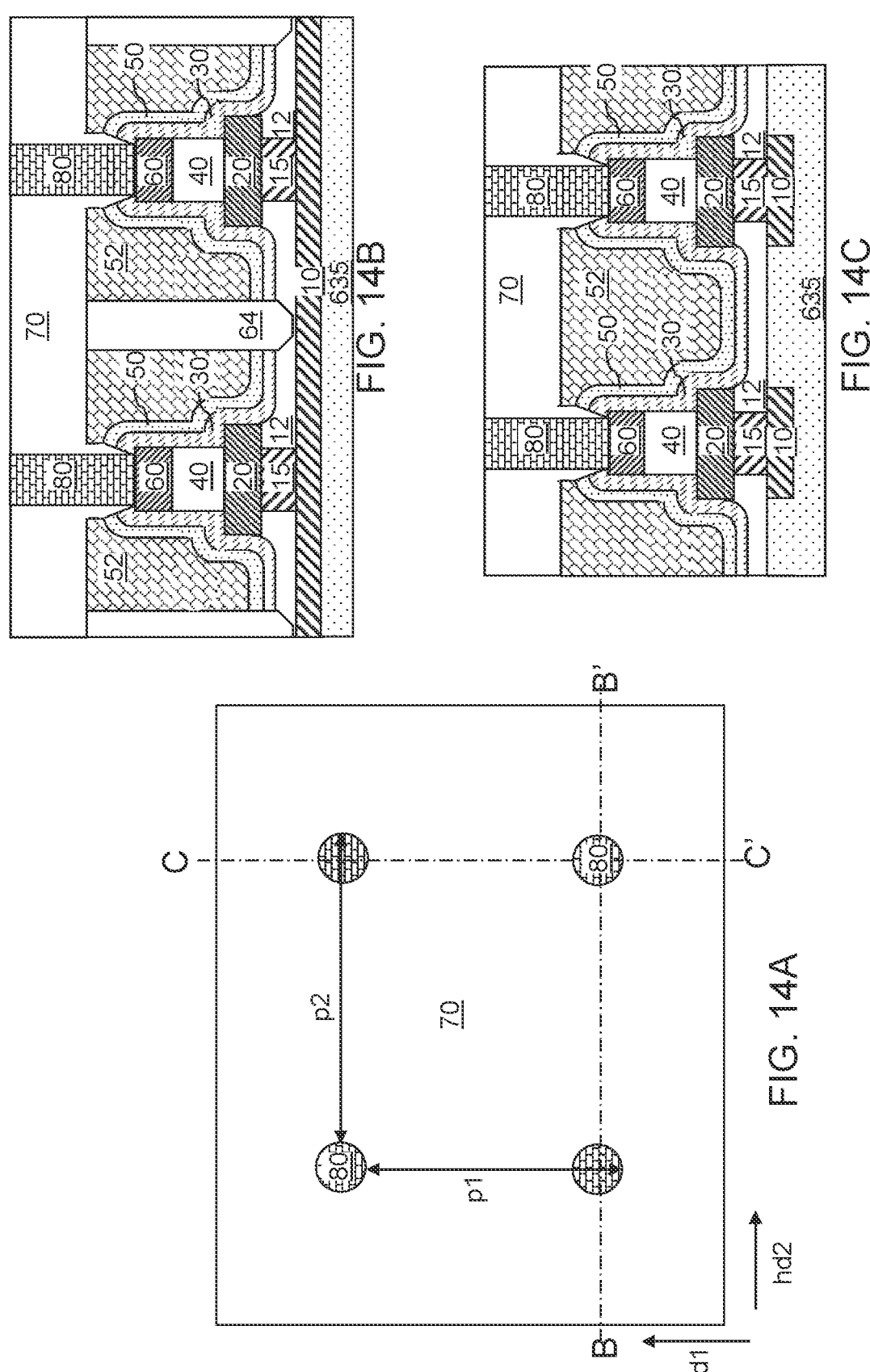
FIGS. 14A-14C are various views of a portion of a memory array region of the first exemplary structure after formation of a contact-level dielectric layer and top contact via structures according to the first embodiment of the present disclosure.

Referring to FIGS. 14A-14C, a dielectric material may be deposited in the contact recesses and over the gate electrodes 52 to form a contact-level dielectric layer 70. The contact-level dielectric layer 70 includes a dielectric material such as undoped silicate glass, a doped silicate glass, or organosilicate glass. The thickness of the contact-level dielectric layer 70, as measured above the gate electrodes 52, may be in a range from 30 nm to 600 nm, such as from 60 nm to 300 nm, although lesser and greater thicknesses may also be used.

A photoresist layer (not shown) may be applied over the contact-level dielectric layer 70, and may be lithographically patterned to form a two-dimensional array of opening therein. The pattern of the two-dimensional array of openings in the photoresist layer may have the same periodicity as the two-dimensional array of top electrodes 60. The size of each opening in the photoresist layer may be smaller than the size of an underlying contact recess 69 (which is filled with the contact-level dielectric layer 70). An anisotropic etch process may be performed to transfer the pattern of the openings in the photoresist layer through the contact-level dielectric layer 70. Contact via cavities may be formed within volumes from which the material of the contact-level dielectric layer 70 is removed. A top surface of a top electrode 60 may be physically exposed at the bottom of each contact via cavity. Each contact via cavity may be laterally bounded by a sidewall or sidewalls of the contact-level dielectric layer 70.

At least one metallic fill material may be deposited in the contact via cavities. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. As noted above, other suitable metallic fill and metallic barrier materials are within the contemplated scope of disclosure. A planarization process, such as a chemical mechanical polishing (CMP) process, may be performed to remove portions of the metallic liner layer and the metallic fill material layer that overlie the horizontal plane including the top surface of the contact-level dielectric layer 70. Each remaining portion of the at least one metallic material comprises a top contact via structure 80. In one embodiment, top surfaces of the top contact via structures 80 may be coplanar with the top surfaces of the contact-level dielectric layer 70. Each of the top electrodes 60 may be contacted by a respective one of the top contact via structures 80. The top contact via structures 80 may have the same two-dimensional periodicity as the two-dimensional array of top electrodes 60.

The contact-level dielectric layer 70 overlies the gate electrodes 52, the active layers 30, the gate dielectrics 50, and the vertical stacks (20, 40, 60). The top contact via structures 80 are formed through the contact-level dielectric layer 70 and on a respective one of the top electrodes 60. A two-dimensional array of top contact via structures 80 vertically extends through the contact-level dielectric layer 70, contacts a respective one of the top electrodes 60, and is electrically isolated from the gate electrodes 52 by a respective dielectric material portion overlying the respective one of the top electrodes 60. The dielectric material portion may be a downward-protruding cylindrical portion of the contact-level dielectric layer 70. In this embodiment, the top contact via structures 80 are electrically isolated from the gate electrodes 52 by downward-protruding portions of the contact-level dielectric layer 70.

Figures 15A, 15B, 15C:
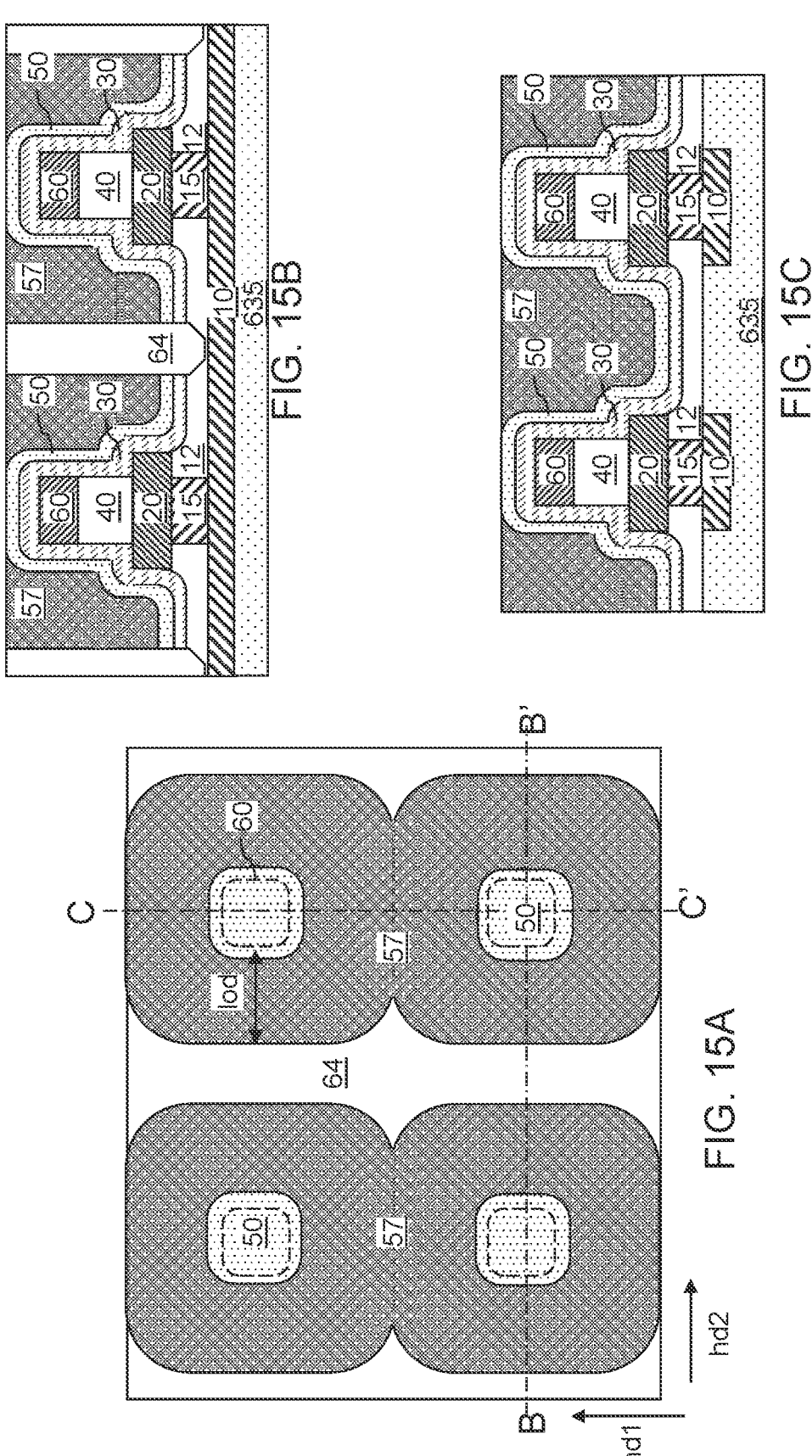
FIGS. 15A-15C are various views of a portion of a memory array region of a first alternative configuration of the first exemplary structure after formation of dielectric wall structures according to the first embodiment of the present disclosure.

Referring to FIGS. 15A-15C, a first alternative configuration of the first exemplary structure may be derived from the first exemplary structure of FIGS. 10A-10C by removing the horizontally-extending portions of the sacrificial spacer material layer 57L from above the topmost surfaces of the gate dielectrics 50 during an anisotropic etch process that forms the sacrificial spacers 57, or during the planarization process that removes the dielectric fill material of the dielectric wall structures 64 from above the horizontal plane including the topmost surfaces of the gate dielectrics 50.

Figures 16A, 16B, 16C:
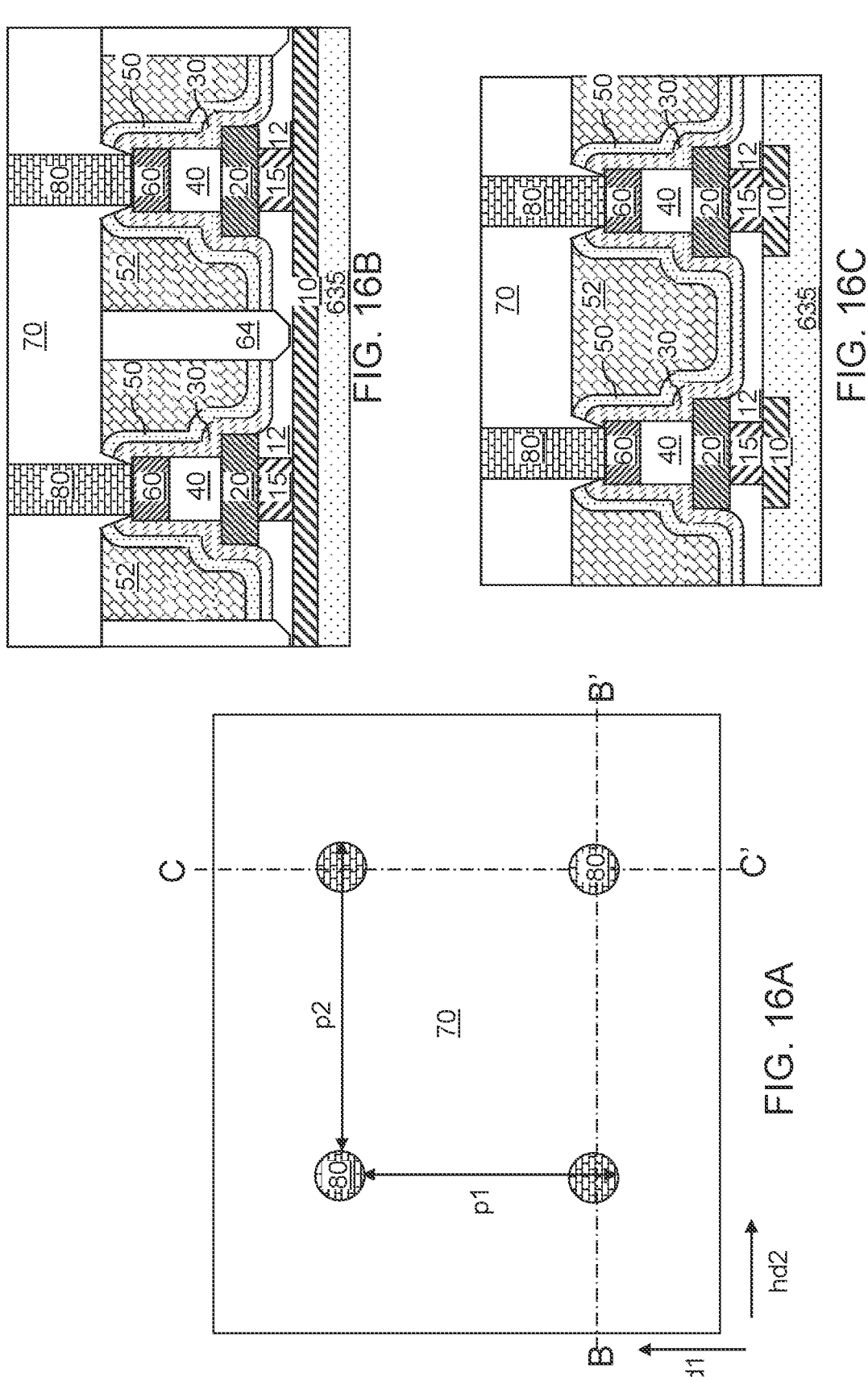
FIGS. 16A-16C are various views of a portion of a memory array region of the first alternative configuration of the first exemplary structure after formation of a contact-level dielectric layer and top contact via structures according to the first embodiment of the present disclosure.

Referring to FIGS. 16A-16C, the processing steps of FIGS. 11A-11C, 12A-2C, 13A-13C, and 14A-14C may be performed to form gate electrodes 52, a contact-level dielectric layer 70, and top contact via structures 80. In the first alternative configuration of the first exemplary structure, topmost surfaces of the gate dielectrics 50 may contact a bottom surface of the contact-level dielectric layer 70. Top surfaces of the dielectric wall structures 64 may be located within a horizontal plane including topmost surfaces of the gate dielectrics 50, and may be located above the horizontal plane including top surfaces of the top electrodes 60.

Referring to FIGS. 17A-17C, a second alternative configuration of the first exemplary structure may be derived from the first exemplary structure of FIGS. 10A-10C by removing horizontally-extending portions of the sacrificial spacer material layer 57L, the gate dielectrics 50, and the active layers 30 from above the topmost surfaces of the top electrodes 60 during a planarization process that forms the dielectric wall structures 64.

Figures 18A, 18B, 18C:
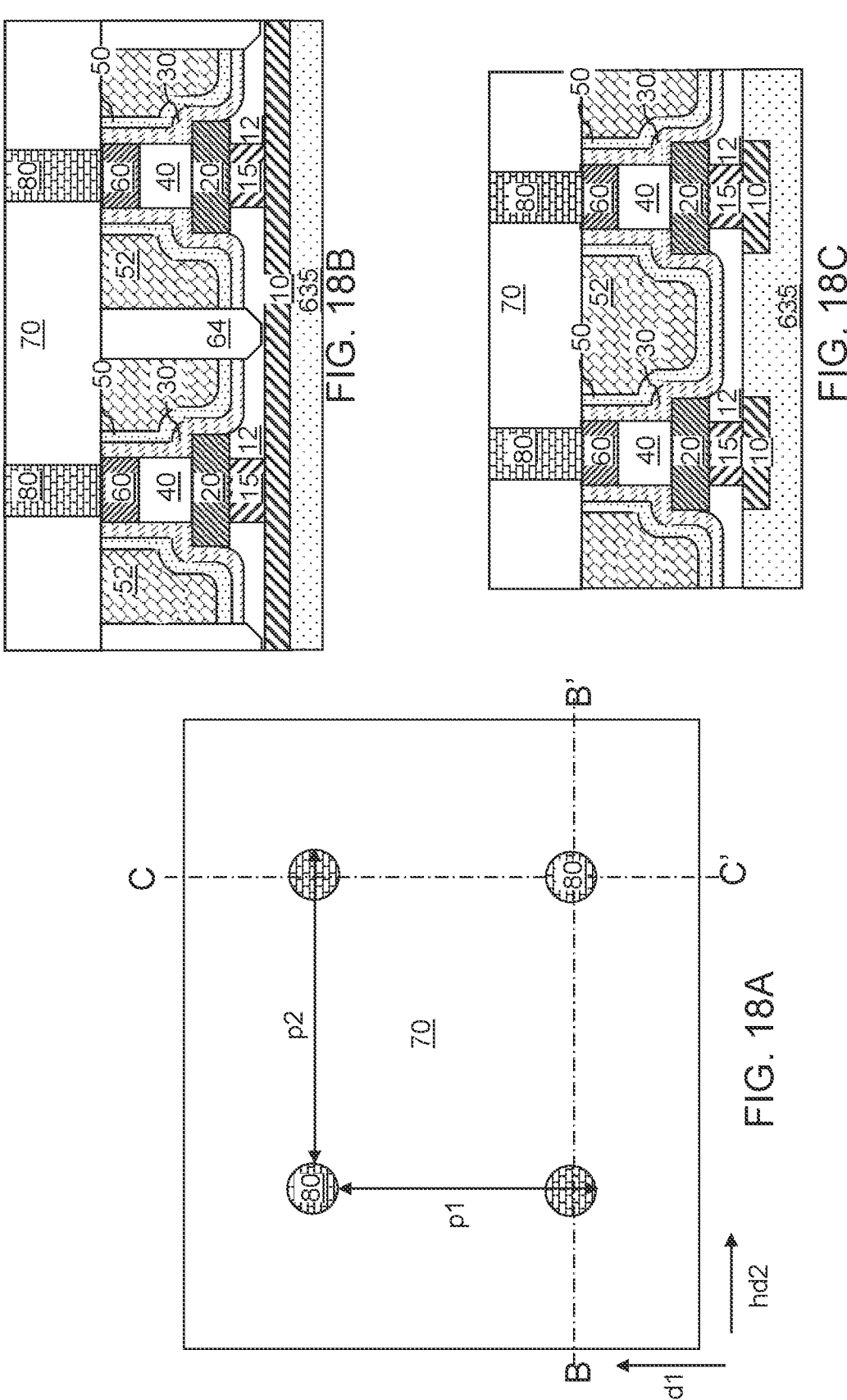
FIGS. 18A-18C are various views of a portion of a memory array region of the second alternative configuration of the first exemplary structure after formation of a contact-level dielectric layer and top contact via structures according to the first embodiment of the present disclosure.

Referring to FIGS. 18A-18C, the processing steps of FIGS. 11A-11C, 12A-12C, 13A-13C, and 14A-14C may be performed to form gate electrodes 52, a contact-level dielectric layer 70, and top contact via structures 80. In the second alternative configuration of the first exemplary structure, top surfaces of the top electrodes 60 may contact a bottom surface of the contact-level dielectric layer 70. Top surfaces of the dielectric wall structures 64 may be located within a horizontal plane including the top surfaces of the top electrodes 60.

Figures 19A, 19B, 19C:
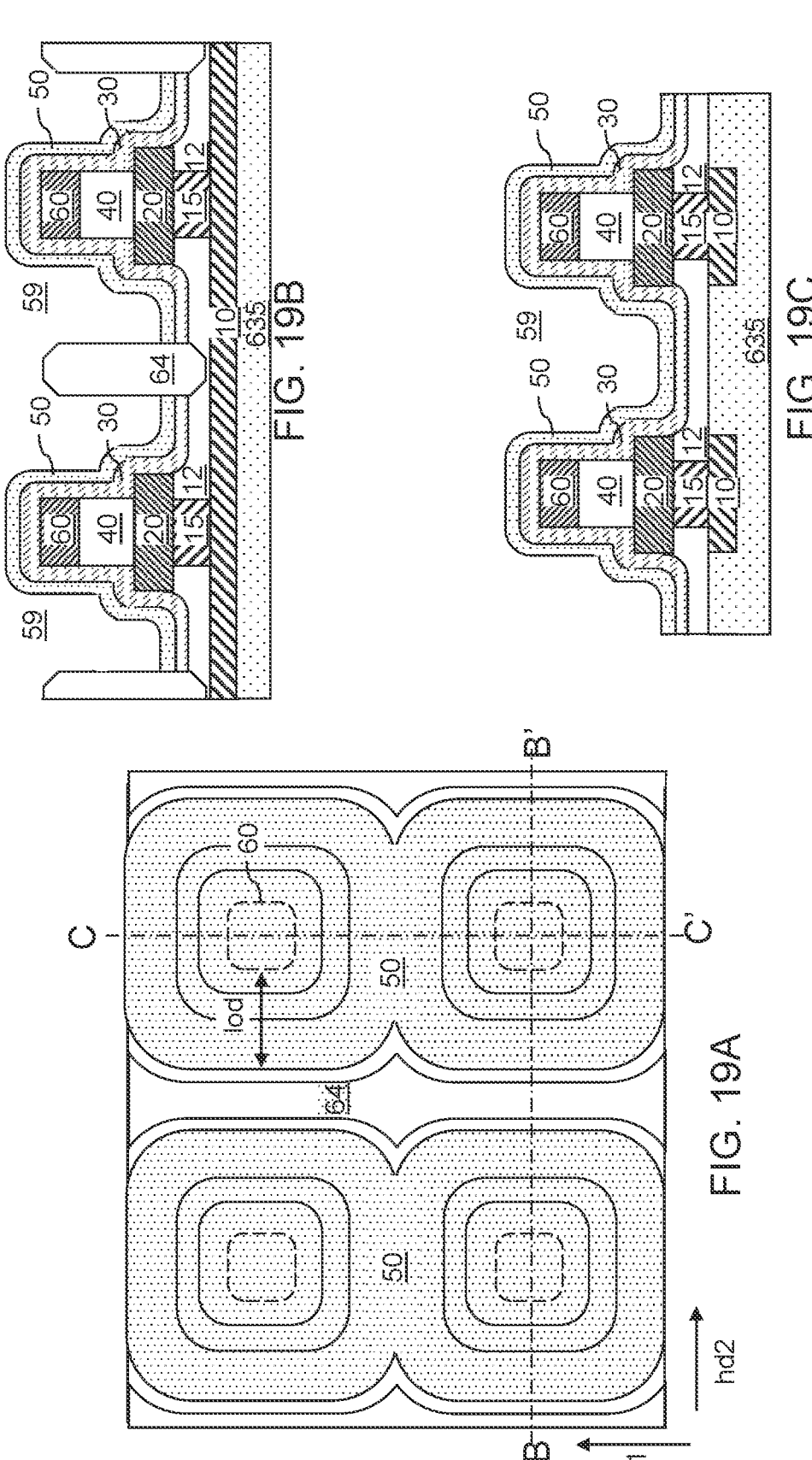
FIGS. 19A-19C are various views of a portion of a memory array region of a third alternative configuration of the first exemplary structure after formation of gate cavities according to the first embodiment of the present disclosure.

Referring to FIGS. 19A-19C, a third alternative configuration of the first exemplary structure may be derived from the first exemplary structure of FIGS. 11A-11C by using an etch process that removes top corner portions of the dielectric wall structures 64. For example, an isotropic etch process, such as a wet etch process, may be used to remove the sacrificial spacers 57, and physically exposed corners of the dielectric wall structures 64 may be removed during the isotropic etch process.

Figures 20A, 20B, 20C:
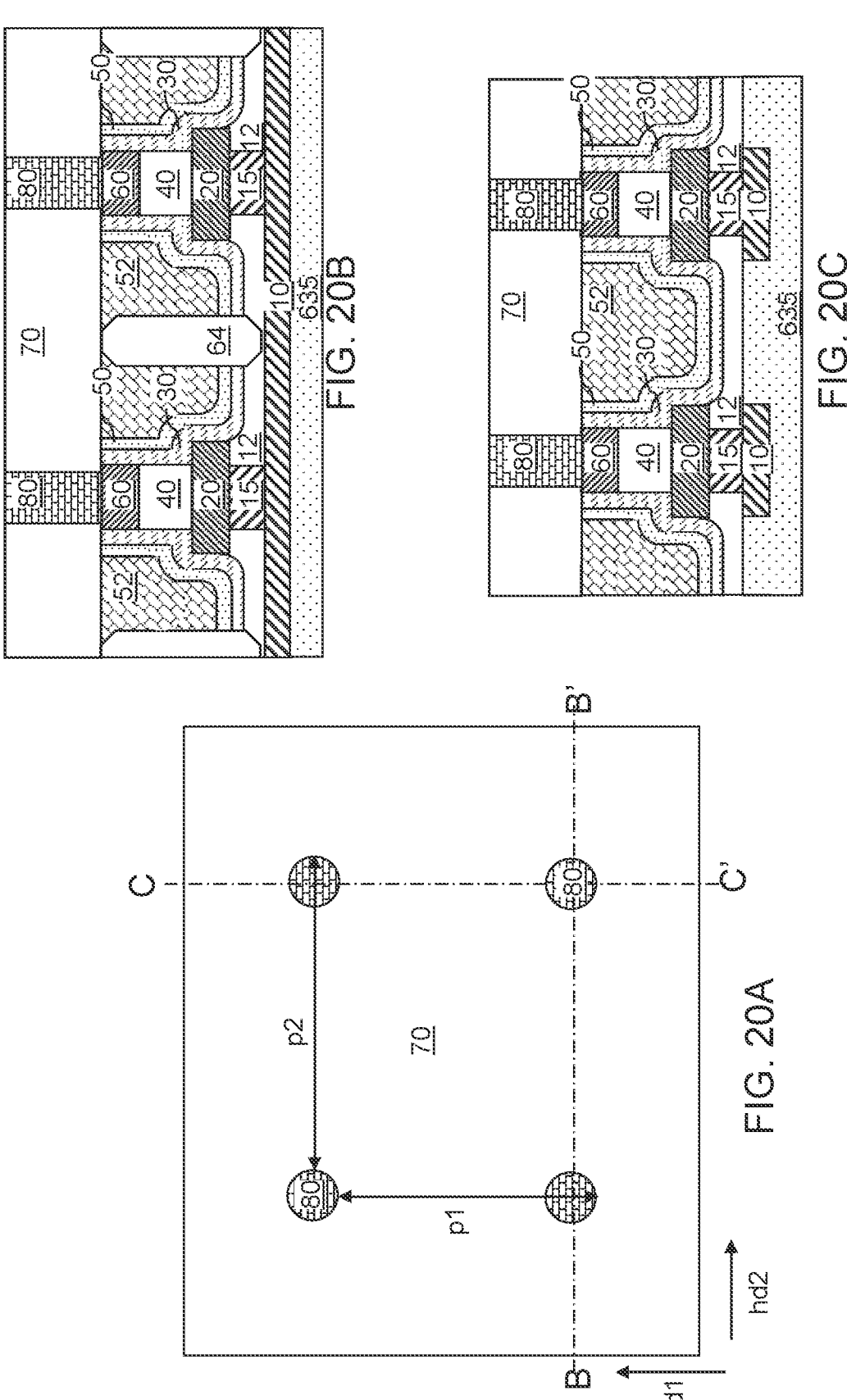
FIGS. 20A-20C are various views of a portion of a memory array region of the third alternative configuration of the first exemplary structure after formation of a contact-level dielectric layer and top contact via structures according to the first embodiment of the present disclosure.

Referring to FIGS. 20A-20C, the processing steps of FIGS. 12A-12C, 13A-13C, and 14A-14C may be performed to form gate electrodes 52, a contact-level dielectric layer 70, and top contact via structures 80. In the third alternative configuration of the first exemplary structure, sidewalls of the dielectric wall structures 64 may have tapered top segments.

Referring to FIG. 21, an exemplary structure is illustrated after formation of a two-dimensional array of vertical field effect transistors 900 over the insulating matrix layer 635. The exemplary structure may be derived from the first exemplary structure or alternative embodiments thereof. For example, various additional metal interconnect structures (632, 638) may be formed through the insulating matrix layer 635 and various dielectric material portions/layers 630 that are formed at the level of the vertical field effect transistors 900. Additional interconnect-level dielectric material layer and additional metal interconnect structures may be subsequently formed. For example, a fourth interconnect-level dielectric material layer 640 embedding fourth metal line structures 648 and third metal via structures 642 may be formed. While the present disclosure is described using an embodiment in which four levels of metal line structures are used, embodiments are expressly contemplated herein in which a lesser or greater number of interconnect levels are used.

Figures 22A, 22B, 22C:
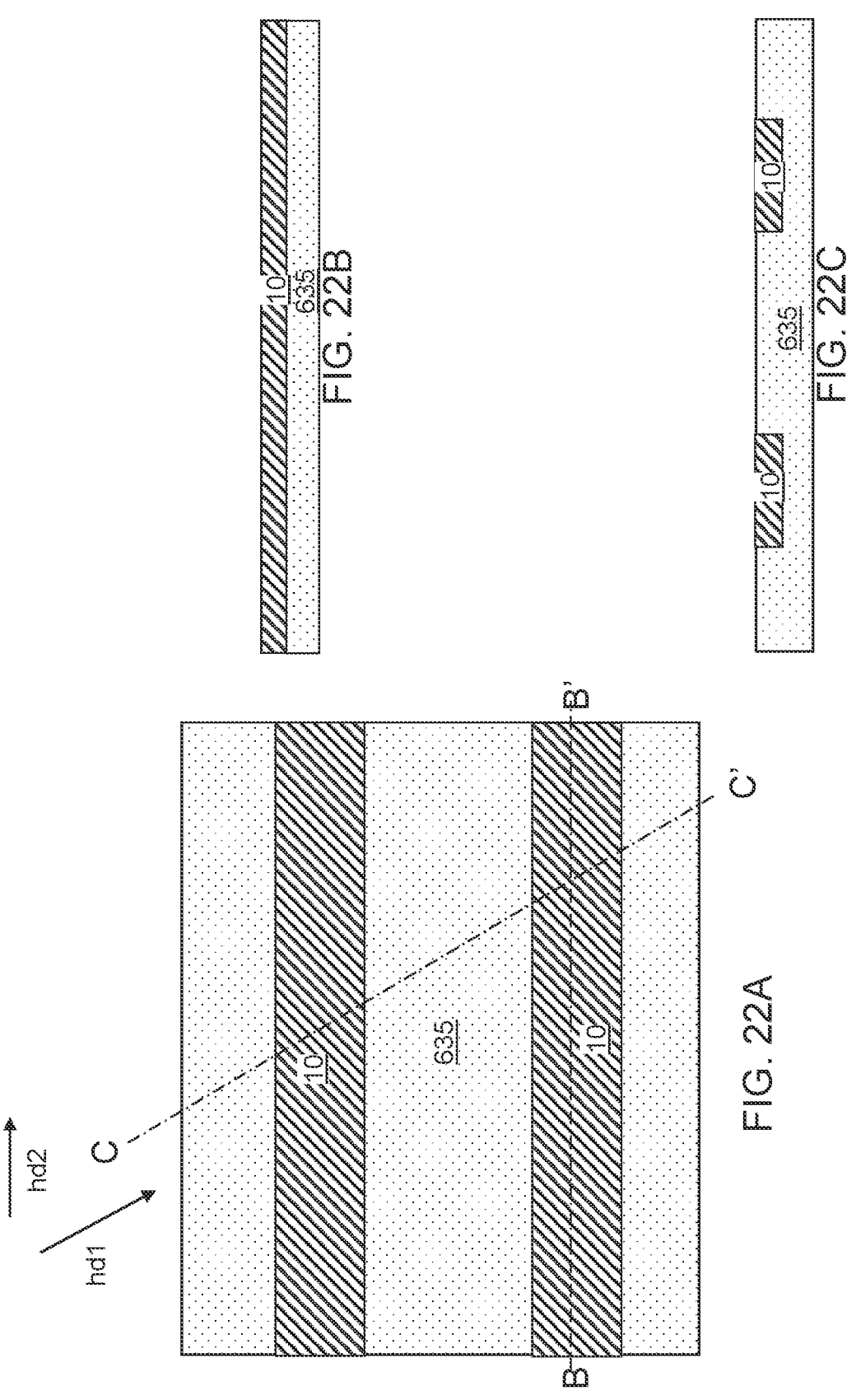
FIGS. 22A-22C are various views of a portion of a memory array region of a second exemplary structure after formation of bit lines in an insulating matrix layer according to a second embodiment of the present disclosure.

Referring to FIGS. 22A-22C, a second exemplary structure according to a second embodiment of the present disclosure is illustrated, which may be derived from the first exemplary structure illustrated in FIGS. 2A-2C. In the second exemplary structure, directions of periodicity of vertical field effect transistors to be subsequently formed include a first horizontal direction hd1 and a second horizontal direction hd2. The bit lines 10 may be parallel to the second horizontal direction hd2. The first horizontal direction hd1 may be at an oblique angle with respect to the second horizontal direction hd2. In one embodiment, the oblique angle may be in a range from 30 degrees to 75 degrees, such as from 40 degrees to 70 degrees. In one embodiment, the oblique angle may be 60 degrees.

Figures 23A, 23B, 23C:
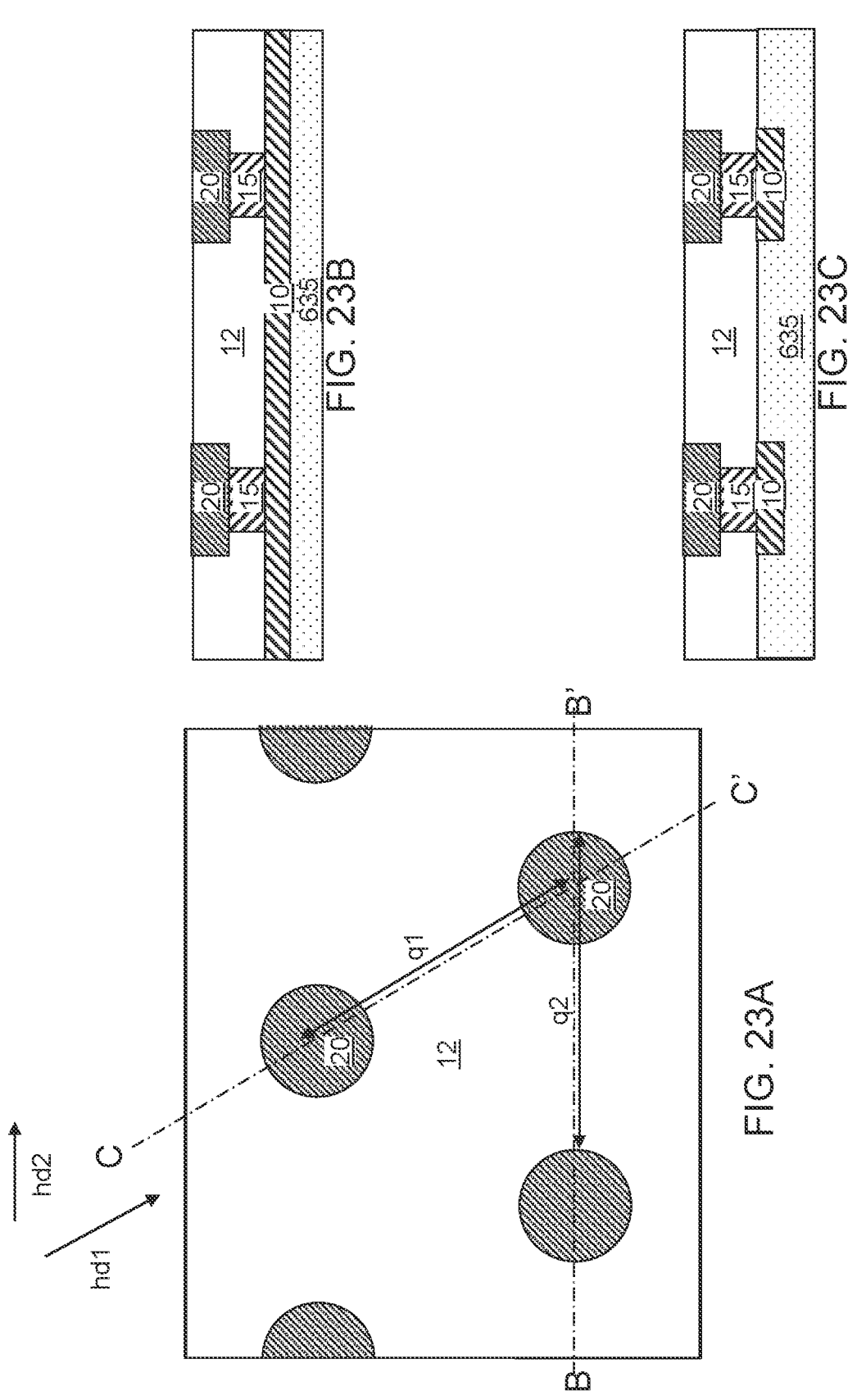
FIGS. 23A-23C are various views of a portion of a memory array region of the second exemplary structure after formation of bottom contact via structures and bottom electrodes according to the second embodiment of the present disclosure.

Referring to FIGS. 23A-23C, the processing steps of FIGS. 3A-3C may be performed to form bottom contact via structures 15 and bottom electrodes 20. In one embodiment, the bottom contact via structures 15 and the bottom electrode 20 may be formed as a respective two-dimensional periodic array of structures having a first periodicity, i.e., a first pitch q1, along the first horizontal direction hd1 and having a second periodicity, i.e., a second pitch q2, along the second horizontal direction hd2. The first pitch q1 may be in a range from 10 nm to 1,000 nm, although lesser and greater first pitches may also be used. The second pitch q2 may be in a range from 10 nm to 1,000 nm, although lesser and greater second pitches may also be used. The ratio of the first pitch q1 to the second pitch q2 may be in a range from 0.80 to 1.25, such as from 0.90 to 1.11. In one embodiment, the angle between the first horizontal direction hd1 and the second horizontal direction hd2 may be 60 degrees, and the first pitch q1 may be the same as the second pitch q2. In this embodiment, the bottom contact via structures 15 and the bottom electrode 20 may be formed as a respective two-dimensional hexagonal periodic array of structures.

Figures 24A, 24B, 24C:
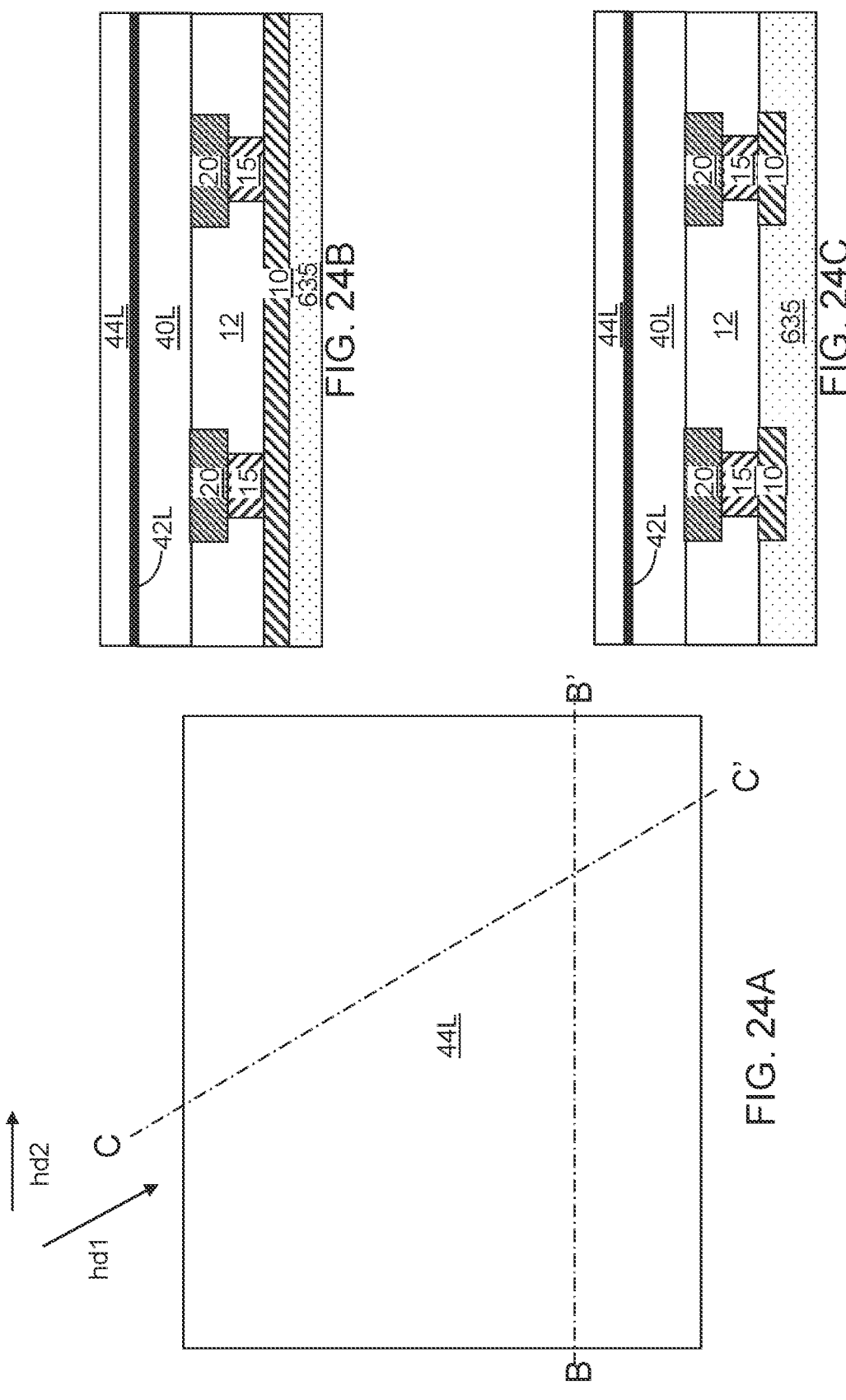
FIGS. 24A-24C are various views of a portion of a memory array region of the second exemplary structure after formation of a dielectric pillar material layer, a second etch stop layer, and an insulating matrix layer according to the second embodiment of the present disclosure.

Referring to FIGS. 24A-24C, the processing steps of FIGS. 4A-4C may be performed to form a layer stack including a dielectric pillar material layer 40L, a first etch stop layer 42L, and an insulating matrix layer 44L above the two-dimensional array of bottom electrodes 20.

Figures 25A, 25B, 25C:
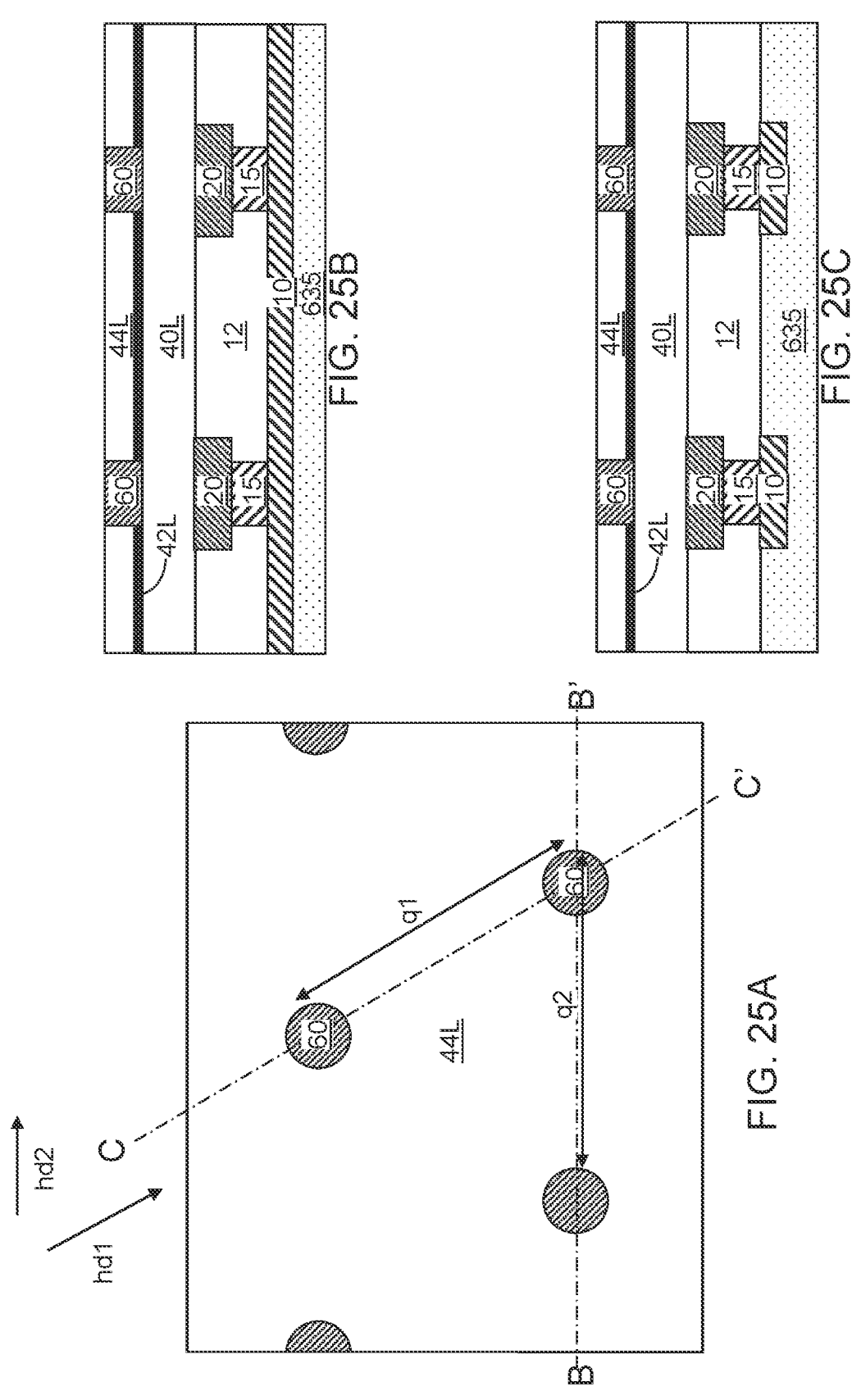
FIGS. 25A-25C are various views of a portion of a memory array region of the second exemplary structure after formation of top electrodes in the insulating matrix layer according to the second embodiment of the present disclosure.

Referring to FIGS. 25A-25C, the processing steps of FIGS. 5A-5C may be performed with a change in the lithographic pattern to form a two-dimensional array of top electrodes 60. In one embodiment, the top electrodes 60 may be formed as a two-dimensional periodic array of top electrodes 60 having the first periodicity, i.e., the first pitch q1, along the first horizontal direction hd1 and having the second periodicity, i.e., the second pitch q2, along the second horizontal direction hd2.

Referring to FIGS. 26A-26C, the processing steps of FIGS. 6A-6C may be performed to form a two-dimensional array of vertical stacks (20, 40, 60). Each of the vertical stacks (20, 40, 60) includes a bottom electrode 20, a dielectric pillar 40, and a top electrode 60.

Figures 27A, 27B, 27C:
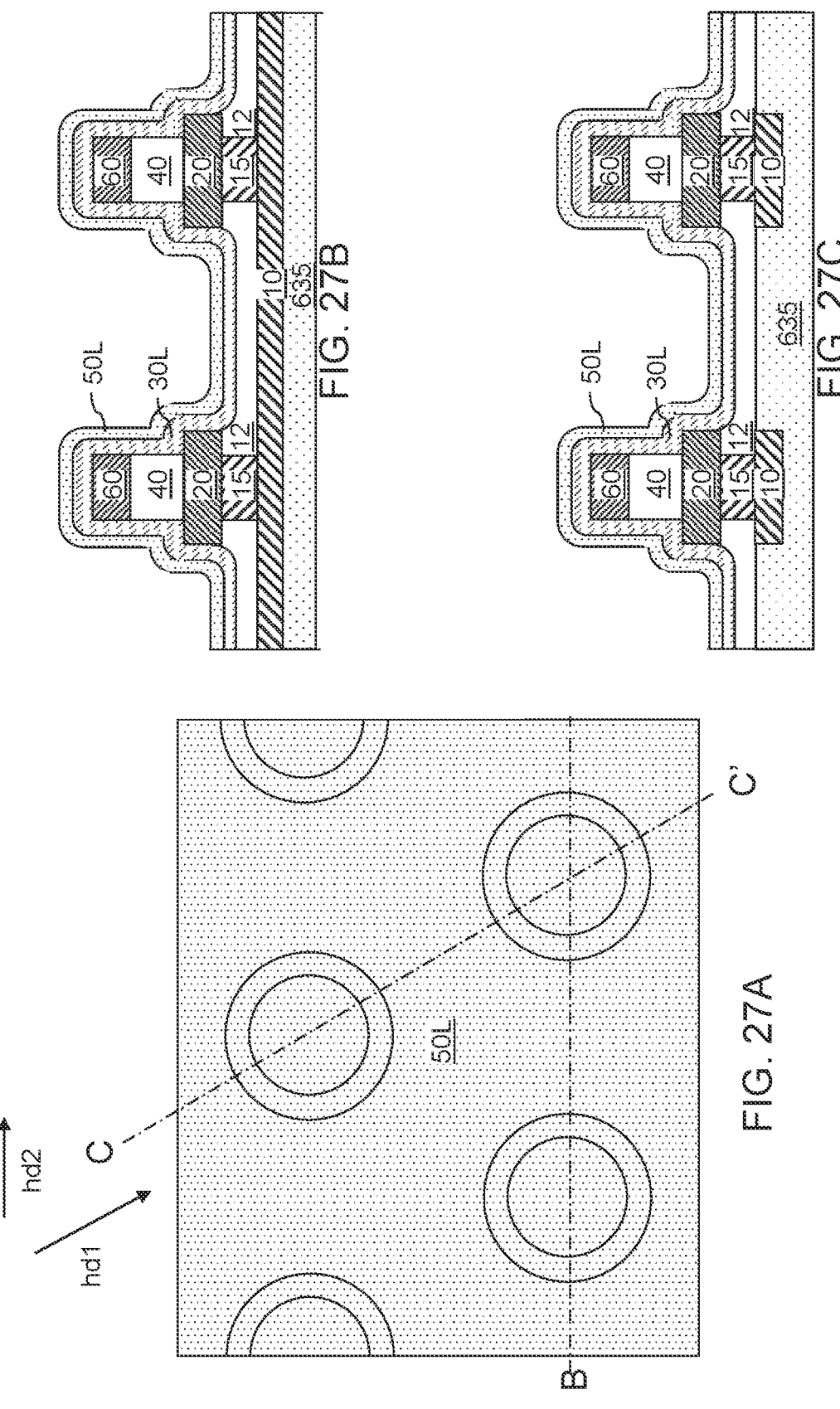
FIGS. 27A-27C are various views of a portion of a memory array region of the second exemplary structure after formation of a continuous active layer and a gate dielectric layer according to the second embodiment of the present disclosure.

Referring to FIGS. 27A-27C, the processing steps of FIGS. 7A-7C may be performed to form a continuous active layer 30L and a gate dielectric layer 50L.

Figures 28A, 28B, 28C:
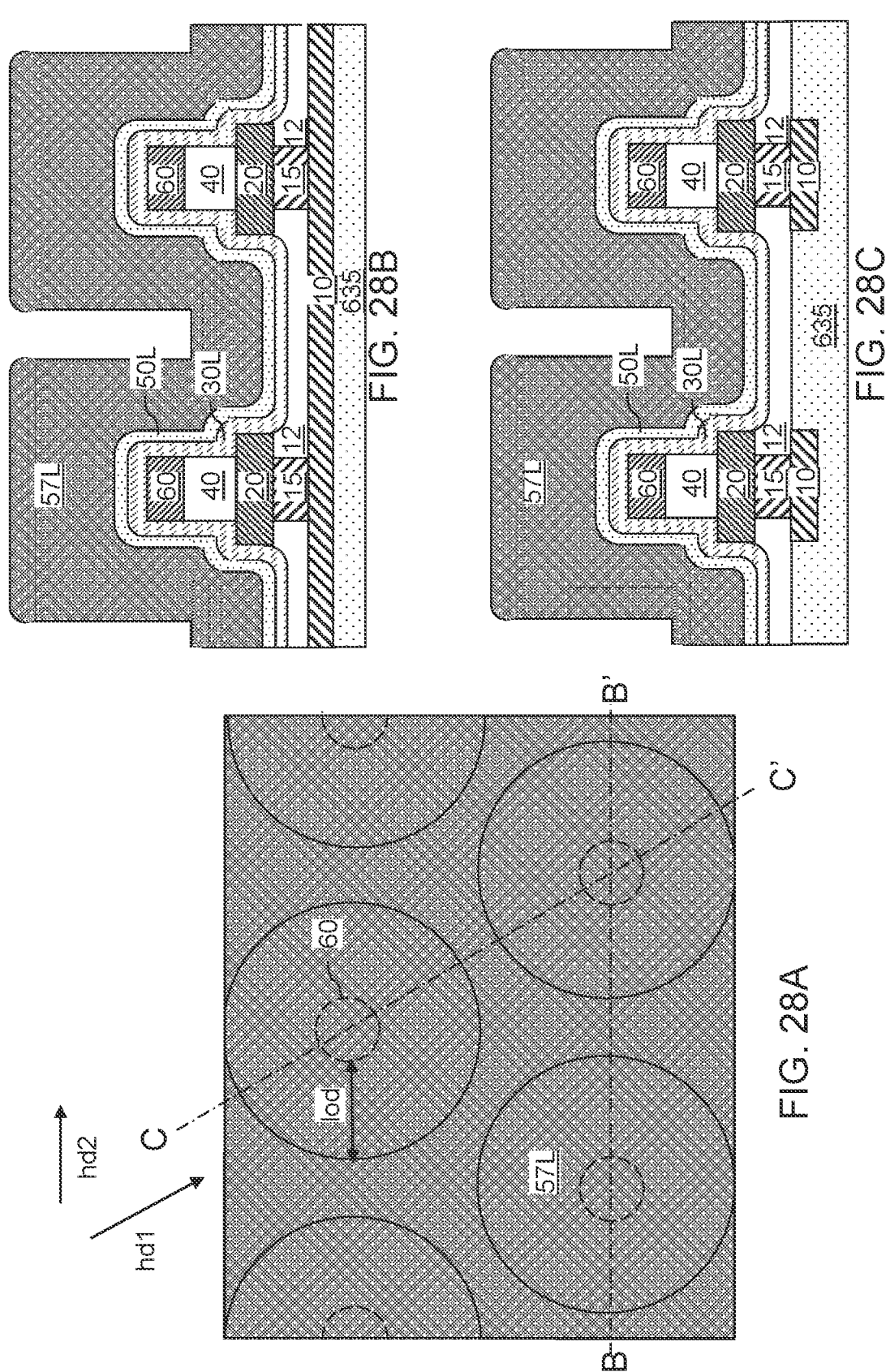
FIGS. 28A-28C are various views of a portion of a memory array region of the second exemplary structure after depositing a sacrificial spacer material layer according to the second embodiment of the present disclosure.

Referring to FIGS. 28A-28C, the processing steps of FIGS. 8A-8C may be performed to form a sacrificial spacer material layer 57L. The sacrificial spacer material layer 57L may comprise the same material as in the first embodiment, and may be deposited by a same deposition method as in the first embodiment. In one embodiment, the thickness of the portions of the sacrificial spacer material layer 57L overlying the vertical stacks (20, 40, 60) may be greater than the thickness of portions of the sacrificial spacer material layer 57L that is deposited over recessed portions of the insulating layer 12, and may be greater than the lateral thickness of vertically-extending portions of the sacrificial spacer material layer 57L that laterally surrounds a respective one of the vertical stacks (20, 40, 60).

The outer sidewalls of the vertically-extending portions of the sacrificial spacer material layer 57L are formed with the same lateral distance from a most proximal sidewall among the sidewalls of the stacks of top electrodes 60 and dielectric pillars 40. Vertically-extending portions of the sacrificial spacer material layer 57L laterally surround a respective one of the vertical stacks (20, 40, 60), and do not merge among one another.

Each vertically-extending sidewall of the sacrificial spacer material layer 57L may be equidistant from a most proximal sidewall among the sidewalls of the top electrodes 60. The lateral distance between each point in the vertically-extending sidewalls of the sacrificial spacer material layer 57L and a most proximal sidewall among sidewalls of the top electrodes 60 may be uniform, and is herein referred to as a lateral offset distance lod. The lateral offset distance lod is greater than the thickness of the continuous active layer 30L and the gate dielectric layer 50L. The difference between the lateral offset distance and the sum of the thicknesses of the continuous active layer 30L and the gate dielectric layer 50L may be in a range from 10 nm to 1,000 nm, such as from 30 nm to 300 nm, although lesser and greater differences may also be used. The difference between the lateral offset distance and the sum of the thicknesses of the continuous active layer 30L and the gate dielectric layer 50L is the lateral thickness of the vertically-extending portions of the sacrificial spacer material layer 57L. The minimum separation distance between neighboring pairs of vertically-extending sidewalls of the sacrificial spacer material layer 57L may be in a range from 1 nm to 1,000 nm, such as from 10 nm to 300 nm, although lesser and greater minimum separation distances may also be used.

Figures 29A, 29B, 29C:
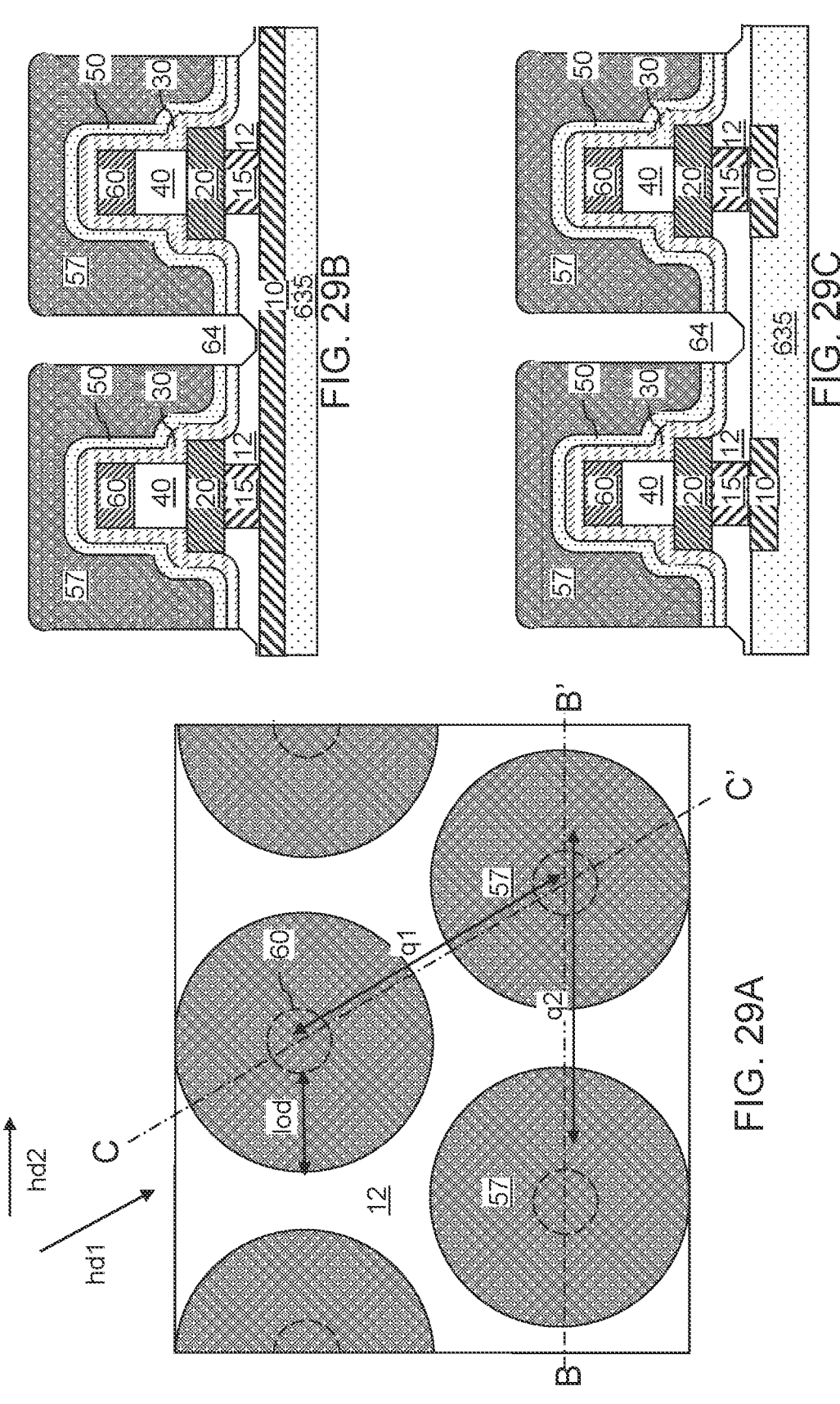
FIGS. 29A-29C are various views of a portion of a memory array region of the second exemplary structure after formation of sacrificial spacers according to the second embodiment of the present disclosure.

Referring to FIGS. 29A-29C, an anisotropic etch process may be performed to vertically recess horizontally-extending portions of the sacrificial spacer material layer 57L. Horizontally-extending portions of the sacrificial spacer material layer 57L may be removed underneath each gap between vertically-extending sidewalls of the sacrificial spacer material layer 57L. The sacrificial spacer material layer 57L may be divided into a plurality of sacrificial spacers 57 that forms a two-dimensional periodic array. The sacrificial spacers 57 may be arranged with the first periodicity, i.e., the first pitch q1, along the first horizontal direction hd1, and with the second periodicity, i.e., the second pitch q2, along the second horizontal direction hd2.

In one embodiment, the thickness of horizontally-extending portions of the sacrificial spacer material layer 57L overlying the top electrodes 60 may be greater than the thickness of horizontally-extending portions of the sacrificial spacer material layer 57L overlying the recessed surface of the insulating layer 12. In this embodiment, each sacrificial spacer 57 may comprise a thin horizontally-extending portion that overlies a respective top electrode 60.

Additional anisotropic etch processes may be performed to etch unmasked portions of the gate dielectric layer 50L and the continuous active layer 30L, i.e., portions of the gate dielectric layer 50L and the continuous active layer 30L that are not masked by the sacrificial spacers 57. The gate dielectric layer 50L is divided into a two-dimensional array of gate dielectrics 50. The continuous active layer 30L is divided into a two-dimensional array of active layers 30.

In one embodiment, the two-dimensional array of gate dielectrics 50 may comprise a two-dimensional periodic array of gate dielectrics 50 having the first periodicity, i.e., the first pitch q1, along the first horizontal direction hd1, and having the second periodicity, i.e., the second pitch q2, along the second horizontal direction hd2. In one embodiment, the two-dimensional array of active layers 30 may comprise a two-dimensional periodic array of active layers 30 having the first periodicity, i.e., the first pitch q1, along the first horizontal direction hd1, and having the second periodicity, i.e., the second pitch q2, along the second horizontal direction hd2. In one embodiment, the periphery of each gate dielectric 50 may be located within a vertical plane that is laterally offset from a vertical plane including sidewalls of a most proximal one among the top electrodes 60 by a uniform lateral distance, which is the lateral offset distance lod. In one embodiment, the periphery of each active layer 30 may be located within a vertical plane that is laterally offset from a vertical plane including sidewalls of a most proximal one among the top electrodes 60 by a uniform lateral distance, which is the lateral offset distance lod.

Each of the sacrificial spacers 57 laterally surrounds a respective top electrode 60. Each of the sacrificial spacers 57 does not directly contact any other sacrificial spacer 57 among the sacrificial spacers 57. Active layers 30 comprising a semiconducting metal oxide material extend over sidewalls of a respective one of vertical stacks (20, 40, 60). Each of the active layers 30 contacts a top surfaces of a bottom electrode 20 that are arranged along the first horizontal direction hd1. Each of the active layers 30 contacts peripheral portions of top surfaces of a top electrode 60. Each of the active layers 30 comprises a horizontally-extending portion overlying a recessed surface of the insulating layer 12, and a tubular portions laterally surrounding, and contacting, a vertical stack (20, 40, 60).

Figures 30A, 30B, 30C:
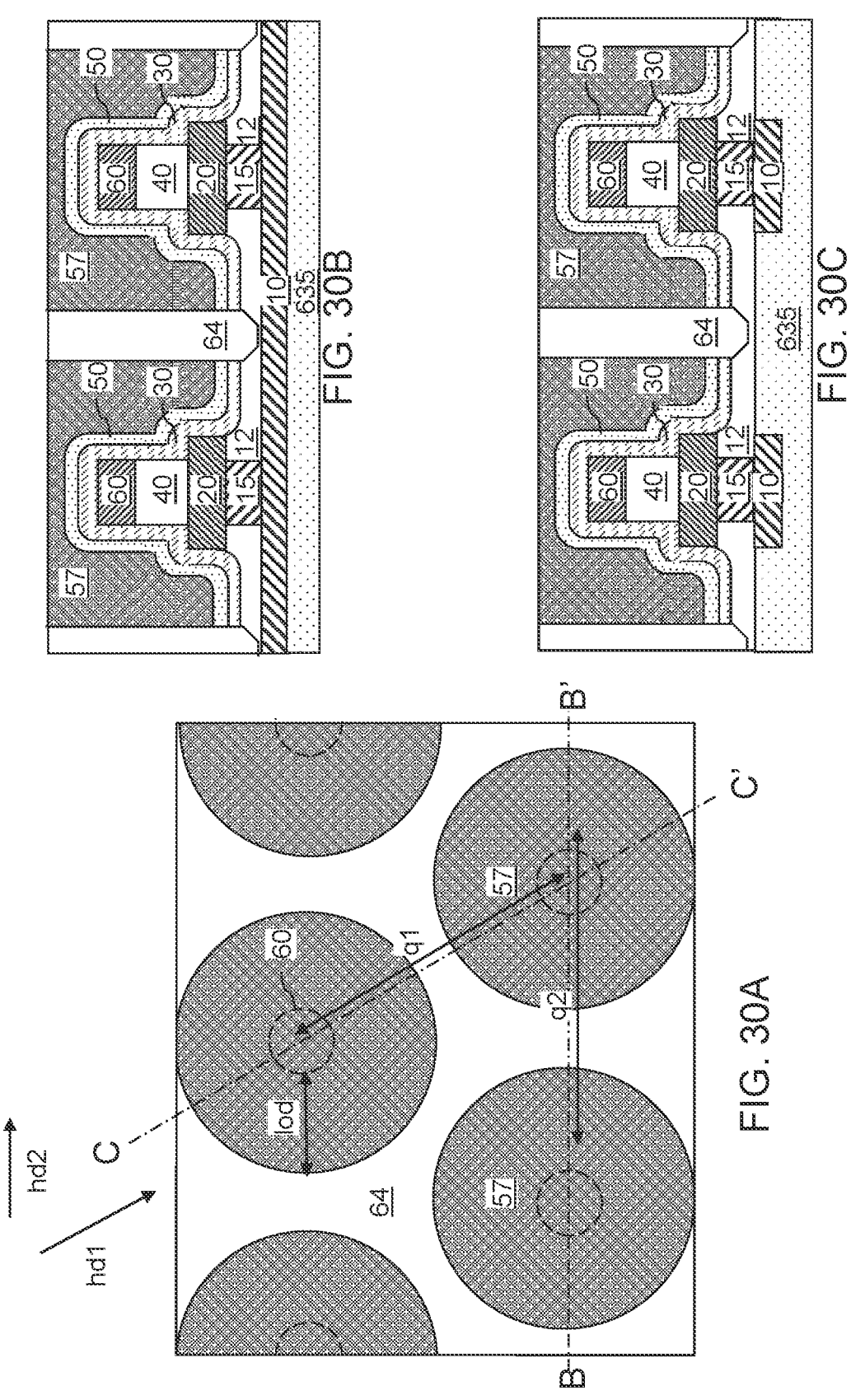
FIGS. 30A-30C are various views of a portion of a memory array region of the second exemplary structure after formation of a dielectric wall structure according to the second embodiment of the present disclosure.

Referring to FIGS. 30A-30C, the processing steps of FIGS. 10A-10C may be performed to deposit a dielectric fill material that is different from the material of the sacrificial spacers 57 in the gaps between the sacrificial spacers 57. The dielectric fill material may be the same as in the first embodiment. Excess portions of the dielectric fill material may be removed from above the horizontal plane including the top surface of the sacrificial spacers 57 by a planarization process such as a chemical mechanical polishing (CMP) process and/or a recess etch process. Remaining portions of the dielectric fill material that fill the gaps constitute a dielectric wall structure 64. In one embodiment, top surfaces of the dielectric wall structure 64 may be coplanar with the top surfaces of the sacrificial spacers 57.

Generally, the dielectric wall structure 64 may be formed around the sacrificial spacers 57 by filling gaps between neighboring pairs of the sacrificial spacers 57 with a dielectric fill material. The dielectric wall structure 64 may be formed as a single contiguous structure that laterally surrounds each of the sacrificial spacers 57.

Figures 31A, 31B, 31C:
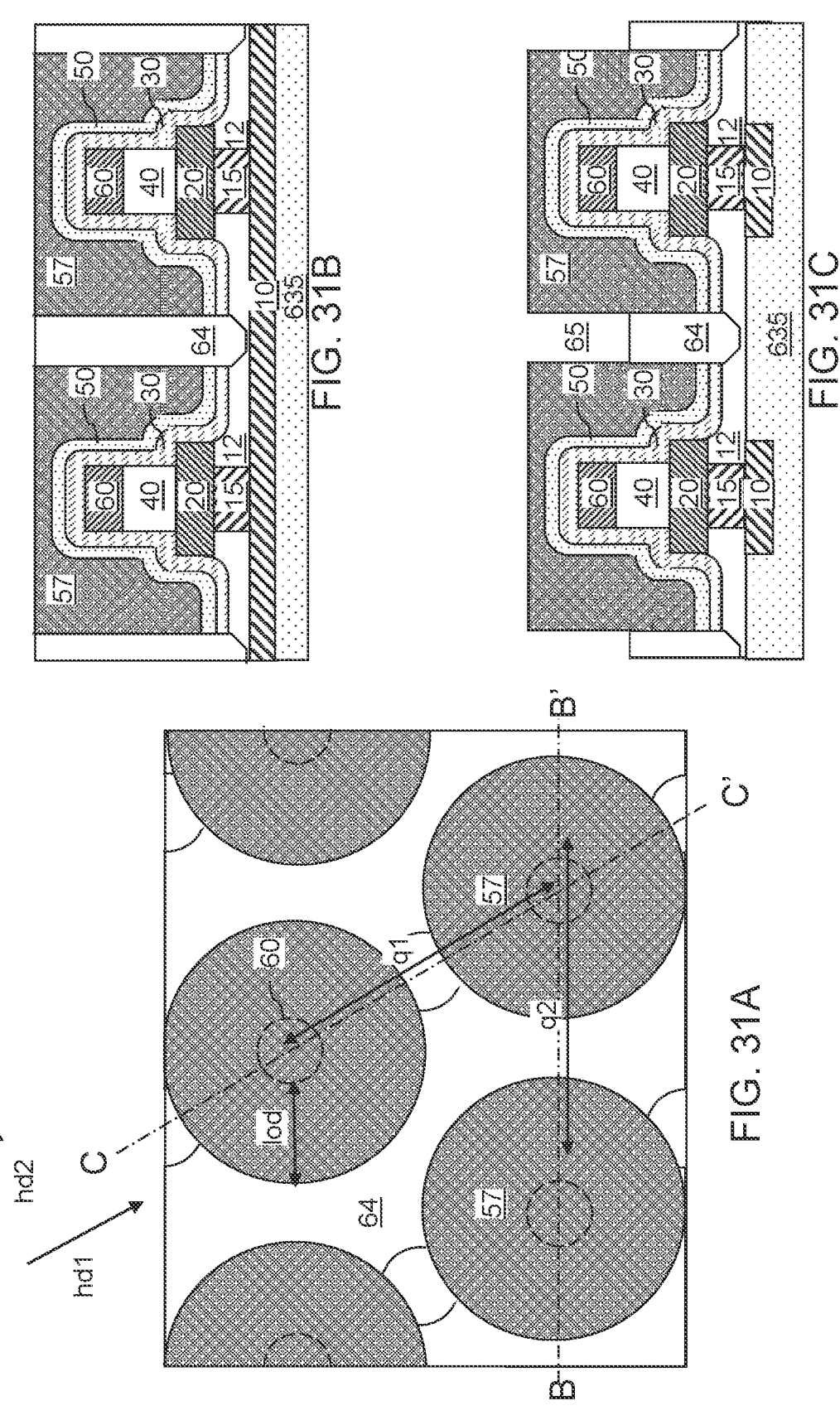
FIGS. 31A-31C are various views of a portion of a memory array region of the second exemplary structure after formation of an array of recess regions according to the second embodiment of the present disclosure.

Referring to FIGS. 31A-31C, a photoresist layer (not shown) may be applied over the dielectric wall structure 64 and the two-dimensional array of sacrificial spacers 57, and may be lithographically patterned to form a two-dimensional array of openings therethrough. The openings in the photoresist layer may be formed such that the openings are formed over portions of the dielectric wall structure 64 located between neighboring pairs of sacrificial spacers 57 that are laterally spaced apart along the first horizontal direction hd1.

An anisotropic etch process may be performed to etch upper portions of the dielectric wall structure 64 that are not masked by the photoresist layer. An array of recess regions 65 may be formed in the cavities formed by removal of the dielectric fill material of the dielectric wall structure 64. The array of recess regions 65 may be formed in upper portions of the dielectric wall structure 64 within areas located between neighboring pairs of sacrificial spacers 57 within each row of sacrificial spacers 57 that are arranged along the first horizontal direction hd1. The ratio of the depth of the recess regions 65 to the height of portions of the dielectric wall structure 64 that underlies the recess regions 65 may be in a range from 0.1 to 10, such as from 0.33 to 3.0 and/or from 0.5 to 2.0, such as 1.0. In one embodiment, the bottom surfaces of the recess regions 65 may be located above the horizontal plane including the top surfaces of the bottom electrodes 20 and below the horizontal plane including the bottom surfaces of the top electrodes 60.

Figures 32A, 32B, 32C:
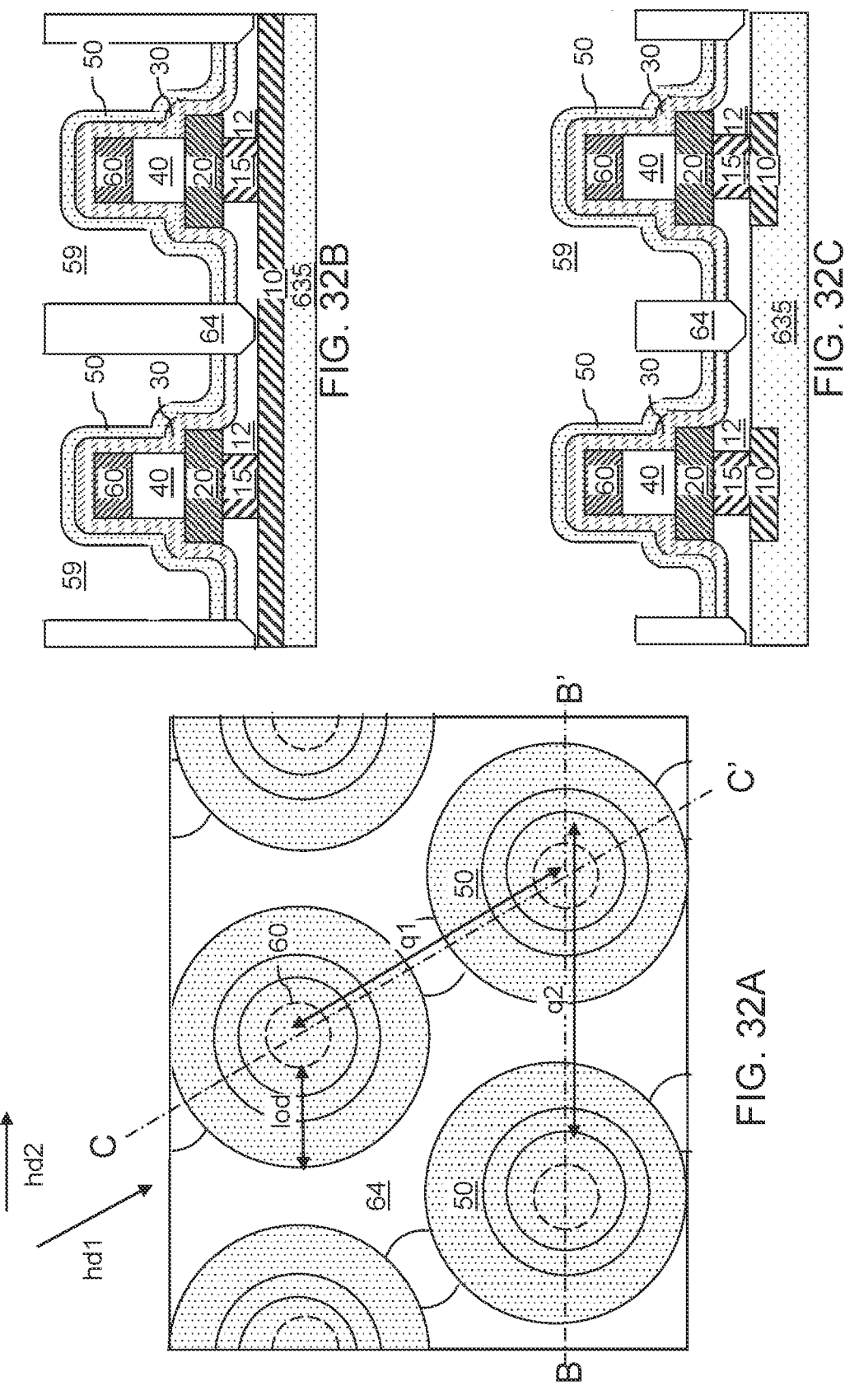
FIGS. 32A-32C are various views of a portion of a memory array region of the second exemplary structure after formation of gate cavities according to the second embodiment of the present disclosure.

Referring to FIGS. 32A-32C, the processing steps of FIGS. 11A-11C may be performed. Specifically, a selective removal process may be performed to remove the material of the sacrificial spacers 57 selective to the materials of the gate dielectrics 50 and the dielectric wall structure 64. The selective removal process may comprise an etch process such as an isotropic etch process. Gate cavities 59 are formed in volumes from which the sacrificial spacers 57 are removed. Each gate cavity 59 laterally extends along the first horizontal direction hd1, and laterally surrounds a respective row of vertical stacks (20, 40, 60).

Figures 33A, 33B, 33C:
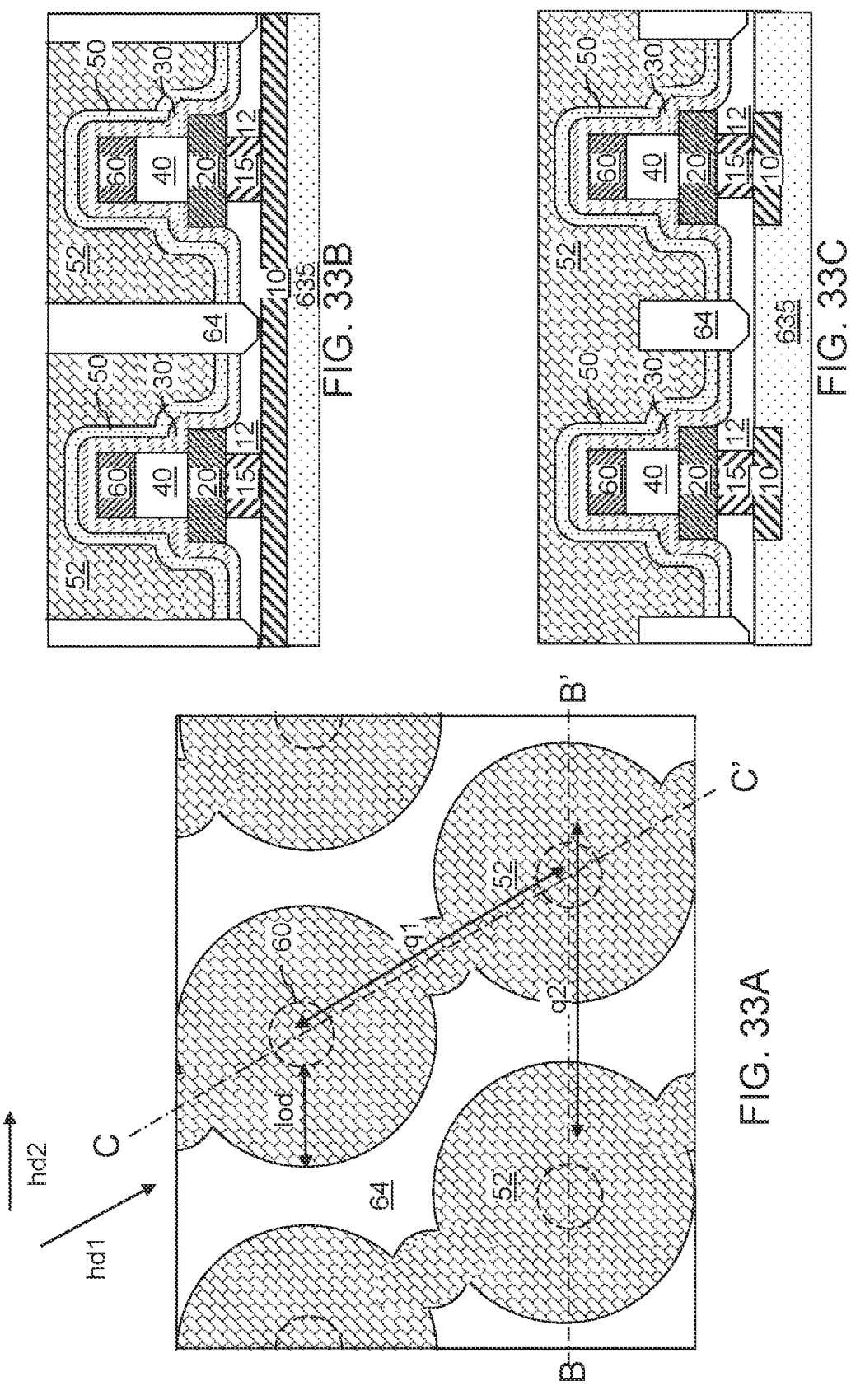
FIGS. 33A-33C are various views of a portion of a memory array region of the second exemplary structure after formation of gate electrodes according to the second embodiment of the present disclosure.

Referring to FIGS. 33A-33C, the processing steps of FIGS. 12A-12C may be performed. Specifically, at least one metallic fill material may be deposited in the gate cavities 59 and planarized to form gate electrodes 52. The gate electrodes 52 laterally surround, and overlie, a respective row of the gate dielectrics 50 that are arranged along the first horizontal direction hd1. The gate electrodes 52 laterally extend along the first horizontal direction hd1, and are laterally spaced apart long the second horizontal direction hd2. Each gate electrode 52 laterally surrounds a respective row of vertical stacks (20, 40, 60) of a bottom electrode 20, a dielectric pillar 40, and a top electrode 60. Each vertically-extending portion of an active layer 30 comprises a channel region of a thin film transistor, and is laterally surrounded by a respective gate electrode 52. Thus, the gate electrodes 52 of the present disclosure provide a gate-all-around configuration for each vertical thin film transistor.

Connection portions of the gate electrodes 52 are formed within the array of recess regions that are formed in the processing steps of FIGS. 31A-31C. The connection portions electrically connect cylindrical portions of the gate electrodes 52 that laterally surround a respective vertical stack (20, 40, 60).

The second exemplary structure comprises a two-dimensional array of vertical stacks (20, 40, 60) located over a substrate 8, wherein each of the two-dimensional array of vertical stacks (20, 40, 60) includes, from bottom to top, a bottom electrode 20, a dielectric pillar 40, and a top electrode 60; active layers 30 comprising a semiconducting metal oxide material and extending over sidewalls of a respective one of vertical stacks (20, 40, 60); gate stacks (50, 52) overlying a respective row of the active layers 30, wherein each of the gate stacks (50, 52) comprises a row of gate dielectrics 50 arranged along the first horizontal direction hd1 and a gate electrode 52; and a dielectric wall structure 64 laterally surrounding each of the gate stacks (50, 52) and providing electrical isolation between each adjacent pair of gate electrodes 52 among the gate electrodes 52, wherein each sidewall of the dielectric wall structure 64 comprises vertically straight and laterally concave surface segments that are equidistant from a most proximal sidewall among sidewalls of a respective row of top electrodes 60 that are arranged along the first horizontal direction hd1.

In one embodiment, the dielectric wall structure 64 comprises recess regions through which connection portions of the gate electrodes 52 laterally extend along the first horizontal direction hd1. In one embodiment, top surfaces of the connection portions of the gate electrodes 52 are located within a same horizontal plane as top surfaces of the dielectric wall structure 64; and the dielectric wall structure 64 vertically extends from a first horizontal plane including top surfaces of the gate electrodes 52 at least to a second horizontal plane including bottom surfaces of the bottom electrodes 20 in each area of the dielectric wall structure 64 located outside areas of the connection portions of the gate electrodes 52.

In one embodiment, the vertically straight and laterally concave surface segments of the dielectric wall structure 64 are laterally offset from sidewalls of a respective most proximal one of the top electrodes 60 by the uniform lateral offset distance lod; and interfaces between the dielectric wall structure 64 and the connection portions of the gate electrodes 52 are laterally offset from a respective most proximal one of the top electrodes 60 by a lateral distance that is greater than the uniform lateral offset distance lod.

In one embodiment, the top electrodes 60 are arranged in a two-dimensional periodic array having a first periodicity, i.e., a first pitch q1, along the first horizontal direction hd1 and having a second periodicity, i.e., a second pitch q2, along the second horizontal direction hd2; and an angle between the first horizontal direction hd1 and the second horizontal direction hd2 is in a range from 30 degrees to 75 degrees.

In one embodiment, each of the active layers 30 comprises a horizontally-extending portion and a tubular portions laterally surrounding, and contacting, a respective vertical stack (20, 40, 60) among the vertical stacks (20, 40, 60).

In one embodiment, the dielectric wall structure 64 comprises recess regions through which connection portions of the gate electrodes 52 laterally extend along the first horizontal direction hd1.

Figures 34A, 34B, 34C:
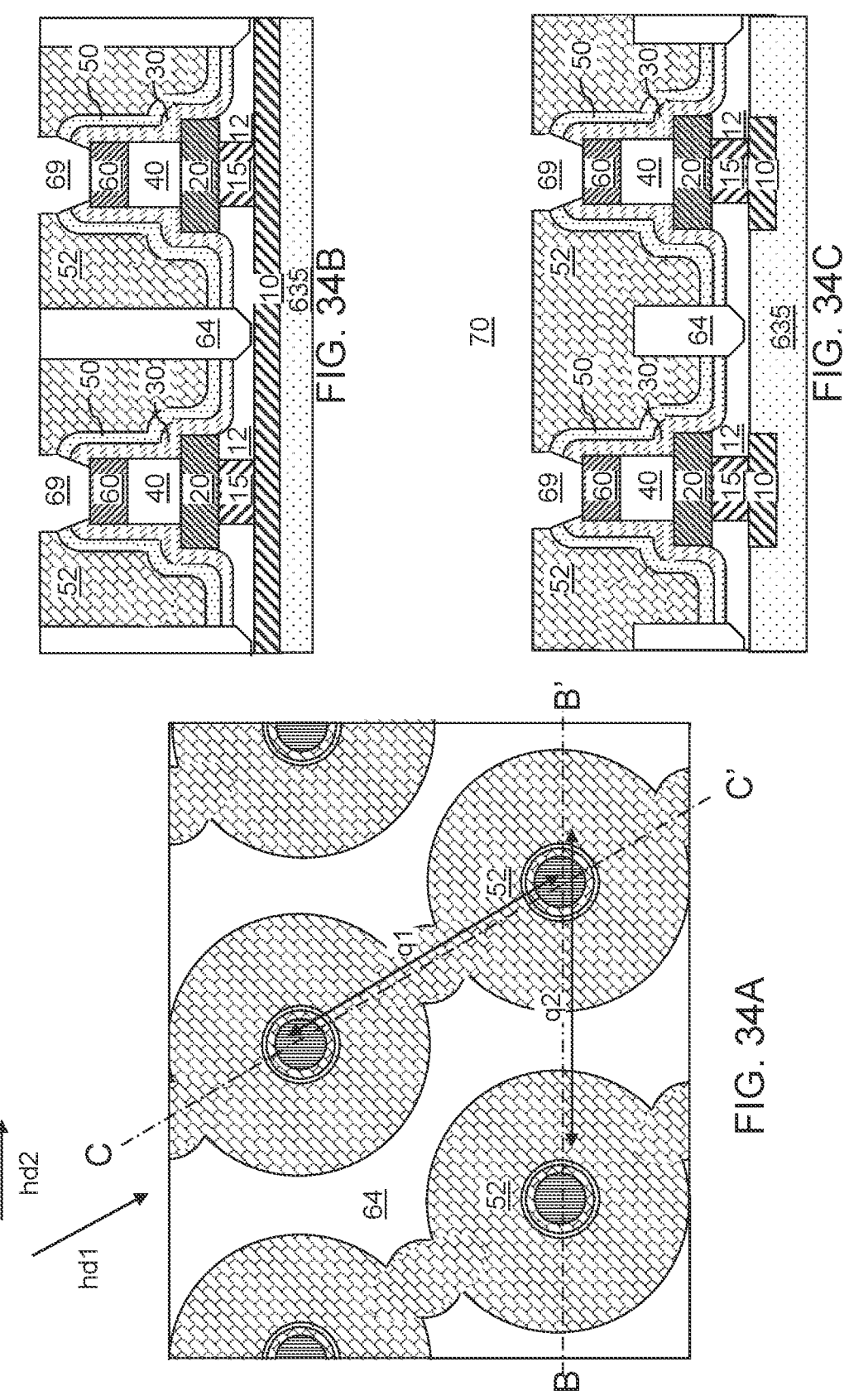
FIGS. 34A-34C are various views of a portion of a memory array region of the second exemplary structure after formation of contact recesses according to the second embodiment of the present disclosure.

Referring to FIGS. 34A-34C, the processing steps of FIGS. 13A-13C may be performed with changes in the lithographic pattern in the photoresist layer to form contact recesses 69. The contact recesses 69 are formed within volumes from which the materials of the gate electrodes 52, the gate dielectrics 50, and the active layers 30 are removed. A top surface of a top electrode 60 is physically exposed at the bottom of each contact recess 69.

Figures 35A, 35B, 35C:
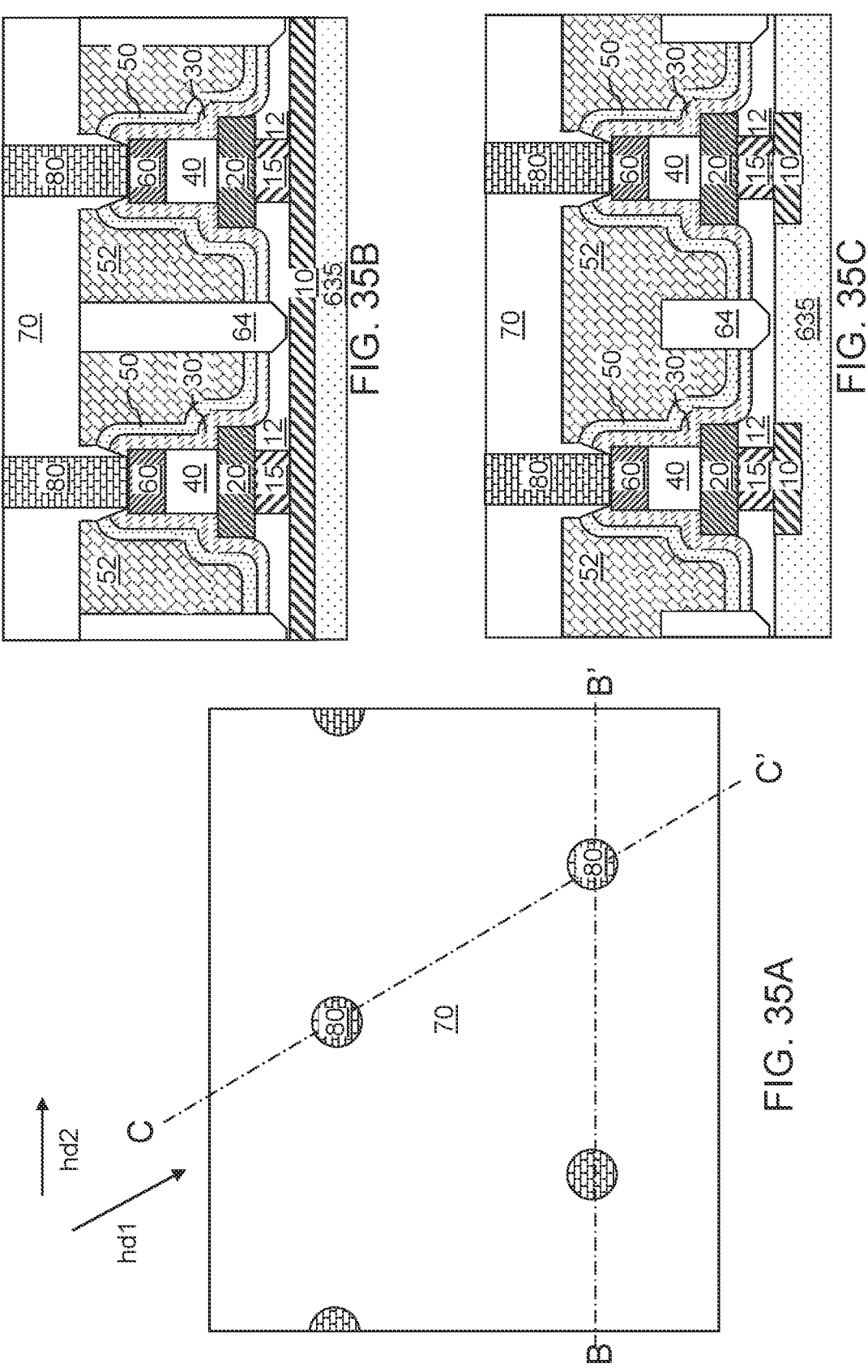
FIGS. 35A-35C are various views of a portion of a memory array region of the second exemplary structure after formation of a contact-level dielectric layer and top contact via structures according to the second embodiment of the present disclosure.

Referring to FIGS. 35A-35C, the processing steps of FIGS. 14A-14C may be performed to form a contact-level dielectric layer 70 and an array of top contact via structure 80. The top contact via structures 80 may have the same two-dimensional periodicity as the two-dimensional array of top electrodes 60.

Subsequently, the processing steps of FIG. 21 may be performed.

Figures 36A, 36B, 36C:
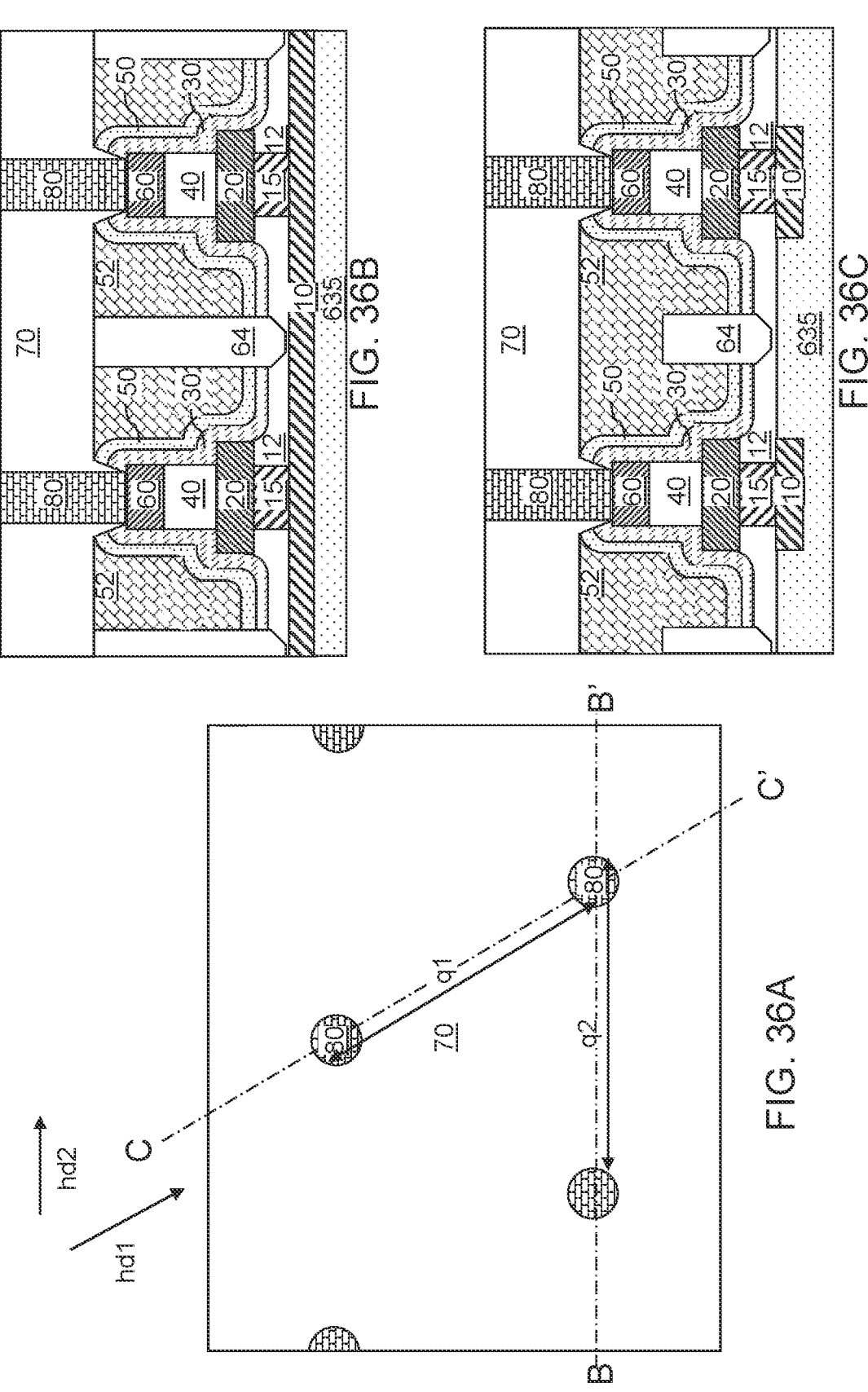
FIGS. 36A-36C are various views of a portion of a memory array region of a first alternative configuration of the second exemplary structure after formation of a contact-level dielectric layer and top contact via structures according to the second embodiment of the present disclosure.

Referring to FIGS. 36A-36C, a first alternative configuration of the second exemplary structure may be derived from the second exemplary structure by removing the horizontally-extending portions of the sacrificial spacer material layer 57L from above the topmost surfaces of the gate dielectrics 50 during an anisotropic etch process that forms the sacrificial spacers 57, or during the planarization process that removes the dielectric fill material of the dielectric wall structures 64 from above the horizontal plane including the topmost surfaces of the gate dielectrics 50. Top surfaces of the dielectric wall structures 64 may be located within a horizontal plane including topmost surfaces of the gate dielectrics 50, and may be located above the horizontal plane including top surfaces of the top electrodes 60.

Figures 37A, 37B, 37C:
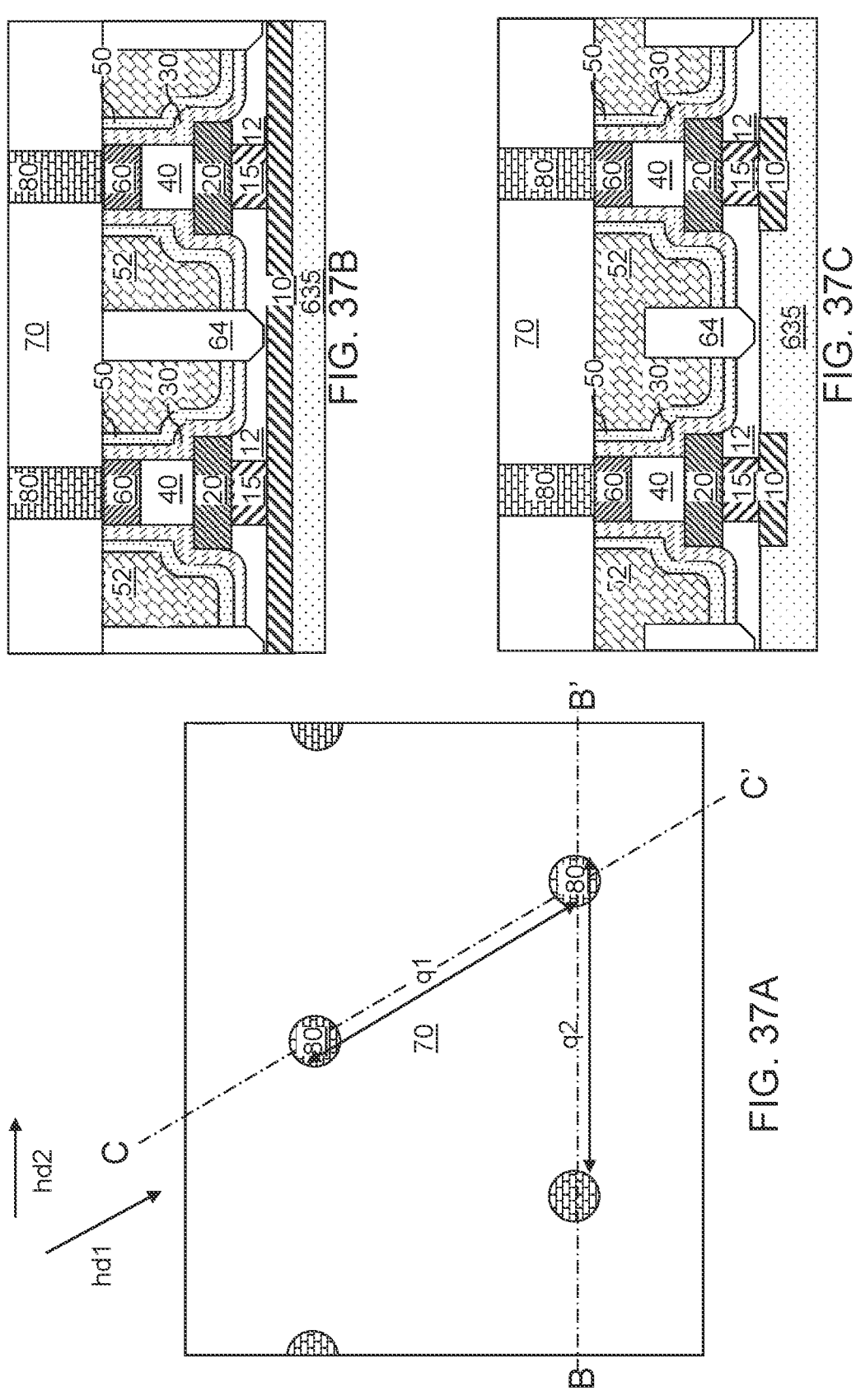
FIGS. 37A-37C are various views of a portion of a memory array region of a second alternative configuration of the second exemplary structure after formation of a contact-level dielectric layer and top contact via structures according to the second embodiment of the present disclosure.
Figures 38A, 38B, 38C:
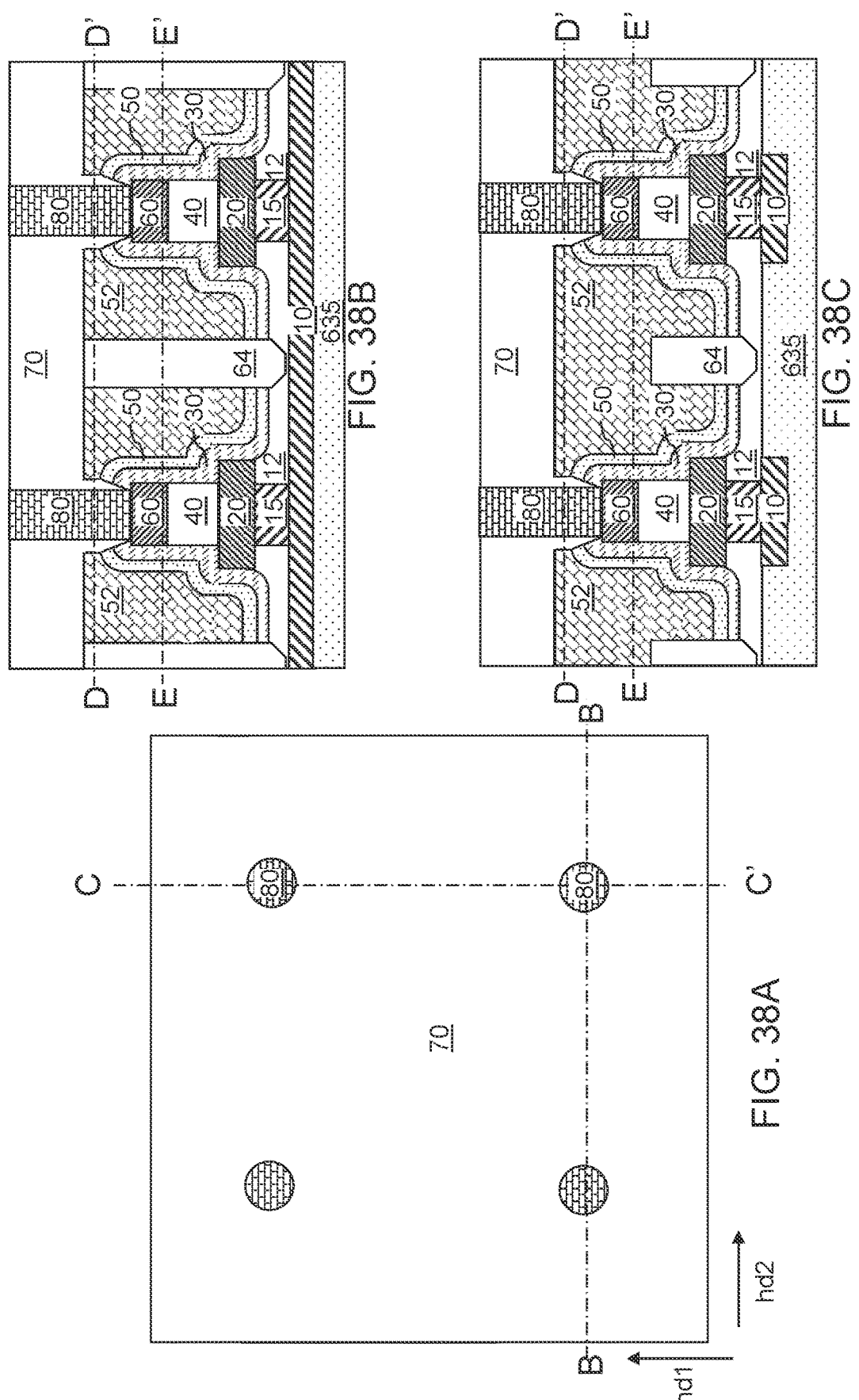
FIGS. 38A-38D are various views of a portion of a memory array region of a third alternative configuration of the second exemplary structure after formation of a contact-level dielectric layer and top contact via structures according to the second embodiment of the present disclosure.
Figure 38D:
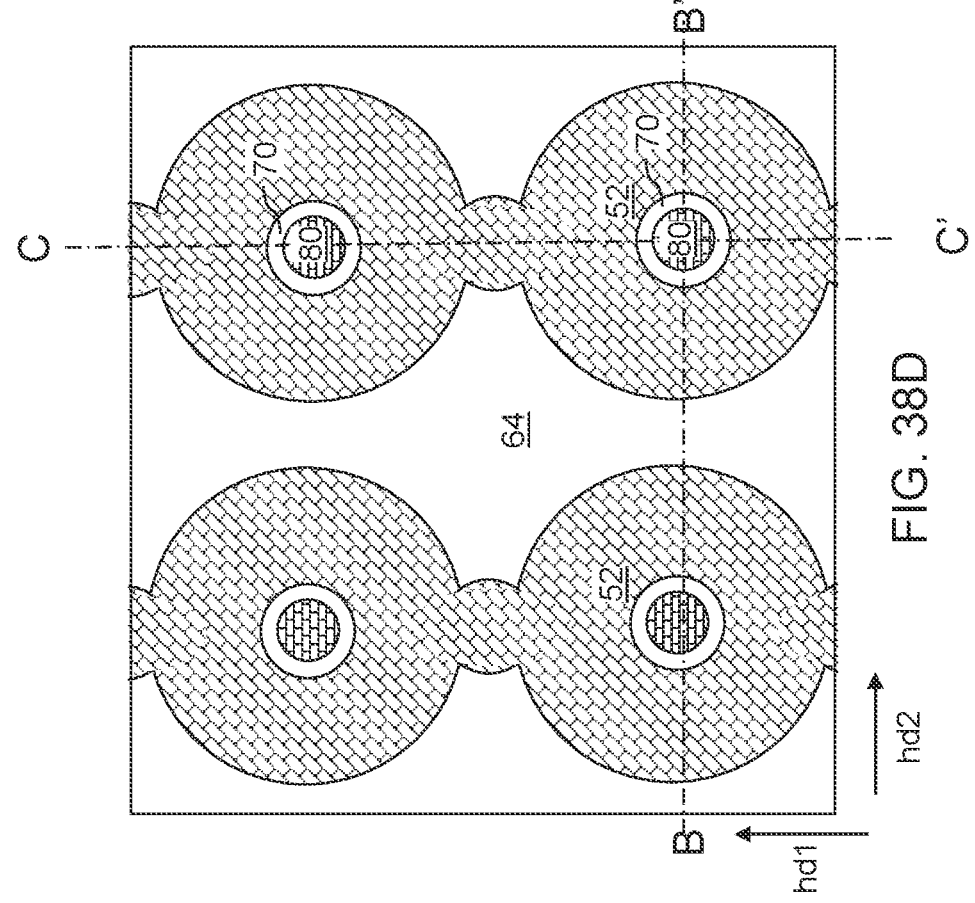
Figure 38E:
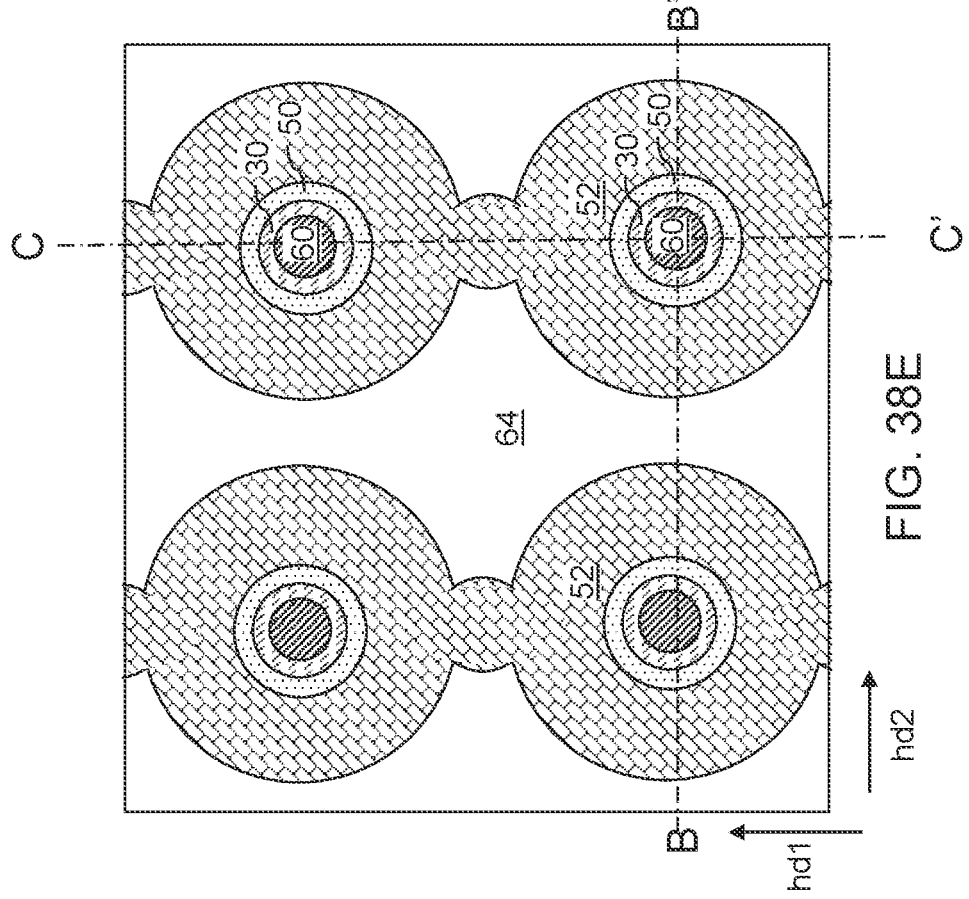
FIG. 38E is a horizontal cross-sectional view of the third alternative configuration of the second exemplary structure along the horizontal plane E-E' of FIGS. 38B and 38C.
Figures 39A, 39B, 39C:
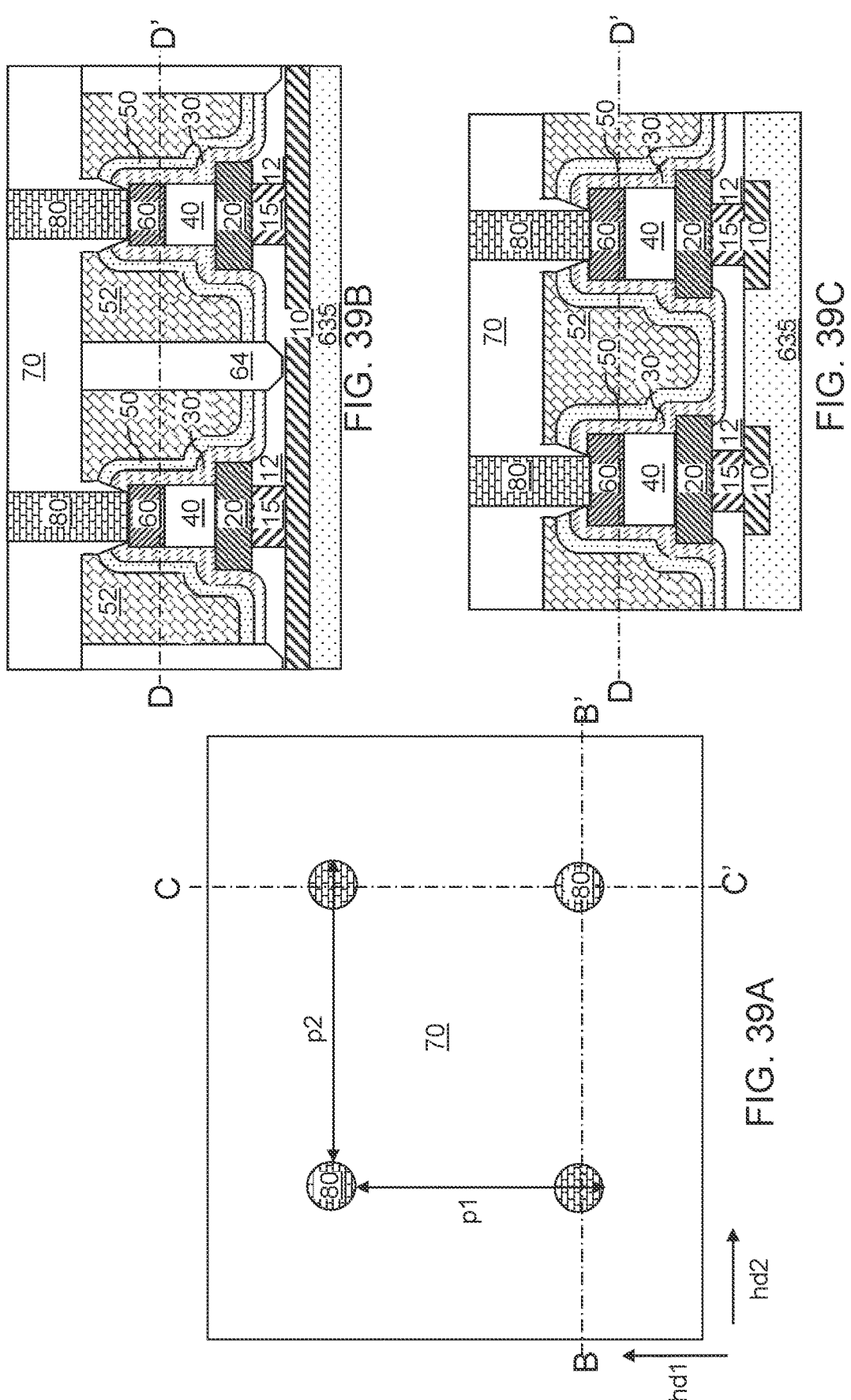
FIGS. 39A-39D are various views of a portion of a memory array region of a third exemplary structure after formation of a contact-level dielectric layer and top contact via structures according to a third embodiment of the present disclosure.
Figure 39D:
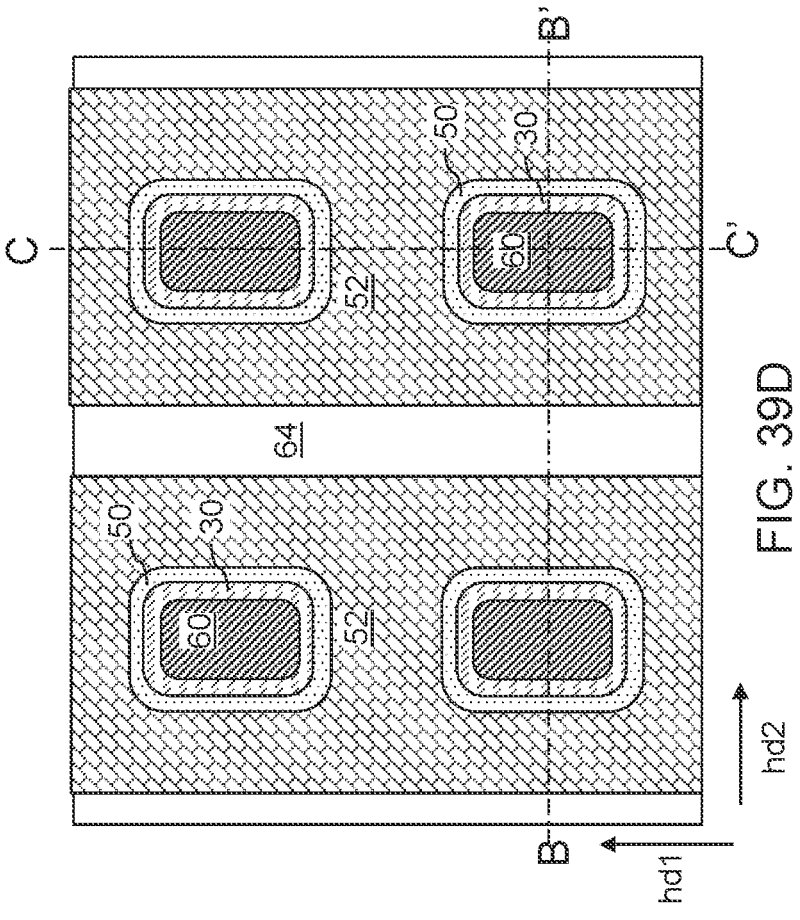
Figures 40A, 40B, 40C:
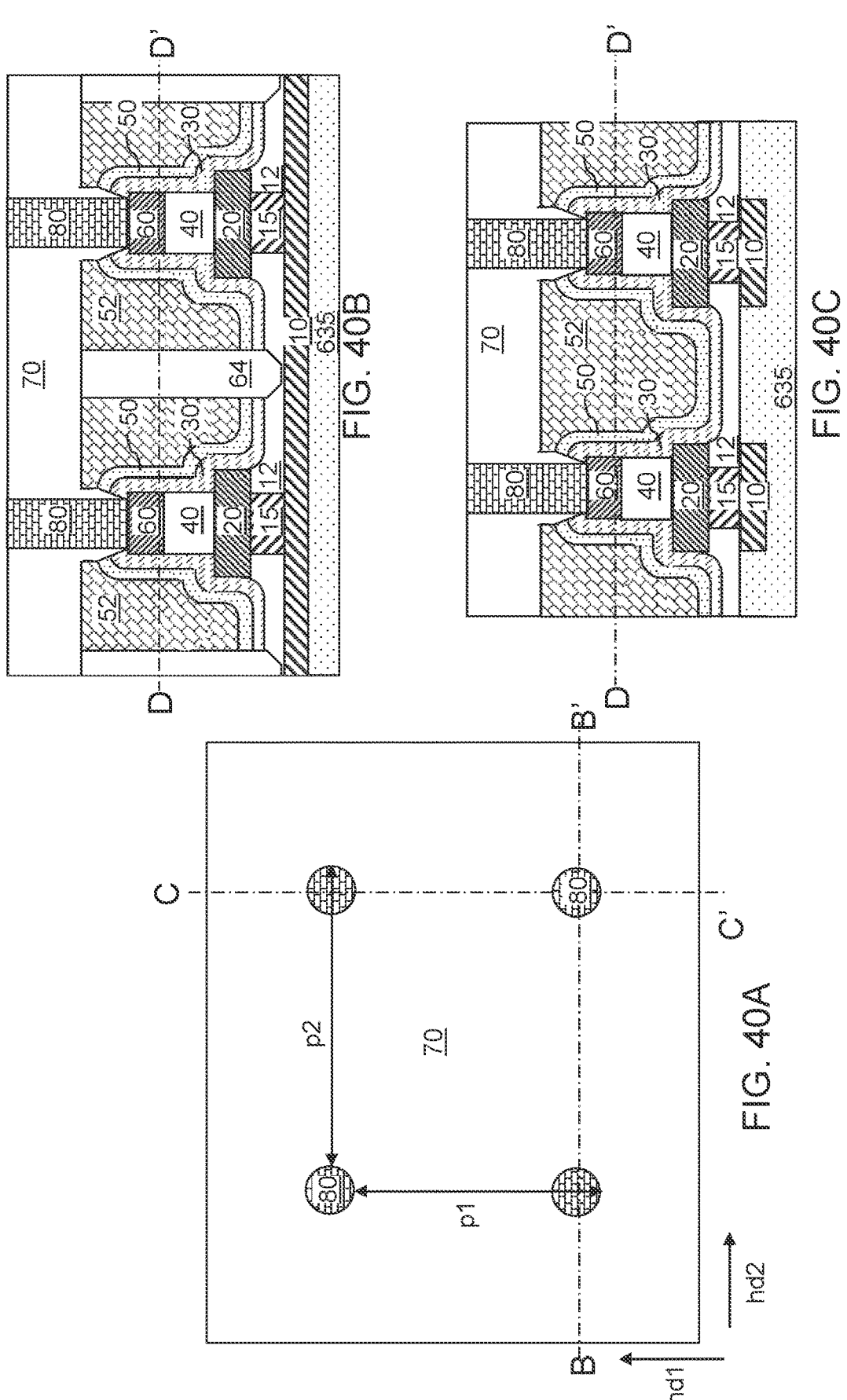
FIGS. 40A-40D are various views of a portion of a memory array region of an alternative embodiment of the third exemplary structure after formation of a contact-level dielectric layer and top contact via structures according to a third embodiment of the present disclosure.
Figure 40D:
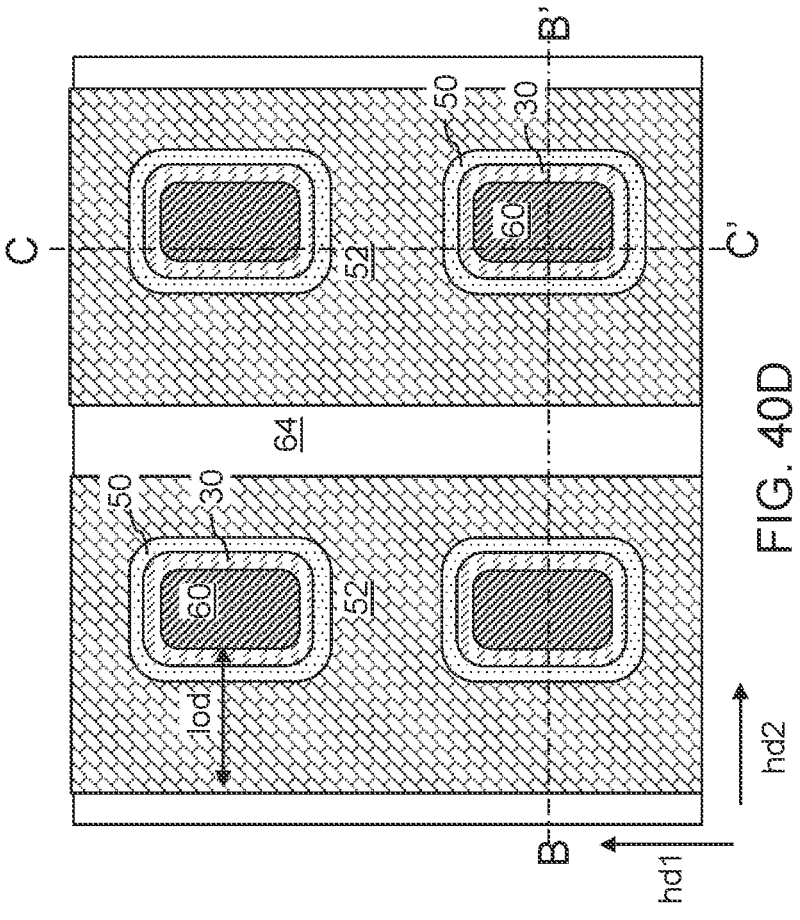

Referring to FIGS. 37A-37C, a second alternative configuration of the second exemplary structure may be derived from the second exemplary structure by removing horizontally-extending portions of the sacrificial spacer material layer 57L, the gate dielectrics 50, and the active layers 30 from above the topmost surfaces of the top electrodes 60 during a planarization process that forms the dielectric wall structures 64. In the second alternative configuration of the second exemplary structure, top surfaces of the top electrodes 60 may contact a bottom surface of the contact-level dielectric layer 70. Top surfaces of the dielectric wall structures 64 may be located within a horizontal plane including the top surfaces of the top electrodes 60.

Referring to FIGS. 38A-38E, a third alternative configuration of the second exemplary structure may be derived from the second exemplary structure or any of the above alternative configurations thereof by selecting the first horizontal direction hd1 and the second horizontal direction hd2 to be orthogonal to each other.

Referring to FIGS. 39A-39D, a third exemplary structure may be derived from the first exemplary structure or any of the alternative configurations thereof by elongating the vertical stacks (20, 40, 60) along the first horizontal direction hd1 or by reducing the first pitch p1 such that the entirety of sidewalls of the sacrificial spacers 57 that laterally extend along the first horizontal direction is straight. In this embodiment, the entirety of sidewalls of the dielectric wall structures 64 laterally extending along the first horizontal direction hd1 may be straight, and the entirety of sidewalls of the gate electrodes 52 that laterally extends along the first horizontal direction hd1 may be straight.

Referring to FIGS. 40A-40D, an alternative embodiment of the third exemplary structure may be derived from the first exemplary structure or any of the alternative configurations thereof by laterally offsetting stacks of a top electrode 60 and a dielectric pillar 40 from the vertical axis passing through the geometrical center of the underlying bottom electrode 20. The bottom electrodes 20 may be arranged as a two-dimensional periodic array of bottom electrodes 20 having a first periodicity, i.e., a first pitch p1, along the first horizontal direction hd1 and having a second periodicity, i.e., a second pitch p2, along the second horizontal direction hd2. The top electrodes 60 may be arranged as a two-dimensional periodic array of top electrodes 60 having the first periodicity along the first horizontal direction hd1 and having the second periodicity along the second horizontal direction hd2. The top electrodes 60 may be off-centered relative to the bottom electrodes 20 along the first horizontal direction hd1 and/or along the second horizontal direction hd2.

In this embodiment, the lateral distance between sidewalls of the bottom electrodes 20 and the dielectric wall structures 64 may be non-uniform. However, the lateral distance between sidewalls of the top electrodes 60 and a most proximal sidewall of the dielectric wall structures 64 may be uniform. In one embodiment, the minimum lateral distance between outer sidewalls of the gate dielectrics 50 and the dielectric wall structure 64 may be greater than 1 nm, and/or greater than 10 nm to facilitate deposition of the at least one conductive material of the gate electrodes 52.

Figures 41A, 41B, 41C:
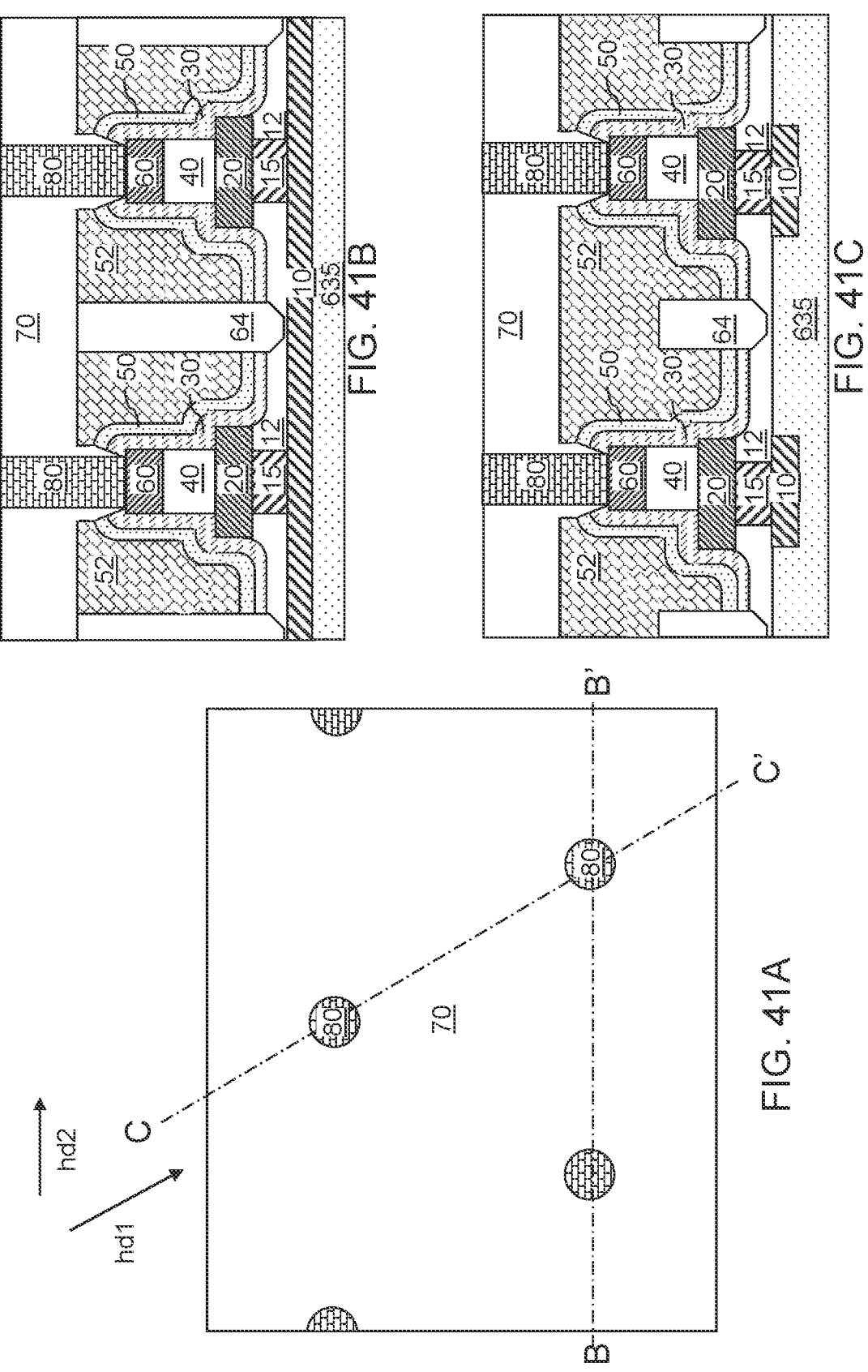
FIGS. 41A-41C are various views of a portion of a memory array region of a fourth exemplary structure after formation of a contact-level dielectric layer and top contact via structures according to a fourth embodiment of the present disclosure.

Referring to FIGS. 41A-41C, a fourth exemplary structure may be derived from the second exemplary structure or any of the alternative configurations thereof by laterally offsetting stacks of a top electrode 60 and a dielectric pillar 40 from the vertical axis passing through the geometrical center of the underlying bottom electrode 20. The bottom electrodes 20 may be arranged as a two-dimensional periodic array of bottom electrodes 20 having a first periodicity, i.e., a first pitch q1, along the first horizontal direction hd1 and having a second periodicity, i.e., a second pitch q2, along the second horizontal direction hd2. The top electrodes 60 may be arranged as a two-dimensional periodic array of top electrodes 60 having the first periodicity along the first horizontal direction hd1 and having the second periodicity along the second horizontal direction hd2. The top electrodes 60 may be off-centered relative to the bottom electrodes 20 along the first horizontal direction hd1 and/or along the second horizontal direction hd2.

In this embodiment, the lateral distance between sidewalls of the bottom electrodes 20 and the dielectric wall structures 64 may be non-uniform. However, the lateral distance between sidewalls of the top electrodes 60 and a most proximal sidewall of the dielectric wall structures 64 may be uniform. In one embodiment, the minimum lateral distance between outer sidewalls of the gate dielectrics 50 and the dielectric wall structure 64 may be greater than 1 nm, and/or greater than 10 nm to facilitate deposition of the at least one conductive material of the gate electrodes 52.

FIG. 42 is a flowchart that illustrates the general processing steps for manufacturing the semiconductor device of the present disclosure.

Referring to step 4210 and FIGS. 1-6C and 22A-22C, a plurality of vertical stacks (20, 40, 60) may be formed over a substrate 8. Each of the vertical stacks (20, 40, 60) includes, from bottom to top, a bottom electrode 20, a dielectric pillar 40, and a top electrode 60.

Referring to step 4220 and FIGS. 7A-7C and 27A-27C, a continuous active layer 30L may be formed over the plurality of vertical stacks (20, 40, 60).

Referring to step 4230 and FIGS. 7A-7C and 27A-27C, a gate dielectric layer 50L may be formed over the continuous active layer 30L.

Referring to step 4240 and FIGS. 8A-9C and 28A-29C, sacrificial spacers 57 may be formed around the plurality of vertical stacks (20, 40, 60) by depositing a sacrificial spacer material layer 57L and anisotropically etching the sacrificial spacer material layer 57L, wherein remaining portions of the sacrificial spacer material layer 57L comprise the sacrificial spacers 57.

Referring to step 4250 and FIGS. 10A-10C and 30A-30C, at least one dielectric wall structure 64 may be formed around the sacrificial spacers 57 by filling gaps between neighboring pairs of the sacrificial spacers 57 with a dielectric fill material.

Referring to step 4260 and FIGS. 11A-21 and 31A-41C, the sacrificial spacers 57 are replaced with gate electrodes 52.

Referring to all drawings and according to various embodiments of the present disclosure, a semiconductor structure is provided, which comprises: a two-dimensional array of vertical stacks (20, 40, 60) located over a substrate 8. Each of the two-dimensional array of vertical stacks (20, 40, 60) includes, from bottom to top, a bottom electrode 20, a dielectric pillar 40, and a top electrode 60. The first exemplary structure includes active layers 30 comprising a semiconducting metal oxide material, extending over sidewalls of a respective row of vertical stacks (20, 40, 60) that are arranged along a first horizontal direction hd1, and laterally spaced apart along a second horizontal direction hd2. Gate stacks (50, 52) overlie a respective one of the active layers 30. Each of the gate stacks (50, 52) comprises a gate dielectric 50 and a gate electrode 52. Dielectric wall structures 64 may be interlaced with the gate stacks (50, 52) along the second horizontal direction hd2. Each sidewall of the dielectric wall structures 64 comprises a continuously extending vertical segment that laterally extends along the first horizontal direction hd1 and equidistant from a most proximal sidewall among sidewalls of a respective row of top electrodes 60 that are arranged along the first horizontal direction hd1.

Referring to all drawings and according to various embodiments of the present disclosure, a semiconductor structure is provided, which comprises: a two-dimensional array of vertical stacks (20, 40, 60) located over a substrate 8, wherein each of the two-dimensional array of vertical stacks (20, 40, 60) includes, from bottom to top, a bottom electrode 20, a dielectric pillar 40, and a top electrode 60; active layers 30 comprising a semiconducting metal oxide material and extending over sidewalls of a respective one of vertical stacks (20, 40, 60); gate stacks (50, 52) overlying a respective row of the active layers 30, wherein each of the gate stacks (50, 52) comprises a row of gate dielectrics 50 arranged along the first horizontal direction hd1 and a gate electrode 52; and a dielectric wall structure 64 laterally surrounding each of the gate stacks (50, 52) and providing electrical isolation between each adjacent pair of gate electrodes 52 among the gate electrodes 52, wherein each sidewall of the dielectric wall structure 64 comprises vertically straight and laterally concave surface segments that are equidistant from a most proximal sidewall among sidewalls of a respective row of top electrodes 60 that are arranged along the first horizontal direction hd1.

The various embodiments of the present disclosure use self-aligned sacrificial spacers 57, which are subsequently replaced with gate electrodes 52. As such, the gate electrodes 52 are self-aligned to the vertical stacks of a bottom electrode 20, a dielectric pillar 40, and a top electrode 60. The self-alignment of the gate electrodes to the vertical stacks (20, 40, 60) reduces removes a lithographic alignment step from a manufacturing sequence, and thus, reduces manufacturing cost and processing time.

The vertical field effect transistors of the present disclosure may be used in applications that require a high density of access transistors such as dynamic random access memory devices using a high density array of capacitors.

The manufacturing processes of the present disclosure are relatively simple and may be implemented with a low production cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:

a two-dimensional array of vertical stacks located over a substrate, wherein each of the two-dimensional array of vertical stacks includes, from bottom to top, a bottom electrode, a dielectric pillar, and a top electrode of which all sidewalls are vertically coincident with all sidewalls of the dielectric pillar;

active layers comprising a semiconducting metal oxide material, extending over sidewalls of a respective row of vertical stacks that are arranged along a first horizontal direction, and laterally spaced apart along a second horizontal direction;

gate stacks overlying a respective one of the active layers, wherein each of the gate stacks comprises a gate dielectric and a gate electrode; and dielectric wall structures interlaced with the gate stacks along the second horizontal direction, wherein each sidewall of the dielectric wall structures comprises a continuously extending vertical segment that laterally extends along the first horizontal direction and equidistant from a most proximal sidewall among sidewalls of a respective row of top electrodes that are arranged along the first horizontal direction, wherein:

each of the active layers comprises a top edge that is located above a horizontal plane including top surfaces of the top electrodes of the two-dimensional array of vertical stacks; and each of the active layers comprises a bottommost surface that is located below an additional horizontal plane including bottom surfaces of the bottom electrodes of the two-dimensional array of vertical stacks.

2. The semiconductor structure of claim 1, wherein the dielectric wall structures vertically extend from a first horizontal plane including top surfaces of the gate electrodes at least to a second horizontal plane including bottom surfaces of the bottom electrodes.

3. The semiconductor structure of claim 1, wherein each continuously extending vertical segment of the sidewalls of the dielectric wall structures comprises laterally straight segments that are parallel to the first horizontal direction, and pairs of laterally concave segments that are adjoined to each other and located between a respective neighboring pair of laterally straight segments.

4. The semiconductor structure of claim 3, wherein:

the pairs of laterally concave segments are laterally offset from sidewalls of a respective most proximal pair of the top electrodes by a uniform lateral offset distance; and the laterally straight segments are laterally offset from a sidewall of a respective most proximal one of the top electrodes by the uniform lateral offset distance.

5. The semiconductor structure of claim 1, wherein:

the top electrodes are arranged as a two-dimensional periodic array having a first pitch along the first horizontal direction and having a second pitch along the second horizontal direction; and the second pitch is greater than the first pitch.

6. The semiconductor structure of claim 5, wherein:

each of the dielectric wall structures comprises uniform width regions having a uniform width between a respective pair of straight sidewall segments that laterally extend along the first horizontal direction and laterally protruding regions that laterally protrude outward from vertical planes including the straight sidewall segments of the uniform width regions; and a difference between the second pitch and the first pitch is greater than the uniform width of the uniform width regions.

7. The semiconductor structure of claim 1, wherein, within each of the two-dimensional array of vertical stacks, a top periphery of the dielectric pillar coincides with a bottom periphery of the top electrode, and a top periphery of the bottom electrode is laterally offset outward from a bottom periphery of the dielectric pillar.

8. The semiconductor structure of claim 1, wherein:

each of the active layers contacts top surfaces of a row of bottom electrodes that are arranged along the first horizontal direction; and each of the active layers contacts peripheral portions of top surfaces of a row of top electrodes that are arranged along the first horizontal direction.

9. The semiconductor structure of claim 1, wherein, within each of the two-dimensional array of vertical stacks, sidewalls of the bottom electrode are laterally offset outward relative to the sidewalls of the dielectric pillar and are in direct contact with a respective one of the active layers, and the bottom electrode comprises an annular top surface that is in direct contact with the respective one of the active layer.

10. A semiconductor structure comprising:

a two-dimensional array of vertical stacks located over a substrate, wherein each of the two-dimensional array of vertical stacks includes, from bottom to top, a bottom electrode, a dielectric pillar, and a top electrode of which all sidewalls are vertically coincident with all sidewalls of the dielectric pillar;

active layers comprising a semiconducting metal oxide material and extending over sidewalls of a respective one of vertical stacks;

gate stacks overlying a respective row of the active layers, wherein each of the gate stacks comprises a row of gate dielectrics arranged along a first horizontal direction and a gate electrode; and a dielectric wall structure laterally surrounding each of the gate stacks and providing electrical isolation between each adjacent pair of gate electrodes among the gate electrodes, wherein each sidewall of the dielectric wall structure comprises vertically straight and laterally concave surface segments that are equidistant from a most proximal sidewall among sidewalls of a respective row of top electrodes that are arranged along the first horizontal direction, wherein:

each of the active layers comprises a top edge that is located above a horizontal plane including top surfaces of the top electrodes of the two-dimensional array of vertical stacks; and each of the active layers comprises a bottommost surface that is located below an additional horizontal plane including bottom surfaces of the bottom electrodes of the two-dimensional array of vertical stacks.

11. The semiconductor structure of claim 10, wherein the dielectric wall structure comprises recess regions through which connection portions of the gate electrodes laterally extend along the first horizontal direction.

12. The semiconductor structure of claim 11, wherein:

top surfaces of the connection portions of the gate electrodes are located within a same horizontal plane as top surfaces of the dielectric wall structure; and the dielectric wall structure vertically extends from a first horizontal plane including top surfaces of the gate electrodes at least to a second horizontal plane including bottom surfaces of the bottom electrodes in each area of the dielectric wall structure located outside areas of the connection portions of the gate electrodes.

13. The semiconductor structure of claim 11, wherein:

the vertically straight and laterally concave surface segments of the dielectric wall structure are laterally offset from sidewalls of a respective most proximal one of the top electrodes by the uniform lateral offset distance; and interfaces between the dielectric wall structure and the connection portions of the gate electrodes are laterally offset from a respective most proximal one of the top electrodes by a lateral distance that is greater than the uniform lateral offset distance.

14. The semiconductor structure of claim 10, wherein:

the top electrodes are arranged in a two-dimensional periodic array having a first periodicity along the first horizontal direction and having a second periodicity along the second horizontal direction; and an angle between the first horizontal direction and the second horizontal direction is in a range from 30 degrees to 75 degrees.

15. The semiconductor structure of claim 10, wherein each of the active layers comprises a horizontally-extending portion and a tubular portions laterally surrounding, and contacting, a respective vertical stack among the vertical stacks.

16. A semiconductor structure comprising:

a two-dimensional array of vertical stacks located over a substrate, wherein each of the two-dimensional array of vertical stacks includes, from bottom to top, a bottom electrode, a dielectric pillar, and a top electrode of which all sidewalls are vertically coincident with all sidewalls of the dielectric pillar;

active layers comprising a semiconducting metal oxide material, extending over sidewalls of a respective row of vertical stacks that are arranged along a first horizontal direction, and laterally spaced apart along a second horizontal direction;

gate stacks overlying a respective one of the active layers, wherein each of the gate stacks comprises a gate dielectric and a gate electrode; and dielectric wall structures interlaced with the gate stacks along the second horizontal direction, wherein the dielectric wall structures vertically extend from a first horizontal plane including top surfaces of the gate electrodes at least to a second horizontal plane including bottom surfaces of the bottom electrodes, wherein:

each of the active layers comprises a top edge that is located above a horizontal plane including top surfaces of the top electrodes of the two-dimensional array of vertical stacks; and each of the active layers comprises a bottommost surface that is located below an additional horizontal plane including bottom surfaces of the bottom electrodes of the two-dimensional array of vertical stacks.

17. The semiconductor structure of claim 16, wherein each sidewall of the dielectric wall structures comprises a continuously extending vertical segment that laterally extends along the first horizontal direction.

18. The semiconductor structure of claim 16, wherein each continuously extending vertical segment of the sidewalls of the dielectric wall structures comprises laterally straight segments that are parallel to the first horizontal direction, and pairs of laterally concave segments that are adjoined to each other and located between a respective neighboring pair of laterally straight segments.

19. The semiconductor structure of claim 18, wherein:

the pairs of laterally concave segments are laterally offset from sidewalls of a respective most proximal pair of the top electrodes by a uniform lateral offset distance; and the laterally straight segments are laterally offset from a sidewall of a respective most proximal one of the top electrodes by the uniform lateral offset distance.

20. The semiconductor structure of claim 16, wherein, within each of the two-dimensional array of vertical stacks, sidewalls of the bottom electrode are laterally offset outward relative to the sidewalls of the dielectric pillar and are in direct contact with a respective one of the active layers, and the bottom electrode comprises an annular top surface that is in direct contact with the respective one of the active layers.

* * * * *